United States Patent
Nikipelov et al.

(10) Patent No.: US 10,437,154 B2
(45) Date of Patent: Oct. 8, 2019

(54) LITHOGRAPHIC METHOD

(71) Applicant: ASML NETHERLANDS B.V., Veldhoven (NL)

(72) Inventors: Andrey Alexandrovich Nikipelov, Eindhoven (NL); Olav Waldemar Vladimir Frijns, Rosmalen (NL); Erik Roelof Loopstra, Eindhoven (NL); Wouter Joep Engelen, Veldhoven (NL); Johannes Antonius Gerardus Akkermans, Veldhoven (NL)

(73) Assignee: ASML Netherlands B.V., Veldhoven (NL)

(*) Notice: Subject to any disclaimer, the term of this patent is extended or adjusted under 35 U.S.C. 154(b) by 0 days.

(21) Appl. No.: 15/789,702

(22) Filed: Oct. 20, 2017

(65) Prior Publication Data
US 2018/0081278 A1 Mar. 22, 2018

Related U.S. Application Data

(63) Continuation of application No. 14/900,110, filed as application No. PCT/EP2014/062691 on Jun. 17, 2014, now Pat. No. 9,823,572.
(Continued)

(30) Foreign Application Priority Data

Jan. 24, 2014 (EP) .................................. 14152443
Apr. 9, 2014 (EP) .................................. 14164037
(Continued)

(51) Int. Cl.
*G03B 27/42* (2006.01)
*H01J 31/48* (2006.01)
(Continued)

(52) U.S. Cl.
CPC ........ *G03F 7/70033* (2013.01); *G01J 1/0407* (2013.01); *G01J 1/0418* (2013.01);
(Continued)

(58) Field of Classification Search
CPC ..... G01J 1/429; G01J 1/0238; G03F 7/70033; G03F 7/7055; G03F 7/20; G03F 7/70008; G03F 7/70041; G03F 7/70191
See application file for complete search history.

(56) References Cited

U.S. PATENT DOCUMENTS 4,283,687 A     8/1981  Madey et al.
4,413,186 A  *  11/1983 Uema ................... H01L 21/30
                                                    250/491.1
(Continued)

FOREIGN PATENT DOCUMENTS

CN      102365587      2/2012
EP      0 238 176      9/1987
(Continued)

OTHER PUBLICATIONS

International Search Report dated Jul. 6, 2015 for corresponding International Patent Application No. PCT/EP2014/062691 (55 pages).
(Continued)

*Primary Examiner* — Mesfin T Asfaw
(74) *Attorney, Agent, or Firm* — Pillsbury Winthrop Shaw Pittman LLP

(57) ABSTRACT

A method of patterning lithographic substrates, the method comprising using a free electron laser to generate EUV radiation and delivering the EUV radiation to a lithographic apparatus which projects the EUV radiation onto lithographic substrates, wherein the method further comprises reducing fluctuations in the power of EUV radiation delivered to the lithographic substrates by using a feedback-based
(Continued)

control loop to monitor the free electron laser and adjust operation of the free electron laser accordingly.

27 Claims, 20 Drawing Sheets

Related U.S. Application Data

(60) Provisional application No. 61/941,332, filed on Feb. 18, 2014, provisional application No. 61/889,954, filed on Oct. 11, 2013, provisional application No. 61/836,619, filed on Jun. 18, 2013.

(30) Foreign Application Priority Data

| May 26, 2014 | (EP) | ..................................... | 14169803 |
| Jun. 10, 2014 | (EP) | ..................................... | 14171782 |

(51) Int. Cl.

| G03F 7/20 | (2006.01) |
| H01S 3/09 | (2006.01) |
| G01J 1/04 | (2006.01) |
| G02B 1/06 | (2006.01) |
| G02B 5/20 | (2006.01) |
| G21K 1/10 | (2006.01) |
| G02B 26/02 | (2006.01) |
| G01J 1/26 | (2006.01) |
| G01J 1/42 | (2006.01) |
| H05H 7/04 | (2006.01) |
| H01S 3/00 | (2006.01) |

(52) U.S. Cl.
CPC ................. *G01J 1/26* (2013.01); *G01J 1/429* (2013.01); *G02B 1/06* (2013.01); *G02B 5/205* (2013.01); *G02B 26/023* (2013.01); *G03F 7/70008* (2013.01); *G03F 7/7055* (2013.01); *G03F 7/7085* (2013.01); *G03F 7/70558* (2013.01); *G21K 1/10* (2013.01); *H01S 3/0903* (2013.01); *H05H 7/04* (2013.01); *H01S 3/005* (2013.01); *H01S 3/0085* (2013.01)

(56) References Cited

U.S. PATENT DOCUMENTS

| 4,761,584 | A | 8/1988 | Halbach |
| 4,763,079 | A | 8/1988 | Neil |
| 4,778,263 | A | 10/1988 | Foltyn |
| 4,804,978 | A | 2/1989 | Tracy |
| 4,819,238 | A | 4/1989 | Harvey |
| 4,825,441 | A | 4/1989 | Marshall et al. |
| 4,888,776 | A | 12/1989 | Dolezal et al. |
| 5,029,172 | A | 7/1991 | Edighoffer |
| 5,144,193 | A | 9/1992 | Warren |
| 5,247,562 | A | 9/1993 | Steinbach |
| 5,351,248 | A | 9/1994 | Iracane |
| 5,410,558 | A | 4/1995 | Hackett |
| 5,565,747 | A | 10/1996 | Sasaki et al. |
| 6,028,660 | A | 2/2000 | Van Der Laan et al. |
| 6,479,811 | B1 | 11/2002 | Kruschwitz et al. |
| 6,498,351 | B1 | 12/2002 | Kruizinga et al. |
| 6,538,716 | B2 | 3/2003 | Mulkens et al. |
| 6,781,672 | B2 | 8/2004 | Motegi |
| 7,012,265 | B2 | 3/2006 | Van Der Veen |
| 7,057,705 | B2 | 6/2006 | Heintze |
| 7,061,586 | B2 | 6/2006 | Systma et al. |
| 7,196,601 | B1 | 3/2007 | Gottschalk |
| 7,956,557 | B1 | 6/2011 | Waterman |
| 8,217,596 | B1 | 7/2012 | Douglas et al. |
| 2002/0018189 | A1 | 2/2002 | Mulkens et al. |
| 2002/0191650 | A1 | 12/2002 | Madey et al. |
| 2003/0002024 | A1 | 1/2003 | Motegi |
| 2003/0026300 | A1 | 2/2003 | Biedron et al. |
| 2004/0174425 | A1 | 9/2004 | Akamatsu |
| 2005/0206869 | A1 | 9/2005 | Voorma et al. |
| 2005/0219498 | A1 | 10/2005 | Mori |
| 2006/0033417 | A1* | 2/2006 | Srinivasan-Rao ...... H01J 3/021 |
| | | | 313/399 |
| 2006/0039417 | A1 | 2/2006 | Biedron et al. |
| 2006/0158288 | A1 | 7/2006 | Rossmanith et al. |
| 2007/0014392 | A1 | 1/2007 | Madey et al. |
| 2007/0085009 | A1 | 4/2007 | Adamski |
| 2007/0152171 | A1 | 7/2007 | Goldstein et al. |
| 2008/0079930 | A1 | 4/2008 | Klarenbeek |
| 2008/0143989 | A1 | 6/2008 | Brudermann et al. |
| 2008/0151221 | A1 | 6/2008 | Sogard |
| 2008/0240182 | A1 | 10/2008 | Smith |
| 2009/0213356 | A1 | 8/2009 | Gruner et al. |
| 2009/0218521 | A1 | 9/2009 | Sogard et al. |
| 2010/0045410 | A1 | 2/2010 | Beckenbach et al. |
| 2010/0149505 | A1 | 6/2010 | Sewell et al. |
| 2010/0290587 | A1* | 11/2010 | Umstadter ........... G01V 5/0016 |
| | | | 378/57 |
| 2011/0014799 | A1 | 1/2011 | Dinger et al. |
| 2013/0077073 | A1 | 3/2013 | Van Schoot et al. |

FOREIGN PATENT DOCUMENTS

| EP | 0 329 140 | 8/1989 |
| EP | 1 580 603 | 9/2005 |
| EP | 1361479 | 3/2006 |
| EP | 1835349 | 9/2007 |
| EP | 1 914 583 | 4/2008 |
| JP | 56-91215 | 7/1981 |
| JP | H02-5063 | 1/1990 |
| JP | 5-47500 | 2/1993 |
| JP | 8-82700 | 3/1996 |
| JP | 8-213717 | 8/1996 |
| JP | 10-92717 | 4/1998 |
| JP | 10-302999 | 11/1998 |
| JP | H11-150055 | 6/1999 |
| JP | 2000-260684 | 9/2000 |
| JP | 2002-015993 | 1/2002 |
| JP | 2002-203786 | 7/2002 |
| JP | 2003-31400 | 1/2003 |
| JP | 2003-234275 | 8/2003 |
| JP | 2003-332233 | 11/2003 |
| JP | 2005-252256 | 9/2005 |
| JP | 2006-73620 | 3/2006 |
| JP | 2008-288099 | 11/2008 |
| JP | 2009-31634 | 2/2009 |
| JP | 2011-029435 | 2/2011 |
| JP | 2011-517072 | 5/2011 |
| JP | 2013-021133 | 1/2013 |
| KR | 1997-0009413 | 6/1997 |
| KR | 10-2009-0042454 | 4/2009 |
| WO | 2009121438 | 10/2009 |
| WO | 2010049076 | 5/2010 |
| WO | 2012101090 | 8/2012 |
| WO | 2013/023053 | 2/2013 |

OTHER PUBLICATIONS

Yu, L.-H. et. al., "The DUV-FEL Development Program", Proceedings of the 2001 Particle Accelerator Conference, Chicago, Illinois, U.S.A., vol. 4, Jun. 18-22, 2001, pp. 2830-2832.

Ilan, Ben-Zvi, "The BNL Accelerator Test Facility and Experimental Program", Proceedings of the Particle Accelerator Conference, San Francisco, vol. 1, May 6-9, 1991, p. 550-554.

Freund, H, P, et. al., "Free-Electron Lasers: Vacuum Electronic Generators of Coherent Radiation", Proceedings of the IEEE, vol. 87, No. 5, May 1999, 77 pages.

Pellegrini, C. et. al., "Output Power Control in an X-Ray Fel", Proceedings of the 1999 Particle Accelerator Conference, New York, 1999, 3 pages.

Saldin, E.L. et. al., "The Potential for the Development of the X-Ray Free Electron Laser", TESLA-FEL Feb. 2004, retrieved online

(56) References Cited

OTHER PUBLICATIONS

URL: <http://tesla.desy.de/new_pages/FEL_Reports/2004/fel2004-02.pdf>, Mar. 11, 2004, 41 pages.
Stanford Linear Accelerator Center, "Linac Coherent Light Source (LCLS) Design Study Report", Available from National Technical Information Services, US Department of Commerce, Springfield, Virginia, Dec. 1998, 397 pages.
Tsuchiya, Kimichika et. al.,"Operation of a fast polarization switching source at the Photon Factory", Journal of Physics: Conference Series 425, 11th International Conference on Synchrotron Radiation Instrumentation (SRI 2012), 2013, 5 pages.
Arbel M. et. al., "Superradiant and stimulated superradiant emission in a prebunched Free-Electron Maser", Physical Review Letters, vol. 86, No. 12, Mar. 19, 2001, 4 pages.
Lidia, Steve et. al., "An Elliptically-Polarizing Undulator with Phase Adjustable Energy and Polarization", Proceedings of the $8^{th}$ National Conference on Radiation Instrumentation, Gaithersburg, Maryland, Aug. 1993, 8 pages.
Shumway, Michael D. et. al., "EUV resist imaging below 50nm using coherent spatial filtering techniques", Proc. of SPIE, Emerging Lithographic Technologies VIII, vol. 5374, May 20, 2004, pp. 454-459.
Zholents, Alexander A., "Method of an enhanced self amplified spontaneous emission for x-ray free electron laser", Physical Review Special Topics—Accelerators and Beams, vol. 8, Issue 4, Apr. 12, 2005, pp. 040701-1-040701-6.
Allaria E. et. al., "Status of the FERMI@Elettra Free Electron Laser", 23 pages.
Nuhn, Heinz-Dieter et al., "LCLS conceptual design Report 2002", Stanford Linear Accelerator Center, Apr. 2002, 543 pages.
Tiedtke, K. et. al., "The soft x-ray free-electron laser FLASH at DESY: Beamlines, Diagnostics and End-stations", New Journal of Physics 11, Feb. 17, 2009, 17 pages.
Poletto, Luca et al., "Beam splitting and recombining of the radiation from an EUV Free Electron Laser by means of reflection gratings", Proceedings of SPIE, vol. 5194, pp. 95-104.
Van Der Geer, B. et. al., "Wavelength and power stability measurements of the Stanford SCA/FEL", Nuclear Instruments and Methods in Physics Research Section A Accelerators Spectrometers Detectors and Associated Equipment, vol. 358, Issue 1, Apr. 1995, pp. 252-255.
Shaftan, T. et. al., "Experimental Demonstration of Wavelength Tuning in High-Gain Harmonic Generation Free Electron Laser", BNL-73174-2004-CP, Aug. 2004, 5 pages.
Deng, Haixiao et. al., "Status of Polarization Control Experiment at Shanghai Deep Ultraviolet Free Electron Laser", Proceedings of 34th International Free Electron Laser Conference (FEL2012), Nara, Japan, Aug. 2012, 4 pages.
Ding,Yuantao et. al.,"SASE FEL Polarization Control using Crossed Undulator", Proceedings of 30th International Free Electron Laser Conference (FEL2008), Gyeongju, Korea, Sep. 2008, pp. 173-176.
Newnam , Brian E. et. al.,"Extreme Ultraviolet Free-Electron Laser-Based Projection Lithography Systems", Optical Engineering, Soc. of Photo-Optical Instrumentation Engineers, Aug. 1991, vol. 30, No. 8, pp. 1100-1108.
Fulton, R. D. et. al., "Enhanced Energy Loss of Short Pulses of Electrons in Plasma", Journal of Applied Physics, American Institute of Physics, vol. 82, No. 6, Sep. 15, 1997, pp. 2822-2825.
Fraser, J. S. et. al., "High-Brightness Injectors for RF-Driven Free-Electron Lasers", IEEE Journal of Quantum Electronics, Sep. 1987, vol. 23, No. 9, pp. 1489-1496.
Pogorelsky, I. V. et. al., "Subnanosecond Multi-Gigawatt Co2 Laser", IEEE Journal of Quantum Electronics, vol. 31, No. 3, Mar. 1995, pp. 556-565.
Rosocha, Louis, A. et. al., "Aurora Multikilojoule Krf Laser System Prototype for Inertial Confinement Fusion", Fusion Science and Technology, American Nuclear Society, vol. 11, No. 3, May 1987, pp. 497-531.
Gottwald, Alexander et. al., "Pulse Energy Measurements of Extreme Ultraviolet Undulator Radiation", Measurement Science and Technology, Jan. 2004, vol. 15, pp. 437-443.
Kashiwagi, S. et. al., "Development of compact coherent EUV source based on laser Compton scattering", Radiation Physics and Chemistry, vol. 78, Dec. 2009, pp. 1112-1115.
Ashkenazy, J. et. al., "Analysis and Measurements of Permanent Magnet 'Bifilar' Helical Wigglers", IEEE Journal of Quantum Electronics, vol. 24, No. 5, May 1988, pp. 812-819.
Anonymous, "Swissfel Conceptual Design Report", PSI, Retrieved from the Internet: URL:http://www.psi.ch/swissfel/HomeEN/SwissFEL_CDR_v19_03.03.11-small.pdf [retrieved on Apr. 23, 2015],Mar. 3, 2011, pp. 201-206.
Harvey, James E. et. al., "Hole Grating Beam Sampler—A Versatile High Energy Laser (HEL) Diagnostic Tool", Periodics Structures, Gratings, Moire Patterns, and Diffraction Phenomena., San Diego, Jul. 29-Aug. 1, 1980; Proceedings of the Society of Photo-Optical Instrumentation Engineers, vol. 240, pp. 232-242.
Chinese Office Action dated Dec. 12, 2016 in corresponding Chinese Patent Application No. 201480034718.0.
Japanese Office Action dated Apr. 2, 2018 in corresponding Japanese Patent Application No. 2016-520441.
Israeli Office Action issued in corresponding Israeli Patent Application No. 242609, dated Apr. 10, 2019.
Japanese Office Action issued in corresponding Japanese Patent Application No. 2018-135837, dated Aug. 2, 2019.

\* cited by examiner

LITHOGRAPHIC METHOD

CROSS-REFERENCE TO RELATED APPLICATIONS

This application is a continuation of U.S. patent application Ser. No. 14/900,110, filed Dec. 18, 2015, which is the U.S. national phase entry of PCT patent application no. PCT/EP2014/062691, filed 17 Jun. 2014, which claims the benefit of priority to U.S. provisional application 61/836,619, which was filed on 18 Jun. 2013, and U.S. provisional application 61/889,954, which was filed on 11 Oct. 2013 and U.S. provisional application 61/941,332, which was filed on 18 Feb. 2014 and European patent application EP14152443, which was filed on 24 Jan. 2014 and European patent application EP14164037, which was filed on 9 Apr. 2014 and European patent application EP14169803, which was filed on 26 May 2014 and European patent application EP14171782, which was filed on 10 Jun. 2014, the contents of all of which are incorporated herein by reference in their entireties.

FIELD

The present invention relates to a lithographic method. The present invention also relates to other methods and related apparatus.

BACKGROUND

A lithographic apparatus is a machine constructed to apply a desired pattern onto a substrate. A lithographic apparatus can be used, for example, in the manufacture of integrated circuits (ICs). A lithographic apparatus may for example project a pattern from a patterning device (e.g. a mask) onto a layer of radiation-sensitive material (resist) provided on a substrate.

The wavelength of radiation used by a lithographic apparatus to project a pattern onto a substrate determines the minimum size of features which can be formed on that substrate. A lithographic apparatus which uses extreme ultraviolet (EUV) radiation, being electromagnetic radiation having a wavelength within the range 4-20 nm, may be used to form smaller features on a substrate than a conventional lithographic apparatus (which may for example use electromagnetic radiation with a wavelength of 193 nm). A free electron laser may be used to generate EUV radiation for use by a lithographic apparatus.

It may be desirable to control the power of radiation output by a free electron laser. It may be desirable to control the power of free electron laser generated radiation received by a lithographic apparatus.

It is an object of the present invention to obviate or mitigate at least one problem associated with the prior art.

SUMMARY

According to an aspect of the invention there is provided a method of patterning lithographic substrates, the method comprising using a free electron laser to generate EUV radiation and delivering the EUV radiation to a lithographic apparatus which projects the EUV radiation onto lithographic substrates, wherein the method further comprises reducing fluctuations in the power of EUV radiation delivered to the lithographic substrates by using a feedback-based control loop to monitor the free electron laser, and adjust operation of the free electron laser accordingly.

Using a feedback-based control loop in this manner to reduce EUV power fluctuations is advantageous because it improves the consistency of EUV radiation dose delivered to the lithographic substrates. This provides more consistent exposure of the lithographic substrates.

The feedback-based control loop may monitor the power of EUV radiation output by the free electron laser. Additionally or alternatively, the feedback-based control loop may monitor the current of electrons in the free electron laser. Additionally or alternatively, the feedback-based control loop may monitor the power of a laser used to generate electrons used by the free electron laser. These are examples of parameters which are correlated to the power of the EUV radiation output by the free electron laser. Other parameters may be used.

The feedback-based control loop may operate at a frequency of 10 kHz or more. A target location on a substrate may receive EUV radiation for around 1 ms (which corresponds with a frequency of 1 kHz). Reducing EUV power fluctuations using feedback having a frequency of 10 kHz or more is advantageous because it will smooth out the fluctuations sufficiently quickly that a target location will receive a desired dose of EUV radiation (e.g. to within a desired tolerance). That is, the total dose of EUV radiation received by a target location is a desired dose because EUV radiation power fluctuations during the 1 ms exposure time period are smoothed out. If, for example, the feedback loop operated at a frequency of 1 kHz or less, then an adjustment of EUV radiation power to compensate for a fluctuation when illuminating a substrate target location would not take place sufficiently quickly to compensate the dose of EUV radiation received by the target location.

The method may further comprise applying variable attenuation to EUV radiation that has been output by the free electron laser in order to further control the power of EUV radiation delivered to the lithographic apparatus.

The lithographic apparatus may be one of a plurality of lithographic apparatus which receives the EUV radiation.

Variable attenuation of the EUV radiation may be independently controllable for each of the lithographic apparatus.

The variable attenuation may be controlled by a second feedback-based control loop.

The second feedback-based control loop may operate at a frequency of 1 kHz or less.

The second feedback-based control loop may use EUV radiation intensity as measured by a sensor located in the lithographic apparatus, the sensor being located before a projection system of the lithographic apparatus.

Additionally or alternatively, the second feedback-based control loop may use EUV radiation intensity as measured by a sensor located in the lithographic apparatus, the sensor being located after a projection system of the lithographic apparatus.

According to an aspect of the invention there is provided a method of controlling the dose of EUV radiation delivered by a lithographic apparatus to a target location on a lithographic substrate following generation by a free electron laser, the method comprising using first and second feedback-based control loops to adjust the intensity of EUV radiation incident at the target location, the first feedback-based control loop having a faster response than the second feedback-based control loop.

The second feedback-based control loop may be associated with the lithographic apparatus.

The first feedback-based control loop may be associated with the free electron laser.

The intensity of EUV radiation delivered by the lithographic apparatus may be monitored using a sensor located at a substrate supporting table. The intensity may be measured between exposure of target locations by the lithographic apparatus.

According to an aspect of the invention there is provided a method of controlling generation of EUV using a free electron laser, the method comprising monitoring the power of EUV radiation output by the free electron laser and controlling the power of EUV radiation using a feedback-based control loop, wherein adjustments of the power of EUV radiation are performed whilst maintaining a substantially constant wavelength of EUV radiation.

The EUV radiation may be used by a plurality of lithographic apparatus to pattern lithographic substrates.

According to an aspect of the invention there is provided a lithographic system comprising a free electron laser configured to generate EUV radiation and a lithographic apparatus configured to project the EUV radiation onto lithographic substrates, wherein the apparatus further comprises a feedback-based control loop comprising a sensor configured to monitor the free electron laser and a controller configured to receive an output from the sensor and to adjust operation of the free electron laser accordingly.

The feedback-based control loop may advantageously reduce fluctuations in the power of EUV radiation delivered to the lithographic substrates.

The feedback-based control loop may be configured to monitor the power of EUV radiation output by the free electron laser. Additionally or alternatively, the feedback-based control loop may be configured to monitor the current of electrons in the free electron laser. Additionally or alternatively, the feedback-based control loop may be configured to monitor the power of a laser used to generate electrons used by the free electron laser. These are examples of parameters which are correlated to the power of the EUV radiation output by the free electron laser. Other parameters may be used.

The feedback-based control loop may be configured to operate at a frequency of 10 kHz or more.

The apparatus may further comprise an attenuator configured to apply variable attenuation to EUV radiation that has been output by the free electron laser in order to further control the power of EUV radiation delivered to the lithographic apparatus.

The lithographic apparatus may be one of a plurality of lithographic apparatus which receives the EUV radiation.

The attenuators may be independently controllable for each of the lithographic apparatus.

The variable attenuation may be controlled by a second feedback-based control loop.

The second feedback-based control loop may operate at a frequency of 1 kHz or less The second feedback-based control loop may comprise a sensor configured to measure EUV radiation intensity in the lithographic apparatus.

The sensor may be located before a projection system of the lithographic apparatus.

The sensor may be located after a projection system of the lithographic apparatus.

According to an aspect of the invention there is provided an apparatus for controlling the dose of EUV radiation delivered by a lithographic apparatus to a target location on a lithographic substrate following generation by a free electron laser, the apparatus comprising first and second feedback-based control loops operable to adjust the intensity of EUV radiation incident at the target location, the first feedback-based control loop having a faster response than the second feedback-based control loop.

The second feedback-based control loop may be associated with the lithographic apparatus.

The first feedback-based control loop may be associated with the free electron laser.

The lithographic apparatus may comprise a sensor located at a substrate supporting table, the sensor being configured to monitor the intensity of EUV radiation delivered by the lithographic apparatus. The intensity may be measured between exposure of target locations by the lithographic apparatus.

The EUV radiation may be used by a plurality of lithographic apparatus to pattern lithographic substrates.

According to an aspect of the invention there is a provided an injector for a free electron laser comprising a photocathode, a radiation source operable to emit a pulsed radiation beam and direct the pulsed radiation beam to be incident on the photocathode thereby causing the photocathode to emit a beam of electron bunches which is output from the injector, each electron bunch corresponding to a pulse of the radiation beam, and a control apparatus operable to interrupt the electron beam so as to cause at least one pulse of the radiation beam to have substantially no associated electron bunch in the electron beam which is output from the injector.

An advantage associated with controlling the injector in this manner is that it provides control of the power of a beam of radiation emitted from a free electron laser. Control of the free electron laser beam power may be achieved with a reduced effect on other properties of the free electron laser beam (compared with at least some prior art control methods).

The control apparatus may be operable to interrupt the electron beam so as to cause a single pulse of the radiation beam to have substantially no associated electron bunch in the electron beam which is output from the injector.

The control apparatus may be operable to substantially prevent at least one pulse of the radiation beam from being incident on the photocathode, thereby interrupting the emission of electron bunches from the photocathode The control apparatus may comprise a Pockels cell disposed in the path of the radiation beam before the radiation beam is incident on the photocathode and wherein the Pockels cell is switchable between a first mode of operation in which the Pockels cell is configured to transmit the radiation beam without changing its polarization state and a second mode of operation in which the Pockels cell is configured to transmit the radiation beam and rotate the polarization state of the Pockels cell, and a polarizer disposed between the Pockels cell and the photocathode and in the path of the radiation beam, wherein the polarizer is configured to only transmit radiation having a given polarization state.

The Pockels cell may comprise an electro-optic crystal, a pair of electrodes and a voltage source, the voltage source being operable to generate a potential difference between the electrodes thereby switching the Pockels cell from the first mode of operation to the second mode of operation.

The Pockels cell may comprise a plurality of pairs of electrodes and a plurality of voltage sources, each of the plurality of voltage sources being operable to generate a potential difference between one of the plurality of pairs of electrodes thereby switching the Pockels cell from the first mode of operation to the second mode of operation.

The Pockels cell may be configured to rotate the polarization state of the radiation beam by around 90° when in the second mode of operation.

The control apparatus may comprise a plurality of Pockels cells disposed in the path of the radiation beam before the radiation beam is incident on the photocathode and wherein each of the plurality of Pockels cell is switchable between a first mode of operation in which the Pockels cell is configured to transmit the radiation beam without changing its polarization state and a second mode of operation in which the Pockels cell is configured to transmit the radiation beam and rotate the polarization state of the Pockels cell by less than 90° and wherein the plurality of Pockels cells are configured to apply a combined rotation of the polarisation state of the radiation beam of around 90° when each of the plurality of Pockels cells are in the second mode of operation.

The polarizer may be configured to only transmit radiation having the polarization state of the radiation beam before the radiation beam is incident on the Pockels cell.

The injector may further comprise a second Pockels cell configured to rotate the polarization state of the radiation beam by around 90° when in the second mode of operation.

The polarizer may be configured to only transmit radiation having a polarization state which is orthogonal to the polarization state of the radiation beam before the radiation beam is incident on the Pockels cell.

The first Pockels cell may be configured to periodically alternate between the first mode of operation and the second mode of operation with a first time period and wherein the second Pockels cell is configured to periodically alternate between the first mode of operation and the second mode of operation with the first time period and at a phase difference with respect to the periodic alternation of the first Pockels cell.

The control apparatus may be configured to adjust the phase difference in order to adjust a number of electron bunches which are interrupted in a given time period.

The injector may further comprise a frequency doubling crystal disposed in the path of the radiation beam before the radiation beam is incident on the photocathode and after the radiation beam has passed through the polarizer.

The control apparatus may be operable to deflect at least one electron bunch out of the electron beam, thereby interrupting the electron beam which is output from the injector.

The control apparatus may comprise a pair of conducting plates disposed either side of a trajectory of the electron beam, and a voltage source operable to generate a potential difference between the conducting plates, thereby generating a magnetic field between the conducting plates, the magnetic field being sufficient to deflect an electron bunch out of the electron beam.

The injector may further comprise a beam dump arranged to receive an electron bunch which is deflected out of the electron beam.

According to an aspect of the invention there is provided an injector for a free electron laser comprising a photocathode, a radiation source operable to emit a pulsed radiation beam and direct the pulsed radiation beam to be incident on the photocathode thereby causing the photocathode to emit a beam of electron bunches which is output from the injector, and a control apparatus operable to defocus at least one bunch of the electron beam such that at least one defocussed electron bunch in the electron beam is output from the injector.

The control apparatus may comprise a pair of conducting plates disposed either side of a trajectory of the electron beam, a voltage source operable to generate a current to flow through the conducting plates thereby generating a magnetic field between the conducting plates, the magnetic field being sufficient to defocus an electron bunch in the electron beam.

According to an aspect of the invention there is provided a free electron laser comprising an injector according to the preceding aspects of the invention, a particle accelerator operable to accelerate the electron beam output from the injector, and an undulator operable to guide the accelerated electron beam along a periodic path so as to stimulate emission of a free electron laser radiation beam, wherein the free electron laser radiation beam comprises a series of pulses, each pulse corresponding to an electron bunch of the electron beam.

The control apparatus of the injector may be operable to interrupt the electron beam which is output from the injector, thereby interrupting the pulses of the free electron laser radiation beam.

The free electron laser may further comprise a controller operable to control the control apparatus of the injector so as to control a number of pulses of the free electron laser radiation beam which occur in a given time period.

The undulator may be operable to stimulate emission of an EUV free electron laser radiation beam.

The free electron laser may further comprise a detector configured to monitor the intensity of the radiation beam and output a signal to the controller, thereby providing a feedback loop.

According to an aspect of the invention there is provided a lithographic system comprising a radiation source comprising a free electron laser according to the third aspect of the invention and further comprising a lithographic apparatus.

The lithographic apparatus may be arranged to receive a radiation beam comprising at least a portion of the free electron laser radiation beam which is output from free electron laser of the radiation source, the lithographic apparatus may comprise an illumination system configured to condition the radiation beam received from the radiation source, a support structure constructed to support a patterning device, the patterning device being capable of imparting the radiation beam with a pattern in its cross-section to form a patterned radiation beam, a substrate table constructed to hold a substrate, and a projection system configured to project the patterned radiation beam onto a target location of the substrate.

The control apparatus of the injector may be operable to interrupt the electron beam which is output from the injector, thereby interrupting the pulses of the free electron laser radiation beam, thereby interrupting pulses of the radiation beam which is received by the lithographic apparatus, thereby interrupting pulses of the patterned radiation beam which are projected onto a target location of the substrate.

The lithographic system may further comprise a controller wherein the controller is operable to control the control apparatus of the injector so as to control a number of pulses of the patterned radiation beam which are received by the target location of the substrate in an exposure time period, thereby controlling a dose of radiation which is received by the target location of the substrate in the exposure time period.

According to an aspect of the invention there is provided a method of controlling the power of a radiation beam emitted by a free electron laser, the method comprising directing a pulsed radiation beam onto a photocathode of an injector and thereby causing the photocathode to emit a beam of electron bunches which is output from the injector, each electron bunch corresponding to a pulse of the radiation beam, interrupting the electron beam so as to cause at least one pulse of the radiation beam to have substantially no associated electron bunch in the electron beam which is output from the injector, accelerating the electron beam using a particle accelerator, and using an undulator operable to guide the accelerated electron beam along a periodic path so as to stimulate emission of a free electron laser radiation beam, the power of the free electron laser beam being reduced by the interruption of the electron beam.

At least one pulse of the radiation beam may be prevented from being incident on the photocathode, thereby interrupting the emission of electron bunches from the photocathode.

At least one electron bunch may be deflected out of the electron beam, thereby interrupting the electron beam which is output from the injector.

According to an aspect of the invention there is provided a method of controlling the power of a radiation beam emitted by a free electron laser, the method comprising directing a pulsed radiation beam onto a photocathode of an injector and thereby causing the photocathode to emit a beam of electron bunches which is output from the injector, each electron bunch corresponding to a pulse of the radiation beam, defocusing at least one pulse of the electron beam which is output from the injector, accelerating the electron beam using a particle accelerator, and using an undulator operable to guide the accelerated electron beam along a periodic path so as to stimulate emission of a free electron laser radiation beam, the power of the free electron laser beam being reduced by the at least one defocussed electron beam pulse.

Aspects of the invention may control the dose of EUV radiation delivered to the wafer stage of lithographic apparatus via controllable interruption of electron beam current provided by an injector to an accelerator of a free electron laser. The current interruption may be periodic. The current interruption may be controlled via feed-back and/or feed-forward systems. Current interruption may provide a current that is substantially zero for the duration of interruption. Alternatively, current interruption may be provide a current that is less than approximately 10% of nominal current.

According to an aspect, there is provided a radiation system comprising a free electron laser, the free electron laser comprising an electron source operable to produce relativistic electrons and an undulator comprising a plurality of magnets, operable to produce a periodic magnetic field and arranged so as to guide the relativistic electrons along a periodic path about a central axis such that they interact with radiation in the undulator, stimulating emission of coherent radiation, wherein the undulator is provided with an adjustment mechanism that is operable, in response to a received signal, to vary one or more parameters of the undulator such that the irradiance and/or the polarization of the radiation is altered. The one or more parameters may be parameters of the free electron laser.

In an embodiment, a lithographic system may be provided including such a radiation system. Such a lithographic system may include one or more lithographic apparatuses.

According to another aspect, there is provided a free electron laser comprising: an electron source operable to produce relativistic electrons; and an undulator comprising a plurality of magnets, operable to produce a periodic magnetic field and arranged so as to guide the relativistic electrons along a periodic path about a central axis such that they interact with radiation in the undulator, stimulating emission of coherent radiation, wherein the undulator is provided with an adjustment mechanism that is operable, in response to a received signal, to vary one or more parameters of the undulator such that the irradiance and/or the polarization of the radiation is altered.

The free electron laser may further comprise a radiation sensor operable to determine an irradiance of the emitted radiation and to transmit a signal indicative thereof to the adjustment mechanism.

The undulator may be tapered.

The adjustment mechanism may be operable to alter the magnetic field strength on, or near to, the central axis of the undulator. The magnetic field strength on, or near to, the central axis may be altered by moving the magnets towards or away from the central axis. In an embodiment, the magnets are moved relative to the central axis in such a way that the polarization of the radiation remains unaltered. Additionally or alternatively, the magnetic field strength on, or near to, the central axis may altered by altering the magnetic field produced by the magnets.

The adjustment mechanism may be operable to alter a period of the undulator.

The periodic path may comprise a helical section.

The free electron laser may further comprise a first deflecting magnet disposed between the electron source and the undulator, which can be in: an off state wherein the electrons are guided along the periodic path by the undulator such that they interact with radiation in the undulator, stimulating emission of coherent radiation; or an on state wherein the electrons are guided along a different path through the undulator such that they decouple from radiation in the undulator and substantially no emission of coherent radiation is stimulated.

The free electron laser may further comprise a second deflecting magnet disposed downstream of the undulator, which is arranged to compensate for the action of the first deflecting magnet so that electrons exiting the second deflecting magnet when the first deflecting magnet is in the on state follow substantially the same the trajectory as electrons exiting the second deflecting magnet when the first deflecting magnet is in the off state.

The free electron laser may further comprise a deceleration mechanism for decelerating electrons and a beam dump for absorbing electrons, the deceleration mechanism being operable to reduce the energy of electrons that have left the undulator before they enter the beam dump.

The electron source may comprise a linear accelerator and the deceleration mechanism may use the linear accelerator to decelerate electrons that have left the undulator.

At least a part of the deceleration mechanism may be separate from the electron source.

The deceleration mechanism may comprise an active deceleration mechanism such as a synchrotron or a cyclotron.

The deceleration mechanism may comprise a passive deceleration mechanism such as a conductive conduit with a rough inner surface which the electrons pass through.

The undulator may be configured so that the polarization of the emitted radiation is chosen in dependence with one or more mirrors disposed between the free electron laser and a patterning device, such that the radiation incident upon the patterning device has a desired polarization.

The adjustment mechanism may be operable to alter the polarization of the radiation by: splitting the radiation into two components; guiding the two components along different optical paths; and combining the two components, wherein one of the optical paths comprises a plurality of reflections such that the polarization vector of the component following that optical path is rotated. Additionally or alternatively, for embodiments wherein the undulator comprises a helical undulator, the adjustment mechanism may be operable to alter the polarization of the radiation by adjusting the periodic magnet structure of at least one section of the undulator relative to other sections. Additionally or alternatively, for embodiments wherein the undulator comprises a planar undulator, the adjustment mechanism may be operable to alter the polarization of the radiation by altering tapering of at least one section of the undulator such that a ratio of first and second linear polarization components is altered. Additionally or alternatively, the adjustment mechanism may be operable to alter the polarization of the radiation by introducing at least one section of planar undulator section into the undulator so as to amplify a desired polarization state.

Any one or more of the features above (or otherwise herein) may be included in any of the following aspects.

According to an aspect, there is provided a lithographic system comprising: a free electron laser as described herein; and one or more lithographic apparatuses.

According to an aspect, there is provided a method of producing radiation, the method comprising: producing a beam of relativistic electrons; using an undulator to guide the beam of relativistic electrons along a periodically varying path such that it emits a radiation beam; and varying one or more parameters of the undulator in response to a received signal, so as to alter the periodic magnetic field and the irradiance of the radiation beam.

According to an aspect, there is provided a free electron laser comprising: an electron source operable to produce relativistic electrons; an undulator comprising a plurality of magnets and operable to produce a periodic magnetic field, through which the relativistic electrons pass; a first deflecting magnet disposed between the electron source and the undulator, wherein the first deflecting magnet can be in: an off state wherein the electrons are guided along a periodic path by the undulator such that they emit interact with radiation in the undulator, stimulating emission of coherent radiation; or an on state wherein the electrons are guided along a different path through the undulator such that they decouple from radiation in the undulator and substantially no emission of coherent radiation is stimulated.

According to an aspect, there is provided a free electron laser comprising: an electron source operable to produce relativistic electrons; an undulator comprising a plurality of magnets and operable to produce a periodic magnetic field and arranged so as to guide the relativistic electrons along a periodic path such that they emit radiation; a beam dump operable to absorb the electrons once they leave the undulator; and a deceleration mechanism disposed between the undulator and the beam dump, wherein the deceleration mechanism is operable to reduce the energy of the electrons before they are absorbed by the beam dump, wherein the deceleration mechanism is separate from the electron source.

According to an aspect, there is provided a lithographic system comprising: a free electron laser operable to emit radiation in a first direction; a lithographic apparatus operable to receive the radiation and project it onto a patterning device in a second direction; and one or more mirrors disposed between the free electron laser and the patterning device, operable to guide the beam of radiation from the first direction to the second direction, wherein the free electron laser is configured so that the polarization of the first radiation beam is chosen in dependence on the one or more mirrors such that the polarization of the second radiation beam is suitable for irradiating the patterning device.

According to an aspect, there is provided an apparatus for converting the polarization of a beam of EUV radiation, comprising: two optical paths; and a beam splitter operable to receive a beam of EUV radiation, split it into two components and guide each component along different one of the optical paths, wherein the two optical paths converge and wherein one of the optical paths comprises a plurality of mirrors such that the polarization vector of the component following that optical path is rotated.

According to an aspect of the invention there is a provided a free electron laser, comprising: an electron source for producing an electron beam comprising a plurality of bunches of relativistic electrons; an undulator arranged to receive the electron beam and guide it along a periodic path so that the electron beam interacts with radiation within the undulator, stimulating emission of radiation and providing a radiation beam; and an adjustable compressor operable to control at least one of: (i) a charge density distribution of one or more of the plurality of electron bunches along a direction of propagation of the electron beam before it enters the undulator; or (ii) an average energy of one or more of the plurality of electron bunches before it enters the undulator.

Altering the charge density distribution of the plurality of electron bunches along their propagation direction will alter a gain of the undulator. That is, it will affect the power of the radiation beam output by the undulator. The gain of the undulator may be defined as the amount of power output by the undulator as a function of the amount of power input into the undulator. The gain of an undulator may be dependent upon a gain length (the distance an electron bunch must travel through the undulator for the power of radiation within the undulator to increase by a factor of e), a length of the undulator, and the amount of coupling between the electron bunches and radiation within the undulator. Further, altering the mean energy of the plurality of electron bunches will alter the wavelength of the radiation beam (as the mean energy increases, the wavelength of the radiation beam decreases). In turn, this will affect the wavelength of the radiation beam output by the undulator. Therefore, advantageously, the first aspect of the invention provides a free electron laser whose output power and/or wavelength can be actively controlled.

The adjustable compressor may comprise an adjustment mechanism arranged to control at least one of: (a) the chirp of one or more of the plurality of electron bunches; or (b) the average energy of electrons in one or more of the plurality of electron bunches.

The adjustment mechanism may comprise a resonant cavity.

The resonant cavity may be arranged such that a phase of the resonant cavity with respect to the electron beam remains substantially constant and the phase is such that an electric field within the cavity is substantially zero for electrons at a centre of each bunch passing through the resonant cavity. Advantageously, since such an arrangement only adjusts the charge distribution of the electron bunches and does not change a mean energy of the electron bunches, the radio frequency power required to drive the resonant cavity does not depend on the average beam current. Therefore, the power required is low and it is possible to use a less efficient resonant cavity to alter the chirp.

Alternatively, the resonant cavity may be arranged such that a phase of the resonant cavity with respect to the electron beam remains substantially constant and the phase is such that an electric field within the cavity is substantially at its maximum or minimum value for electrons at a centre of each bunch passing through the resonant cavity.

The resonant cavity may be a normally conducting resonant cavity.

Normally conducting resonant cavities such as, for example, copper cavities have relatively low Q values compared to, for example, superconducting cavities that may be used to accelerate the electron beam. Since the bandwidth of a resonator is inversely proportional to its Q value, the radio frequency power of such a normally conducting cavity can therefore be adjusted with high bandwidth. Advantageously, this allows for significantly faster change of the accelerating field gradient within the cavity, as compared to a superconducting radio frequency cavity. This is beneficial since it allows the output power and/or wavelength of the free electron laser to be adjusted relatively quickly.

The adjustable compressor may further comprise a magnetic compressor arranged to compress one or more of the plurality of electron bunches along a direction of propagation of the electron beam, the compression being dependent on a chirp of the electron bunch as it enters the magnetic compressor. The magnetic compressor may be disposed downstream of the adjustment mechanism.

The electron source may comprise a mechanism for producing a bunched electron beam and a linear accelerator operable to accelerate the bunched electron beam, the linear accelerator comprising a plurality of radio frequency cavities, and the adjustable compressor may be separate from the linear accelerator.

The free electron laser may further comprise: a controller; and a sensor for determining a value indicative of a power of the radiation beam, or indicative of a dose of radiation delivered to a target by the radiation beam, and outputting a signal indicative of the value to the controller, wherein the controller may be operable to vary the charge density distribution of one or more of the plurality of electron bunches and/or the average energy of electrons in one or more of the plurality of electron bunches in response to the signal output by the sensor.

According to an aspect of the invention there is provided a lithographic system comprising: a free electron laser according to the first aspect of the invention; and at least one lithographic apparatus, each of the at least one lithographic apparatus being arranged to receive at least a portion of at least one radiation beam produced by the free electron laser.

According to an aspect of the invention there is provided an apparatus comprising: a radiation source for producing radiation, said radiation source comprising an adjustment mechanism operable to control a wavelength of the radiation; a target location for receipt of the radiation; an optical system arranged to guide the radiation from the radiation source to the target location, the optical system having a wavelength dependent transmittance or reflectance; a controller; and a sensor for determining a value indicative of a power of the radiation, or indicative of a dose of radiation delivered to the target location by the radiation, and outputting a signal indicative thereof to the controller, wherein the controller is operable to vary the wavelength of the radiation using the adjustment mechanism in response to the signal output by the sensor.

Advantageously, such an arrangement provides a positive feedback-based control loop for controlling the dose of radiation supplied by a radiation source.

The radiation source may comprise a free electron laser, which may comprise: an electron source for producing an electron beam comprising a plurality of bunches of relativistic electrons; and an undulator arranged to receive the electron beam and guide it along a periodic path so that the electron beam interacts with radiation within the undulator, stimulating emission of radiation and providing a radiation beam, wherein the adjustment mechanism is operable to vary an average energy of electrons in one or more of the plurality of electron bunches before it enters the undulator.

Altering the mean energy of the electron bunches will alter the wavelength of the radiation beam (as the mean energy increases, the wavelength of the radiation beam decreases). In turn, this will affect the power of the radiation beam output by the undulator and therefore the dose of radiation supplied by the radiation source to the target location. Further, since the optical system has a wavelength dependent transmittance or reflectance, altering the wavelength of the radiation beam will affect the dose of radiation delivered through the optical system to the target location. Therefore, advantageously, such an arrangement provides a free electron laser whose output power and wavelength can be actively controlled. The change in wavelength of the radiation beam may have a greater effect on the dose delivered to the target location by the radiation source than the change in the power of the radiation beam.

The adjustment mechanism may comprise a resonant cavity.

The resonant cavity may be a normally conducting resonant cavity.

Normally conducting resonant cavities such as, for example, copper cavities have relatively low Q values compared to, for example, superconducting cavities that may be used to accelerate the electron beam. Since the bandwidth of a resonator is inversely proportional to its Q value, the radio frequency power of such a normally conducting cavity can therefore be adjusted with high bandwidth. Advantageously, this allows for significantly faster change of the accelerating field gradient within the cavity, as compared to a superconducting radio frequency cavity. This is beneficial since it allows the output power and/or wavelength of the free electron laser to be adjusted relatively quickly.

The resonant cavity may be arranged such that a phase of the resonant cavity with respect to the arrival of each of the plurality of electron bunches remains substantially constant and the phase is such that an electric field within the cavity is substantially at its maximum or minimum value for electrons at a centre of each of the plurality of electron bunches passing through the resonant cavity.

The electron source may comprise a mechanism for producing a bunched electron beam and a linear accelerator operable to accelerate the bunched electron beam, the linear accelerator comprising a plurality of radio frequency cavities, and the adjustment mechanism may be separate from the linear accelerator.

According to an aspect of the invention there is provided a free electron laser, comprising: an electron source for producing an electron beam comprising a plurality of bunches of relativistic electrons, said electron beam having a first frequency; an undulator arranged to receive the electron beam and guide it along a periodic path so that the electron beam interacts with radiation within the undulator, stimulating emission of radiation and providing a radiation beam; and an adjustable resonant cavity arranged between the electron source and the undulator and arranged to operate at a second frequency such that a chirp of the plurality of electron bunches and/or an average energy of the plurality of electron bunches varies with time.

When the first and second frequencies are different, the resonant cavity will continuously vary the chirp and mean energy of the plurality of electron bunches. The rate of change of the chirp and mean energy is dependent upon difference between the first and second frequencies. Altering the mean energy of electrons in the electron bunches will alter the wavelength of the radiation beam (as the mean energy increases, the wavelength of the radiation beam decreases). Therefore the fourth aspect of the invention provides a mechanism for increasing the effective bandwidth of the radiation output by a free electron laser.

The free electron laser may further comprise a magnetic compressor arranged to compress the electron bunch along a direction of propagation of the electron beam, the compression being dependent on a chirp of the electron bunch as it enters the magnetic compressor.

The resonant cavity may be a normally conducting resonant cavity.

Normally conducting resonant cavities such as, for example, copper cavities have relatively low Q values compared to, for example, superconducting cavities that may be used to accelerate the electron beam. Since the bandwidth of a resonator is inversely proportional to its Q value, the radio frequency power of such a normally conducting cavity can therefore be adjusted with high bandwidth. Advantageously, this allows for significantly faster change of the accelerating field gradient within the cavity, as compared to a superconducting radio frequency cavity. This is beneficial since it allows the output power and bandwidth of the free electron laser to be adjusted relatively quickly.

The electron source may comprise a mechanism for producing a bunched electron beam and a linear accelerator operable to accelerate the bunched electron beam, the linear accelerator comprising a plurality of radio frequency cavities, and the adjustable compressor may be separate from the linear accelerator.

The free electron laser may further comprise: a controller; and a sensor for determining a value indicative of a power of the radiation beam, or a dose of radiation delivered to a target location by the radiation beam, and outputting a signal indicative thereof to the controller, wherein the controller is operable to control one or more parameters of the resonant cavity in response to the signal output by the sensor.

The one or more parameters of the resonant cavity controlled in response to the signal output by the sensor may comprise an amplitude of an electric field within the resonant cavity.

The one or more parameters of the resonant cavity controlled in response to the signal output by the sensor may comprise the second frequency at which the resonant cavity operates. This may be achieved by adjusting both: a frequency of a radio frequency source that supplies electromagnetic radiation to the resonant cavity; and a geometry of the resonant cavity. The geometry of the resonant cavity may be altered using, for example, one or more piezoelectric stretchers and/or compressors to match a resonant frequency of the resonant cavity to the frequency of the radio frequency source that supplies electromagnetic radiation to the resonant cavity.

According to an aspect of the invention there is provided a lithographic system comprising: a free electron laser according to the fourth aspect of the invention; at least one lithographic apparatus, each of the at least one lithographic apparatus being arranged to receive at least a portion of at least one radiation beam produced by the free electron laser a controller; and a sensor for determining a value indicative of a power of the radiation, or indicative of a dose of radiation delivered to a target location within the at least one lithographic apparatus by the radiation, and outputting a signal indicative thereof to the controller, wherein the controller is operable to vary one or more parameters of the resonant cavity in response to the signal output by the sensor.

The target location may be, for example, a location on a substrate which receives radiation for a period of time during exposure of a substrate. The dose of energy received by the target location may be an integral with respect to time of a power of the radiation beam over an exposure time period. For sufficiently long exposure time periods, high frequency variations will be averaged out over the exposure time period. This is especially beneficial for embodiments wherein the dose of radiation received by the target location is wavelength dependent and wherein this dependence strongly depends on the wavelength and bandwidth of the radiation beam. The fifth aspect of the invention allows control over the bandwidth of the radiation beam and thus allows the bandwidth to be optimized to reduce dose sensitivity to variation of wavelength.

The one or more parameters of the resonant cavity controlled in response to the signal output by the sensor may comprise an amplitude of an electric field within the resonant cavity.

The one or more parameters of the resonant cavity controlled in response to the signal output by the sensor may comprise the second frequency at which the resonant cavity operates. This may be achieved by adjusting both: a frequency of a radio frequency source that supplies electromagnetic radiation to the resonant cavity; and a geometry of the resonant cavity. The geometry of the resonant cavity may be altered using, for example, one or more piezoelectric stretchers and/or compressors to match a resonant frequency of the resonant cavity to the frequency of the radio frequency source that supplies electromagnetic radiation to the resonant cavity.

According to an aspect of the invention there is provided a method of controlling a dose of radiation received by a target location, comprising: determining a dependence of a dose of radiation received by a target location on a wavelength and/or power of a radiation beam; producing radiation using an adjustable radiation source operable to produce radiation of a plurality of different wavelengths; guiding the radiation to a target location via a wavelength dependent optical system; determining a value indicative of a power of the radiation, or indicative of a dose of radiation delivered to the target location by the radiation; and varying the wavelength of the radiation in dependence on the determined value so as to control the dose of radiation received by the target location.

The step of determining a dependence of a dose of radiation received by a target location on a wavelength and/or power of a radiation beam may only be performed once as a calibration step.

According to an aspect of the invention there is provided a free electron laser comprising an injector an accelerator and an undulator, the free electron laser being configured to generate an EUV radiation beam, wherein the undulator comprises undulator modules and one or more dynamic phase shifters, the dynamic phase shifters being operable to change the power and/or bandwidth and/or spatial power distribution of the EUV radiation beam generated by the free electron laser.

The one or more dynamic phase shifters may comprise electromagnets configured to change the length of an electron trajectory when they are activated.

The one or more dynamic phase shifters may comprise three pairs of electromagnets, each pair being provided on opposite sides of the electron trajectory.

A controller may be operable to selectively supply current to the electromagnets to activate and switch off the electromagnets.

The controller may be operable to control the size of the current supplied to the electromagnets and thereby control the size of the phase shift applied by the one or more dynamic phase shifters.

A protective tube formed from a conductive material may be provided around the beam trajectory.

Openings at least partially filled with dielectric may be provided in the protective tube.

The openings may have tapered ends.

At least part of the protective tube may be formed from conductive material having a skin depth which is more than 10 microns but less than 1 mm.

The one or more dynamic phase shifters may comprise transverse kickers configured to change the length of an electron trajectory when they are activated.

The one or more dynamic phase shifters may be controlled by a controller.

The controller may be configured to control the dynamic phase shifters with a frequency of 10 kHz or more.

According to an aspect of the invention there is provided a free electron laser comprising an injector an accelerator and an undulator, the free electron laser being configured to generate an EUV radiation beam, wherein the undulator comprises undulator modules and two or more dynamic phase shifters, the dynamic phase shifters being operable to change the bandwidth and/or spatial power distribution of the EUV radiation beam generated by the free electron laser without significantly changing the power of the EUV radiation beam generated by the free electron laser.

According to an aspect of the invention there is provided a method of generating an EUV radiation beam using a free electron laser, the method comprising using one or more dynamic phase shifters to modify the relative phase between electron movement and the EUV radiation and thereby change the power and/or bandwidth and/or spatial power distribution of the EUV radiation beam generated by the free electron laser.

The one or more dynamic phase shifters may comprise electromagnets configured to change the length of an electron trajectory when they are activated.

The one or more dynamic phase shifters may comprise three pairs of electromagnets, each pair being provided on opposite sides of the electron trajectory.

Current may be selectively supplied to the electromagnets to activate and switch off the electromagnets.

The size of the current supplied to the electromagnets may be controlled, thereby controlling the size of the phase shift applied by the one or more dynamic phase shifters.

The one or more dynamic phase shifters may comprise transverse kickers configured to change the length of an electron trajectory when they are activated.

The dynamic phase shifters may be controlled with a frequency of 10 kHz or more.

According to an aspect of the invention there is provided a method of generating an EUV radiation beam using a free electron laser, the method comprising using two or more dynamic phase shifters to modify the bandwidth and/or spatial power distribution of the EUV radiation beam generated by the free electron laser without significantly changing the power of the EUV radiation beam generated by the free electron laser.

According to an aspect of the invention there is provided a measurement apparatus for determining a value indicative of a power of a radiation beam, comprising: a sensor; and an optical element for receiving the radiation beam, the optical element comprising first and second regions, the first region arranged to receive a first portion of the radiation beam and the second region arranged to receive a second portion of the radiation beam, the first and second regions forming spatially distinct regions of a surface of the optical element; wherein the first region is further arranged to form a first branch radiation beam from the first portion, and direct the first branch radiation beam to the sensor, which is arranged to determine a power of the first branch radiation beam, and wherein the second region is further arranged to form a second branch radiation beam from the second portion, which is not directed to the sensor.

Advantageously, such an arrangement allows a power of a first portion of a radiation beam to be determined without requiring a sensor to be placed in the path of the radiation beam. Therefore, the invention enables the measurement of the power of radiation beams with very high powers and intensities, which would otherwise place too high a thermal load on sensors placed directly in their path. In addition, since the sensor need not be placed in the path of the radiation beam, the invention provides an arrangement wherein there are no limits on the dimensions of the first region of the optical element. In particular, this allows the first region to be sufficiently small that the part of the intensity distribution that is used for the power measurement (i.e. the part that contributes to the first branch radiation beam) is significantly smaller than would be the case if one or more sensors were placed in the path of the radiation beam.

The first region may comprise a plurality of spatially separated sub-regions.

The plurality of spatially separated sub-regions may be distributed over the optical element.

The plurality of spatially separated sub-regions may form a rectangular two dimensional lattice of recesses or protrusions over a surface of the optical element. The plurality of spatially separated sub-regions may form other distributions over the surface of the optical element.

The optical element may comprise a grating and a plurality of faces of the grating may form the plurality of spatially separated sub-regions.

The first branch radiation beam may be formed by reflection of the first portion from the first region.

The first region of the optical element may comprise a fluorescent material and the first branch radiation beam may be formed by the fluorescent material absorbing the first portion of the radiation beam and subsequently emitting radiation of a different wavelength which forms the first branch radiation beam.

The first branch radiation beam may be formed by scattering of the first portion from the first region.

The optical element may comprise a grazing incidence mirror.

The sensor may comprise an array of sensing elements.

The sensor may comprise a mechanism for converting the wavelength of the first branch radiation beam to a longer wavelength before determining a power of the first branch radiation beam.

The sensor may comprise a mechanism for altering a pulse duration of the first branch radiation beam.

A dimension of each of the plurality of spatially separated sub-regions may be of the order of 100 μm or less.

A dimension of each of the plurality of spatially separated sub-regions may be sufficiently small that in the far field the intensity distribution of the second branch radiation beam is substantially the same as that of the radiation beam.

A dimension of each of the plurality of spatially separated sub-regions may be sufficiently small that disturbance of the shape of a reflective surface of the optical element due to thermal expansion distortion in the proximity of the plurality of spatially separated sub-regions is negligible.

A dimension of each of the plurality of spatially separated sub-regions may be sufficiently small that the total power emitted or scattered by a single mark is a relatively small fraction of the radiation beam.

The value indicating a power of the radiation beam may be provided to a control element. The control element may be arranged to control an aspect of the radiation beam. For example, the control element may be arranged to adjust an intensity distribution, or an average intensity, of the radiation beam. The controller may be arranged to adjust a position of the radiation beam.

According to an aspect of the invention there is provided a measurement apparatus for determining a value indicative of a power of a radiation beam, comprising: a sensor; and an optical element for receiving the radiation beam, the optical element being a grating and comprising a plurality of faces, each face being arranged to receive a portion of the radiation beam and form a radiation sub-beam, wherein the radiation sub-beams from the plurality of faces interfere to form: (i) a first branch radiation beam, which is directed to the sensor, the sensor being arranged to determine a power of the first branch radiation beam, and (ii) a second branch radiation beam, which is not directed to the sensor.

According to an aspect of the invention there is provided a radiation beam steering unit, comprising: a measurement apparatus according to the first aspect of the invention; one or more radiation beam steering mechanisms; and a control unit arranged to receive a signal from the sensor indicative of a power and, in response thereto, to control the one or more radiation beam steering mechanisms to alter the position of the radiation beam.

According to an aspect of the invention there is provided a radiation source, comprising: a mechanism arranged to output a radiation beam; and a measurement apparatus according to the first aspect of the invention, the optical element being arranged to receive the radiation beam.

According to an aspect of the invention there is provided a lithographic system, comprising: a radiation source for producing a radiation beam; one or more lithographic apparatuses; and a measurement apparatus according to the first aspect of the invention arranged to determine a value indicative of a power of the radiation beam or a secondary radiation beam formed therefrom.

According to an aspect of the invention there is provided a lithographic system, comprising: a radiation source for producing a radiation beam; one or more lithographic apparatuses; and a radiation beam steering unit according to the second aspect of the invention, arranged to steer the radiation beam or a secondary radiation beam formed therefrom.

According to an aspect of the invention there is provided a measurement apparatus for determining a value indicative of a power of a radiation beam, comprising: a sensor for determining a power of the radiation beam; and a mechanism for altering a pulse duration of the radiation beam before the power is determined by the sensor.

Advantageously, the mechanism for altering a pulse duration may simplify power measurements for radiation beams with relatively short pulses. For example, a radiation beam may comprise pulses that are too short to be resolved by known sensing elements, such as fast photo diodes. In such cases, by increasing the pulse duration, the power can be resolved by such sensing elements.

The mechanism for altering a pulse duration of the radiation beam may be further operable to convert a wavelength of the radiation beam to a longer wavelength before the power is determined by the sensor.

The mechanism for altering a pulse duration of the radiation beam may comprise a fluorescent material arranged to absorb the radiation beam and subsequently emit radiation of a longer wavelength.

According to an aspect of the invention there is provided a method of determining a value indicative of a power of a radiation beam, comprising: directing the radiation beam towards an optical element comprising first and second regions, the first region arranged to receive a first portion of the radiation beam and the second region arranged to receive a second portion of the radiation beam, the first and second regions forming spatially distinct regions of a surface of the optical element; forming a first branch radiation beam from the first portion; forming a second branch radiation beam from the second portion; directing the first and second branch radiation beams to different locations; and determining a power of the first branch radiation beam.

The first region may comprise a plurality of spatially separated sub-regions.

The plurality of spatially separated sub-regions may be distributed over the optical element.

The plurality of spatially separated sub-regions may form a form a rectangular two dimensional lattice of recesses or protrusions over a surface of the optical element.

The optical element comprises a grating and a plurality of faces of the grating may form the plurality of spatially separated sub-regions.

The first branch radiation beam may be formed by reflection of the first portion from the first region.

The first region of the optical element may comprise a fluorescent material and the first branch radiation beam may be formed by the fluorescent material absorbing the first portion of the radiation beam and subsequently emitting radiation of a different wavelength which forms the first branch radiation beam.

The first branch radiation beam may be formed by scattering of the first portion from the first region.

Before the power of the first branch radiation beam is determined, a wavelength of the first branch radiation beam may be converted to a longer wavelength.

Before the power of the first branch radiation beam is determined, a pulse duration of the first branch radiation beam may be altered.

According to an aspect of the invention there is provided a method of determining a value indicative of a power of a radiation beam, comprising: directing the radiation beam towards an optical element comprising a plurality of faces, each face being arranged to receive a portion of the radiation beam and form a radiation sub-beam; forming first and second branch radiation beams from the interference between the radiation sub-beams from the plurality of faces; directing the first and second branch radiation beams to different locations; and determining a power of the first branch radiation beam.

According to an aspect of the invention there is provided a method of steering a radiation beam, comprising: determining a value indicative of a power of a radiation beam using the method according to the eighth or ninth aspect of the invention; and in response to the determined value, controlling a position of the radiation beam.

For example, the adjusted parameter may be a position of the radiation beam. The adjusted parameter may be an intensity or an intensity distribution of the radiation beam.

Generally, the parameter to be adjusted may be adjusted by any appropriate means. For example, the adjustment may be carried out by adjusting a source of the radiation beam, or by adjusting a path of the radiation beam between the source of the radiation beam and the optical element.

According to an aspect of the present invention, there is provided an apparatus for adjusting an intensity of radiation used in a lithographic process, comprising: a first element for receiving a first radiation beam and arranged to reflect a portion of the first radiation beam in the form of a second radiation beam towards a second element, the second element being arranged to reflect a portion of the second radiation beam in the form of a third radiation beam away from the second element; and adjustment means adapted to adjust an incidence angle between at least one of the first radiation beam and the first element and second radiation beam and the second element so as to vary an intensity of the third radiation beam.

In this way, the first aspect provides an apparatus for efficiently adjusting an attenuation of radiation entering the attenuation apparatus, thereby adjusting the intensity of the radiation beam output from the attenuation apparatus. The first aspect provides a mechanism which may be implemented in a mechanically efficient and straightforward manner, while allowing for rapid adjustments of the intensity of the third radiation beam.

The third radiation beam may be output from attenuation apparatus, for example, towards a lithographic apparatus. Alternatively, the third radiation beam may be directed towards a further attenuation apparatus.

The incidence angle of the first radiation beam at the first element may be the same as the incidence angle of the second radiation beam at the second element. The apparatus may be arranged to ensure that the incidence angle of the first radiation beam with respect to the first element is always substantially the same as the incidence angle of the second radiation beam with respect to the second element. In this way, the third radiation beam is reflected from the third element in substantially the same direction as the direction of propagation of the first radiation beam.

The adjustment means may be adapted to adjust the incidence angle of the first and second radiation beams between approximately 1 degree and approximately 10 degrees.

The first element may be arranged to rotate around a first point and/or the second element arranged to rotate around a second point. The adjustment means may be arranged to selectively rotate at least one of the first and second elements to adjust the incidence angles of the first or second radiation beams with the first and second elements. This provides a particularly effective and simple manner of implementing the first aspect.

The first element may be arranged to be rotated around the first point and/or the second element is arranged to be rotated around the second point through an angle of approximately 9 degrees.

The attenuation apparatus may further comprise a third element for receiving the third radiation beam and for reflecting a portion of the third radiation beam in the form of a fourth radiation beam and a fourth element for receiving the fourth radiation beam and for reflecting a portion of the fourth radiation beam in the form of a fifth radiation beam away from the fourth element.

By provision of the third and fourth elements, an attenuation range of the attenuation apparatus may be increased. Alternatively, or additionally, provision of the third and fourth elements allows for an effect of reflection by the elements of the attenuation apparatus on a polarity of radiation to be reduced for a given attenuation.

The adjustment means may be adapted to adjust an incidence angle between at least one of the third radiation beam and the fourth element and the fourth radiation beam and the fourth element.

The adjustment means may be adapted to adjust the incidence angle of the first, second, third and fourth radiation beams with the respective first, second, third and fourth elements between approximately 1 degrees and approximately 5 degrees. In this way, an attenuation range of between approximately 8% and 20% may be achieved while better maintaining a polarity of the first radiation beam in the third radiation beam.

The first element may be arranged to rotate around a first point, the second element arranged to rotate around a second point, the third element arranged to rotate around a third point and the fourth element arranged to rotate around a fourth point. The adjustment means may be arranged to selectively rotate at least one of the first, second, third and fourth elements to adjust the incidence angles of the first, second, third or fourth radiation beams with the respective first, second, third or fourth elements.

Each of the first, second, third and fourth elements may be arranged to be rotated around the respective first, second, third or fourth point through an angle of approximately 4 degrees.

The apparatus may further comprise a controller arranged to control the adjustment means.

The controller may be arranged to receive indications of a radiation intensity from a sensor and to control the adjustment means in response to said indications. In this way, the attenuation provided by the first attenuation apparatus may be better controlled. The controller may, for example, comprise part of a control loop arranged to maintain an intensity of radiation provided at a predetermined location within a predetermined intensity range.

The apparatus may comprise a further attenuation apparatus. The further attenuation apparatus may comprise fixed attenuation apparatus. That is, the further attenuation apparatus may provide an attenuation that cannot be varied, or can be varied only by a small amount compared to the variation in attenuation achievable using the first and second elements, or using the first to fourth elements. The further attenuation apparatus may provide an attenuation factor larger than the attenuation of the variable attenuator. For example, the further attenuation apparatus may provide an attenuation factor of ten.

Alternatively, the further attenuation apparatus may comprise adjustable attenuation apparatus. The further attenuation apparatus may be adjustable through a larger range of attenuations than the first attenuation apparatus, but may be adjustable with a lower frequency than the frequency with which the first attenuation apparatus may be adjusted.

The further attenuation apparatus may comprise a chamber containing an EUV absorbing medium, the chamber being arranged in the path of a radiation beam.

The further attenuation apparatus may comprise a pressure sensor operable to monitor a pressure within the chamber.

The further attenuation apparatus may comprise a gas inlet and a gas outlet.

The apparatus may further comprise a second controller, wherein the second controller is in communication with the pressure monitor and is arranged to control the gas inlet and gas outlet to maintain a pressure within the chamber within a predetermined range.

The first and second controller may be the same controller.

The adjustment means may comprise respective adjustment means for each element to be adjusted.

The apparatus may further comprise a reflective membrane disposed at a non-normal angle with respect to the direction of propagation of one of the radiation beams, wherein the reflective membrane is arranged to transmit a portion of the one of the radiation beams and to reflect a portion of the one of the radiation beams.

The one of the radiation beams may be, for example, the first, second, third, or fourth radiation beams.

According to an aspect of the invention, there is provided a lithographic system comprising: a radiation source operable to produce a main radiation beam; an attenuation apparatus according to the first aspect arranged to receive at least a portion of the main radiation beam; and at least one lithographic apparatus, the at least one lithographic apparatus being arranged to receive an attenuated radiation beam from the attenuation apparatus.

For example, the main radiation, or a portion of the main radiation beam may provide the first radiation beam described above with respect to the first aspect.

The lithographic system may comprise a beam splitting apparatus arranged to receive a main radiation beam and output at least one branch radiation beam. The attenuation apparatus may be arranged to receive the at least one branch radiation beam.

The beam splitting apparatus may be arranged to output a plurality of branch radiation beams. The lithographic system may comprise a respective attenuation apparatus for each of said plurality of branch radiation beams, each attenuation apparatus arranged to receive a respective one of said plurality of branch radiation beams.

Alternatively, the lithographic system may comprise one or more attenuation apparatus for some of the plurality of branch radiation beams. That is, some branch radiation beams may not pass through an attenuation apparatus in the lithographic system.

The radiation source may comprise one or more free electron lasers.

The at least one lithographic apparatus may comprise one or more mask inspection apparatus.

The main radiation beam may comprise EUV radiation.

It will be appreciated that aspects of the present invention can be implemented in any convenient way including by way of suitable hardware and/or software. Alternatively, a programmable device may be programmed to implement embodiments of the invention. The invention therefore also provides suitable computer programs for implementing aspects of the invention. Such computer programs can be carried on suitable carrier media including tangible carrier media (e.g. hard disks, CD ROMs and so on) and intangible carrier media such as communications signals.

One or more aspects of the invention may be combined with any one or more other aspects described herein, and/or with any one or more features described in the preceding or following description.

BRIEF DESCRIPTION OF THE DRAWINGS

Embodiments of the invention will now be described, by way of example only, with reference to the accompanying schematic drawings, in which.

DETAILED DESCRIPTION

Figure 1:
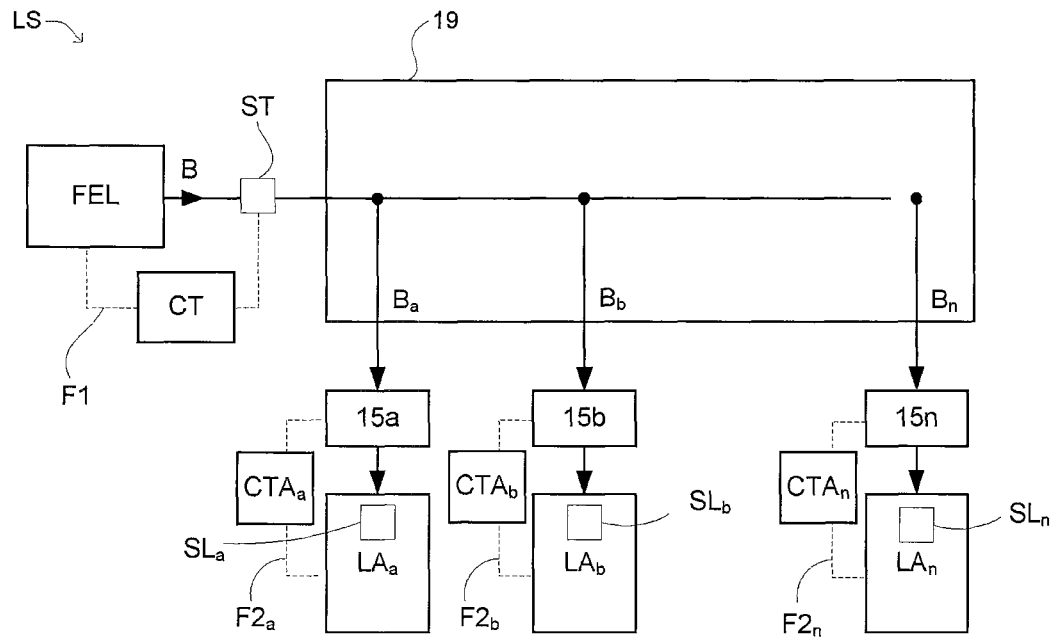
FIG. 1 is a schematic illustration of a lithographic system according to an embodiment of the invention.

FIG. 1 shows a lithographic system LS according to one embodiment of the invention. The lithographic system LS comprises a free electron laser FEL, a beam delivery system and a plurality of lithographic apparatus $LA_a$-$LA_n$ (e.g. eight lithographic apparatus). The free electron laser FEL is configured to generate an extreme ultraviolet (EUV) radiation beam B (which may be referred to as a main beam). A controller CT controls the power of EUV radiation emitted from the free electron laser FEL. A sensor apparatus ST monitors the power of the EUV radiation beam output by the free electron laser beam or a parameter correlated with the power of the EUV radiation beam. The controller CT adjusts the free electron laser based on the output of the detector. Thus a feedback-based control loop is provided, as indicated by the dashed line F1. The sensor apparatus ST may be provided at any suitable location. Apparatus and methods which may be used to control the output power of the free electron laser FEL are described further below. These may for example be used to reduced fluctuations of the power of the EUV radiation beam output from the free electron laser (e.g. when averaged over an exposure time period such as 1 ms). Apparatus and methods which may be used to adjust the output power of the free electron laser whilst maintaining a substantially constant wavelength are described further below.

The sensor apparatus ST may for example be an EUV radiation detector which is configured to monitor the power of the EUV radiation beam (e.g. by splitting off and measuring a fraction the EUV radiation beam). The sensor apparatus may for example be a sensor which measures the current in the electron beam of the free electron laser FEL. This may for example be a beam position monitor for which a calibration of output signal to electron current has been performed. The current in the electron beam may be correlated to the EUV radiation beam power (e.g. if the conversion efficiency of the free electron laser is constant). The sensor apparatus may for example be a detector which is used to monitor the power of a laser beam used to generate electrons for the electron beam (e.g. as described below in relation to FIG. 4). The power of the laser beam may be correlated to the EUV radiation beam power. The sensor apparatus may for example be a Faraday cup (or equivalent) configured to measure the charge of electrons of the electron beam incident at a beam dump. The charge of electrons incident at the beam dump may for example be correlated to the EUV radiation beam power.

The beam delivery system comprises a beam splitting apparatus 19 and may optionally also comprise beam expanding optics (not shown). The main radiation beam B is split into a plurality of radiation beams $B_a$-$B_n$ (which may be referred to as branch beams), each of which is directed to a different one of the lithographic apparatus $LA_a$-$LA_n$, by the beam splitting apparatus 19. The branch radiation beams $B_a$-$B_n$ may be split off from the main radiation beam in series, with each branch radiation beam being split off from the main radiation beam downstream from the preceding branch radiation beam. Where this is the case the branch radiation beams may for example propagate substantially parallel to each other.

The optional beam expanding optics (not shown) are arranged to increase the cross sectional area of the radiation beam B. Advantageously, this decreases the heat load on mirrors downstream of the beam expanding optics. This may allow the mirrors downstream of the beam expanding optics to be of a lower specification, with less cooling, and therefore less expensive. Additionally or alternatively, it may allow the downstream mirrors to be nearer to normal incidence. The beam splitting apparatus 19 may comprise a plurality of static extraction mirrors (not shown) arranged in the path of the beam B which direct radiation from the main beam B along the plurality of branch radiation beams $B_a$-$B_n$. Increasing the size of the main beam B reduces the accuracy with which the mirrors must be located in the beam B path. Therefore, this allows for more accurate splitting of the output beam B by the splitting apparatus 19. For example, the beam expanding optics may be operable to expand the main beam B from approximately 100 μm to more than 10 cm before the main beam B is split by the beam splitting apparatus 19.

In an embodiment, the branch radiation beams $B_a$-$B_n$ are each directed through a respective attenuator 15a-15n. Each attenuator 15a-15n is arranged to adjust the intensity of a respective branch radiation beam $B_a$-$B_n$ before the branch radiation beam $B_a$-$B_n$ passes into its corresponding lithographic apparatus $LA_a$-$LA_n$. Each attenuator 15a-15n may be controlled by a controller $CTA_{a-n}$ using feedback provided from a lithographic apparatus associated with that attenuator. For example, a lithographic apparatus $LA_n$ may include a sensor $SL_n$ which monitors the intensity of the branch radiation beam $B_n$ within that lithographic apparatus. The output from the sensor $SL_n$ may be used to control the attenuator $15_n$. Thus a feedback-based control loop is provided, as indicated by the dashed line $F2_n$. The sensor $SL_n$ may be provided at any suitable location in the lithographic apparatus $LA_n$. For example, the sensor $SL_n$ may be located after a projection system of the lithographic apparatus (e.g. at a substrate supporting table of the lithographic apparatus). Alternatively, the sensor $SL_n$ may be located before a projection system of the lithographic apparatus (e.g. between an illumination system and a mask support structure of the lithographic apparatus).

The first feedback-based control loop F1 may have a faster response than the second feedback-based control loop $F2_n$.

The first feedback-based control loop F1 may operate at a frequency of 10 kHz or more, e.g. 50 kHz or more. The first feedback-based control loop may for example operate at a frequency of around 100 kHz or more. The second feedback-based control loop may operate at a frequency of 1 kHz or less.

In an embodiment, the controller CT which controls the first feedback loop may be configured to take into account transmission of for example the optics of the beam splitter 19 and/or of the lithographic apparatus $LA_a$-$LA_n$. Where this is the case, the controller CT may control the dose of radiation delivered to a lithographic substrate in a lithographic apparatus via control of the free electron laser FEL.

In an embodiment, feedback may be provided from a sensor in a lithographic apparatus $LA_a$-$LA_n$ to the controller CT which controls the free electron laser FEL. The sensor may for example be provided in an illumination system of the lithographic apparatus. Feedback from sensors in more than one lithographic apparatus $LA_a$-$LA_n$ may be provided to the controller CT which controls the free electron laser FEL.

A target location on a lithographic substrate may receive EUV radiation for around 1 ms. Controlling the power of EUV radiation delivered to a lithographic substrate via feedback-based control of the free electron laser FEL may provide improved consistency of exposure dose at target locations on a lithographic substrate. A feedback-based control loop operating at a frequency of 10 kHz or more will provide some control of exposure dose delivered in 1 ms. A feedback-based control loop operating at a frequency of 50 kHz or more will provide improved control of exposure dose delivered in 1 ms (it may allow fluctuations in the power of the EUV radiation beam to be smoothed out more completely). A feedback-based control loop operating at a frequency of around 100 kHz or more may provide still further improved control of exposure dose delivered in 1 ms. A feedback-based control loop for the free electron laser FEL operating at frequencies of 1 MHz or more may not provide any significant additional benefit in terms of dose control because the 1 ms exposure time is such that EUV radiation fluctuations at such frequencies will be averaged out effectively during the exposure time.

The controller CT and/or the controllers $CTA_{a-n}$ may incorporate some feed-forward control which takes into account changes of radiation beam parameters which are known and which will occur in known circumstances (e.g. radiation beam changes which occur immediately after the free electron laser begins operating).

The radiation source SO, beam splitting apparatus 19, beam expanding optics (if present) and lithographic apparatus $LA_a$-$LA_n$ may all be constructed and arranged such that they can be isolated from the external environment. A vacuum may be provided in at least part of the radiation source SO, beam splitting apparatus 19 and lithographic apparatuses $LA_a$-$LA_n$ so as to minimise the absorption of EUV radiation. Different parts of the lithographic system LS may be provided with vacuums at different pressures (i.e. held at different pressures which are below atmospheric pressure).

Figure 2:
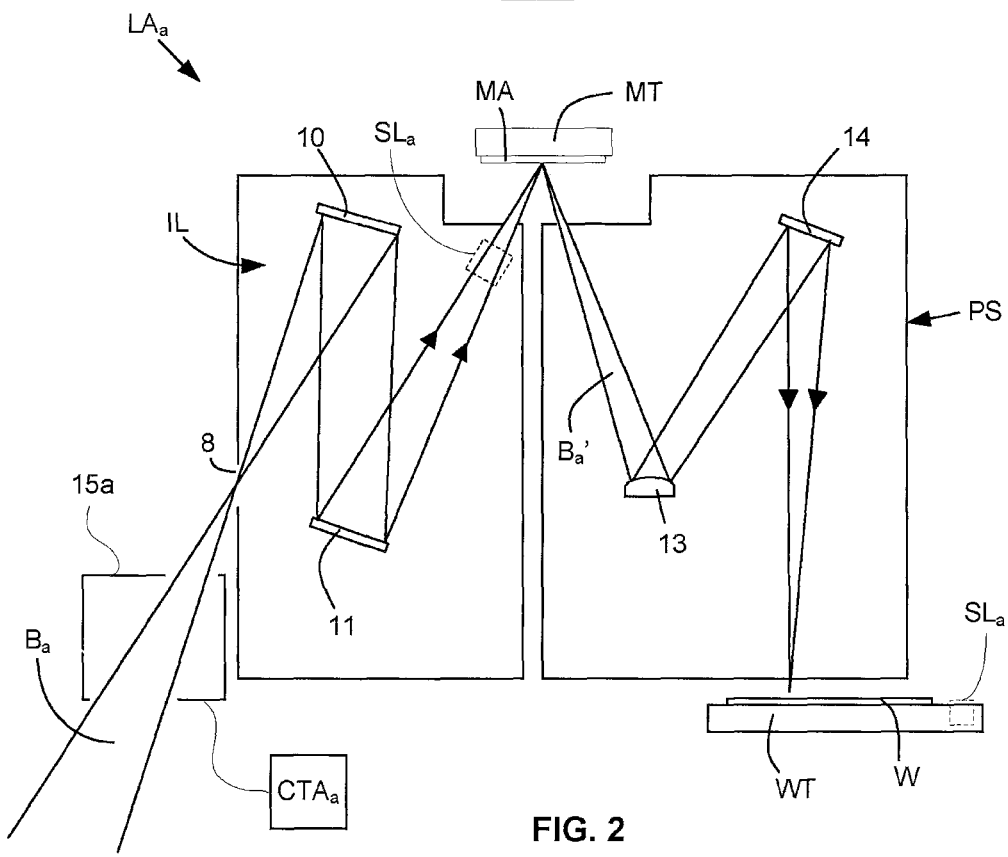
FIG. 2 is a schematic illustration of a lithographic apparatus that forms part of the lithographic system of FIG. 1.

Referring to FIG. 2, a lithographic apparatus $LA_a$ comprises an illumination system IL, a support structure MT configured to support a patterning device MA (e.g. a mask), a projection system PS and a substrate table WT configured to support a substrate W. The illumination system IL is configured to condition the branch radiation beam $B_a$ that is received by that lithographic apparatus $LA_a$ before it is incident upon the patterning device MA. The projection system PS is configured to project the radiation beam $B_a'$ (now patterned by the patterning device MA) onto the substrate W. The substrate W may include previously formed patterns. Where this is the case, the lithographic apparatus aligns the patterned radiation beam $B_a'$ with a pattern previously formed on the substrate W.

The branch radiation beam $B_a$ that is received by the lithographic apparatus $LA_a$ passes into the illumination system IL from the beam splitting apparatus 19 though an opening 8 in an enclosing structure of the illumination system IL. Optionally, the branch radiation beam $B_a$ may be focused to form an intermediate focus at or near to the opening 8.

The illumination system IL may include a facetted field mirror device 10 and a facetted pupil mirror device 11. The faceted field mirror device 10 and faceted pupil mirror device 11 together provide the radiation beam $B_a$ with a desired cross-sectional shape and a desired angular distribution. The radiation beam $B_a$ passes from the illumination system IL and is incident upon the patterning device MA held by the support structure MT. The patterning device MA reflects and patterns the radiation beam to form a patterned beam $B_a'$. The illumination system IL may include other mirrors or devices in addition to or instead of the faceted field mirror device 10 and faceted pupil mirror device 11. The illumination system IL may for example include an array of independently moveable mirrors. The independently moveable mirrors may for example measure less than 1 mm across. The independently moveable mirrors may for example be microelectromechanical systems (MEMS) devices.

Following redirection (e.g. reflection) from the patterning device MA the patterned radiation beam $B_a'$ enters the projection system PS. The projection system PS comprises a plurality of mirrors 13, 14 which are configured to project the radiation beam $B_a'$ onto a substrate W held by the substrate table WT. The projection system PS may apply a reduction factor to the radiation beam, forming an image with features that are smaller than corresponding features on the patterning device MA. A reduction factor of 4 may for example be applied. Although the projection system PS has two mirrors in FIG. 2, the projection system may include any number of mirrors (e.g. six mirrors).

The lithographic apparatus $LA_a$ is operable to impart a radiation beam $B_a$ with a pattern in its cross-section and project the patterned radiation beam onto a target portion of a substrate thereby exposing a target portion of the substrate to the patterned radiation. The lithographic apparatus $LA_a$ may, for example, be used in a scan mode, wherein the support structure MT and the substrate table WT are scanned synchronously while a pattern imparted to the radiation beam $B_a'$ is projected onto a substrate W (i.e. a dynamic exposure). The velocity and direction of the substrate table WT relative to the support structure MT may be determined by the demagnification and image reversal characteristics of the projection system PS. The patterned radiation beam $B_a'$ which is incident upon the substrate W may comprise a band of radiation. The band of radiation may be referred to as an exposure slit. During a scanning exposure, the movement of the substrate table WT and the support structure MT are such that the exposure slit travels over a target portion of substrate W thereby exposing the target portion of the substrate W to patterned radiation. It will be appreciated that a dose of radiation to which a given location within the target portion of the substrate W is exposed depends on the power of the radiation beam $B_a'$ and the amount of time for which that location is exposed to radiation as the exposure slit is scanned over the location (the effect of the pattern is neglected in this instance). The term "target location" may be used to denote a location on the substrate which is exposed to radiation (and for which the dose of received radiation may be calculated).

An attenuator 15a is shown in FIG. 2, the attenuator being provided before the lithographic apparatus. Embodiments of the attenuator 15a are described further below. The lithographic apparatus may be provided with a sensor configured to measure the power of the EUV radiation beam in the lithographic apparatus. The sensor may for example be provided in the illumination system IL, as schematically indicated by dashed line $SL_a$. Additionally or alternatively, the sensor may be provided after the projection system. The sensor may for example be provide on the substrate table, as indicated schematically by dashed line $SL_a$. A controller $CTA_a$ may control the attenuation provided by the attenuator 15a. The controller $CTA_a$ may receive a signal from the sensor $SL_a$ and use this signal, at least in part, to control the attenuation. Thus, a feedback-based control loop may be provided.

Referring again to FIG. 1, the free electron laser FEL is configured to generate an EUV radiation beam B with sufficient power to supply each of the lithographic apparatus $LA_a$-$LA_n$. As noted above, the radiation source may comprise a free electron laser.

A free electron laser comprises an electron source and accelerator, which are operable to produce a bunched relativistic electron beam, and a periodic magnetic field through which the bunches of relativistic electrons are directed. The periodic magnetic field is produced by an undulator and causes the electrons to follow an oscillating path about a central axis. As a result of the acceleration caused by the magnetic structure the electrons spontaneously radiate electromagnetic radiation generally in the direction of the central axis. The relativistic electrons interact with radiation within the undulator. Under certain conditions, this interaction causes the electrons to bunch together into microbunches, modulated at the wavelength of radiation within the undulator, and coherent emission of radiation along the central axis is stimulated.

The path followed by the electrons may be sinusoidal and planar, with the electrons periodically traversing the central axis, or may be helical, with the electrons rotating about the central axis. The type of oscillating path may affect the polarization of radiation emitted by the free electron laser. For example, a free electron laser which causes the electrons to propagate along a helical path may emit elliptically polarized radiation, which may be desirable for exposure of a substrate W by some lithographic apparatus.

Figure 3:
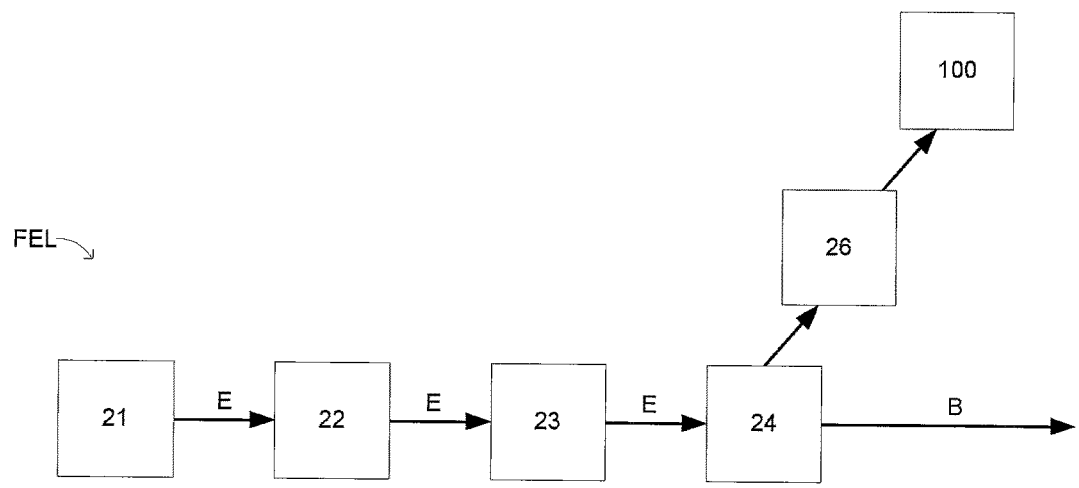
FIG. 3 is a schematic illustration of a free electron laser that forms part of the lithographic system of FIG. 1.

FIG. 3 is a schematic depiction of a free electron laser FEL comprising an injector 21, a linear accelerator 22, a bunch compressor 23, an undulator 24, an electron decelerator 26 and a beam dump 100.

The injector 21 is arranged to produce a bunched electron beam E and comprises an electron source such as, for example, a thermionic cathode or photo-cathode and an accelerating electric field. Electrons in the electron beam E are further accelerated by the linear accelerator 22. In an example, the linear accelerator 22 may comprise a plurality of radio frequency cavities, which are axially spaced along a common axis, and one or more radio frequency power sources, which are operable to control the electromagnetic fields along the common axis as bunches of electrons pass between them so as to accelerate each bunch of electrons. The cavities may be superconducting radio frequency cavities. Advantageously, this allows: relatively large electromagnetic fields to be applied at high duty cycles; larger beam apertures, resulting in fewer losses due to wakefields; and for the fraction of radio frequency energy that is transmitted to the beam (as opposed to dissipated through the cavity walls) to be increased. Or, the cavities may be conventionally conducting (i.e. not superconducting), and may be formed from, for example, copper. Other types of linear accelerators may be used. For example, laser wakefield accelerators or inverse free electron laser accelerators.

The electron beam E passes through a bunch compressor 23, disposed between the linear accelerator 22 and the undulator 24. The bunch compressor 23 is configured to bunch electrons in the electron beam E and spatially compress existing bunches of electrons in the electron beam E. One type of bunch compressor 23 comprises a radiation field directed transverse to the electron beam E. An electron in the electron beam E interacts with the radiation and bunches with other electrons nearby. Another type of bunch compressor 23 comprises a magnetic chicane, wherein the length of a path followed by an electron as it passes through the chicane is dependent upon its energy. This type of bunch compressor may be used to compress a bunch of electrons which have been accelerated in a linear accelerator 22 by a plurality of conductors whose potentials oscillate at, for example, radio frequencies.

The electron beam E then passes through the undulator 24. Generally, the undulator 24 comprises a plurality of modules. Each module comprises a periodic magnet structure, which is operable to produce a periodic magnetic field and is arranged so as to guide the relativistic electron beam E produced by the injector 21 and linear accelerator 22 along a periodic path within that module. As a result, within each undulator module, the electrons radiate electromagnetic radiation generally in the direction of a central axis of their periodic path through that module. The undulator 24 may further comprise a mechanism to refocus the electron beam E, such as a quadrupole magnet in between one or more pairs of adjacent sections. The mechanism to refocus the electron beam E may reduce the size of the electron bunches, which may improve the coupling between the electrons and the radiation within the undulator 24, increasing the stimulation of emission of radiation.

As electrons move through each undulator module, they interact with the electric field of the radiation, exchanging energy with the radiation. In general the amount of energy exchanged between the electrons and the radiation will oscillate rapidly unless conditions are close to a resonance condition, given by:

$$\lambda_{em} = \frac{\lambda_u}{2\gamma^2}\left(1 + \frac{K^2}{A}\right), \quad (1)$$

where $\lambda_{em}$ is the wavelength of the radiation, $\lambda_u$ is the undulator period for the undulator module that the electrons are propagating through, $\gamma$ is the Lorentz factor of the electrons and K is the undulator parameter. A is dependent upon the geometry of the undulator 24: for a helical undulator that produces circularly polarized radiation A=1, for a planar undulator A=2, and for a helical undulator which produces elliptically polarized radiation (that is neither circularly polarized nor linearly polarized) 1<A<2. In practice, each bunch of electrons will have a spread of energies although this spread may be minimized as far as possible (by producing an electron beam E with low emittance). The undulator parameter K is typically approximately 1 and is given by:

$$K = \frac{q\lambda_u B_0}{2\pi mc}, \quad (2)$$

where q and m are, respectively, the electric charge and mass of the electrons, $B_0$ is the amplitude of the periodic magnetic field, and c is the speed of light.

The resonant wavelength $\lambda_{em}$ is equal to the first harmonic wavelength spontaneously radiated by electrons moving through each undulator module. The free electron laser FEL may operate in self-amplified spontaneous emission (SASE) mode. Operation in SASE mode may require a low energy spread of the electron bunches in the electron beam E before it enters each undulator module. Alternatively, the free electron laser FEL may comprise a seed radiation source, which may be amplified by stimulated emission within the undulator 24. The free electron laser FEL may operate as a recirculating amplifier free electron laser (RAFEL), wherein a portion of the radiation generated by the free electron laser FEL is used to seed further generation of radiation.

Electrons moving through the undulator 24 may cause the amplitude of radiation to increase, i.e. the free electron laser FEL may have a non-zero gain. Maximum gain may be achieved when the resonance condition is met or when conditions are close to but slightly off resonance.

A region around a central axis of each undulator module may be considered to be a "good field region". The good field region may be a volume around the central axis wherein, for a given position along the central axis of the undulator module, the magnitude and direction of the magnetic field within the volume are substantially constant. An electron bunch propagating within the good field region may satisfy the resonant condition of Eq. (1) and will therefore amplify radiation. Further, an electron beam E propagating within the good field region should not experience significant unexpected disruption due to uncompensated magnetic fields.

Each undulator module may have a range of acceptable initial trajectories. Electrons entering an undulator module with an initial trajectory within this range of acceptable initial trajectories may satisfy the resonant condition of Eq. (1) and interact with radiation in that undulator module to stimulate emission of coherent radiation. In contrast, electrons entering an undulator module with other trajectories may not stimulate significant emission of coherent radiation.

For example, generally, for helical undulator modules the electron beam E should be substantially aligned with a central axis of the undulator module. A tilt or angle between the electron beam E and the central axis of the undulator module should generally not exceed $1/10\rho$, where $\rho$ is the Pierce parameter. Otherwise the conversion efficiency of the undulator module (i.e. the portion of the energy of the electron beam E which is converted to radiation in that module) may drop below a desired amount (or may drop almost to zero). In an embodiment, the Pierce parameter of an EUV helical undulator module may be of the order of 0.001, indicating that the tilt of the electron beam E with respect to the central axis of the undulator module should be less than 100 μrad.

For a planar undulator module, a greater range of initial trajectories may be acceptable. Provided the electron beam E remains substantially perpendicular to the magnetic field of a planar undulator module and remains within the good field region of the planar undulator module, coherent emission of radiation may be stimulated.

As electrons of the electron beam E move through a drift space between each undulator module, the electrons do not follow a periodic path. Therefore, in this drift space, although the electrons overlap spatially with the radiation, they do not exchange any significant energy with the radiation and are therefore effectively decoupled from the radiation.

The bunched electron beam E has a finite emittance and will therefore increase in diameter unless refocused. Therefore, the undulator 24 further comprises a mechanism for refocusing the electron beam E in between one or more pairs of adjacent modules. For example, a quadrupole magnet may be provided between each pair of adjacent modules. The quadrupole magnets reduce the size of the electron bunches and keep the electron beam E within the good field region of the undulator 24. This improves the coupling between the electrons and the radiation within the next undulator module, increasing the stimulation of emission of radiation.

An electron which meets the resonance condition as it enters the undulator 24 will lose (or gain) energy as it emits (or absorbs) radiation, so that the resonance condition is no longer satisfied. Therefore, in some embodiments the undulator 24 may be tapered. That is, the amplitude of the periodic magnetic field and/or the undulator period $\lambda_u$ may vary along the length of the undulator 24 in order to keep bunches of electrons at or close to resonance as they are guided though the undulator 24. The tapering may be achieved by varying the amplitude of the periodic magnetic field and/or the undulator period $\lambda_u$ within each undulator module and/or from module to module. Additionally or alternatively tapering may be achieved by varying the helicity of the undulator 24 (thereby varying the parameter A) within each undulator module and/or from module to module.

After leaving the undulator 24, the electron beam E is absorbed by a dump 100. The dump 100 may comprise a sufficient quantity of material to absorb the electron beam E. The material may have a threshold energy for induction of radioactivity. Electrons entering the dump 100 with an energy below the threshold energy may produce only gamma ray showers but will not induce any significant level of radioactivity. The material may have a high threshold energy for induction of radioactivity by electron impact. For example, the beam dump may comprise aluminium (Al), which has a threshold energy of around 17 MeV. It is desirable to reduce the energy of electrons in the electron beam E before they enter the dump 100. This removes, or at least reduces, the need to remove and dispose of radioactive waste from the dump 100. This is advantageous since the removal of radioactive waste requires the free electron laser FEL to be shut down periodically and the disposal of radioactive waste can be costly and can have serious environmental implications.

The energy of electrons in the electron beam E may be reduced before they enter the dump 100 by directing the electron beam E through a decelerator 26 disposed between the undulator 24 and the beam dump 100.

In an embodiment the electron beam E which exits the undulator 24 may be decelerated by passing the electrons back through the linear accelerator 22 with a phase difference of 180 degrees relative to radio frequency (RF) fields in the linear accelerator 22. The RF fields in the linear accelerator therefore serve to decelerate the electrons which are output from the undulator 24. As the electrons decelerate in the linear accelerator 22 some of their energy is transferred to the RF fields in the linear accelerator 22. Energy from the decelerating electrons is therefore recovered by the linear accelerator 22 and may be used to accelerate the electron beam E output from the injector 21. Such an arrangement is known as an energy recovering linear accelerator (ERL).

Figure 4:
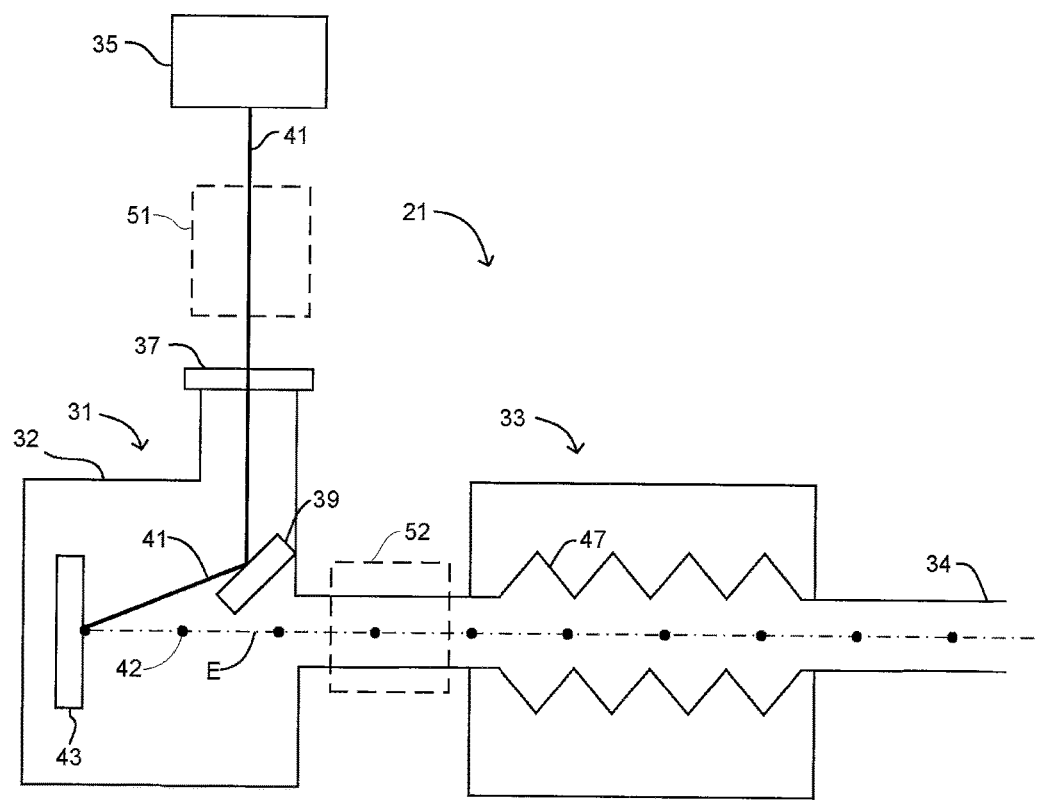
FIG. 4 is a schematic illustration of an injector which may form part of the free electron laser of FIG. 3.

FIG. 4 is a schematic depiction of an embodiment of the injector 21. The injector 21 comprises an electron gun 31 and an electron booster 33. The electron gun 31 is arranged to support a photocathode 43 inside a vacuum chamber 32. The electron gun 31 is further arranged to receive a beam of radiation 41 from a radiation source 35. The radiation source 35 may, for example, comprise a laser 35 which emits a laser beam 41. The laser beam 41 is directed into the vacuum chamber 32 through a window 37 and is incident on the photocathode 43. In the embodiment shown in FIG. 4, the laser beam 41 is reflected by a mirror 39 such that it is incident on the photocathode 43.

The photocathode 43 is held at a high voltage. For example, the photocathode 43 may be held at a voltage of approximately several hundred kilovolts. The photocathode 43 may be held at a high voltage by using a voltage source which may form part of the electron gun 32 or may be separate from the electron gun 32. Photons in the laser beam 41 are absorbed by the photocathode 43 and excite electrons in the photocathode 43. Some electrons in the photocathode 43 are excited to a high enough energy state that they are emitted from the photocathode 43. The high voltage of the photocathode 43 is negative and thus serves to accelerate electrons which are emitted from the photocathode 43 away from the photocathode 43, thereby forming a beam of electrons E.

The laser beam 41 is a pulsed laser beam. Electrons are emitted from the photocathode 43 in bunches which correspond to the pulses of the laser beam 41. The electron beam E therefore comprises a series of electron bunches 42. The laser 35 may, for example, be a picosecond laser and thus pulses in the laser beam 41 may have a duration of approximately a few picoseconds. The voltage of the photocathode 43 may be a DC voltage or an AC voltage. In embodiments in which the voltage of the photocathode 43 is an AC voltage the frequency and phase of the photocathode voltage may be matched with pulses of the laser beam 41 such that pulses of the laser beam 41 coincide with peaks in the voltage of the photocathode 43. Pulses of the laser beam 41 may be matched with accelerating fields in the electron booster 33 and the linear accelerator 22 such that electron bunches 42 arrive at the electron booster 33 and the linear accelerator 22 at a time at which the accelerating fields act to accelerate the electron bunches 42.

The electron beam E which is emitted from the photocathode 43 is accelerated by the electron booster 33. The electron booster 33 serves to accelerate the electron bunches along a beam passage 34 and towards the linear accelerator 22 (not shown in FIG. 4) which further accelerates the electron bunches to relativistic speeds (as was described above). The electron booster 33 may, for example, accelerate electron bunches 42 to energies in excess of approximately 5 MeV. In some embodiments the electron booster 33 may accelerate electron bunches 42 to energies in excess of approximately 10 MeV. In some embodiments the electron booster 33 may accelerate electron bunches 42 to energies of up to approximately 20 MeV.

The electron booster 33 may be similar to the linear accelerator 22 and may, for example, comprise a plurality of radio frequency cavities 47 (depicted in FIG. 4) and one or more radio frequency power sources (not shown). The radio frequency power sources may be operable to control electromagnetic fields in the beam passage 34. As bunches of electrons 42 pass between the cavities 47, the electromagnetic fields controlled by the radio frequency power sources cause each bunch of electrons to accelerate. The cavities 47 may be superconducting radio frequency cavities. Alternatively, the cavities 47 may be conventionally conducting (i.e. not superconducting), and may be formed from, for example, copper.

As was described above each pulse of the laser beam 41 which is incident on the photocathode 43 causes a corresponding electron bunch 42 to be emitted from the photocathode 43. Each electron bunch 42 in the electron beam E is accelerated by the electron booster 33 and by the linear accelerator 22. The accelerated electron bunches 42 pass into the undulator 24 where they stimulate emission of radiation to form a radiation beam B. The radiation beam B is a pulsed radiation beam with each electron bunch 42 in the undulator 24 causing emission of a pulse of radiation in the radiation beam B. For each pulse in the laser beam 41 there is therefore a corresponding electron bunch 42 in the electron beam E and a corresponding pulse in the radiation beam B which is emitted from the free electron laser FEL.

The free electron laser FEL may form part of the lithographic system LS of FIG. 1, wherein radiation produced by the free electron laser is ultimately received by one or more substrates W within one or more lithographic apparatus $LA_a$-$LA_n$. These substrates W may be considered to comprise target portions which are arranged to receive patterned radiation. Within the lithographic system LS, radiation is transported from the free electron laser FEL to the substrates via: (i) a beam delivery system (for example comprising beam expanding optics 20 and the beam splitting apparatus 19); and (ii) optics within the lithographic apparatuses $LA_a$-$LA_n$ (for example optics 10, 11, 13, 14). The beam delivery system and the optics within a lithographic apparatus may be referred to as an optical path which is configured to transport radiation from the free electron laser FEL to a substrate W. The optical path reflects and/or transmits radiation so as to provide a dose of radiation at the substrate W. The fraction of the radiation beam B which propagates through the optical path and which is incident on a substrate W may be referred to as the transmittance of the optical path. It will be appreciated that an optical path may include reflective and/or transmissive elements and the transmittance of the optical path depends on the reflectivity of any reflective elements in the optical path as well as the transmittance of any transmissive elements in the optical path. The transmittance of the optical path may additionally depend on a matching of the cross-section of the radiation beam B with optical elements on which the radiation beam is incident in the optical path. For example, an optical element (e.g. a mirror) in the optical path may have a smaller cross-section than the cross-section of the radiation beam B which is incident of the optical element. Portions of the cross-section of the radiation beam B which lie outside of the cross-section of the optical element may therefore be lost from the radiation beam (e.g. by not being reflected by a mirror) and may therefore reduce the transmittance of the optical path.

It may desirable to control the dose of radiation which is received by target locations on substrates W in the lithographic apparatus $LA_a$-$LA_n$ of the lithographic system LS. In particular it may be desirable to control the dose of radiation such that each target location of a given target portion on a substrate receives substantially the same dose of radiation.

As was described above with reference to FIG. 2 a dose of radiation which is received by a target location of a substrate W depends on the power of the radiation beam to which the target location is exposed (e.g. patterned radiation beam $B_a'$) and the amount of time for which the target location of the substrate W is exposed to the radiation beam. The power of a patterned radiation beam $B_a'$ in a lithographic apparatus $LA_a$ depends on the power of the radiation beam B which is emitted by the free electron laser FEL and the transmittance of the optical path between the free electron laser FEL and the substrate W. A dose of radiation which is received at a target location of a substrate may therefore be controlled by controlling the power of the radiation beam B which is emitted from the free electron laser FEL and/or by controlling the transmittance of the optical path between the free electron laser FEL and the substrate W. The power of the radiation beam B emitted from the free electron laser FEL may be controlled using a feedback-based control loop (as described above in relation to FIG. 1).

The power of the radiation beam B which is emitted from the free electron laser FEL may, for example, be controlled by controlling one or more properties of the free electron laser FEL (e.g. using feedback from a sensor which measures radiation beam power). For example, the conversion efficiency (with which power in the electron beam E is converted to power in the radiation beam B) of the undulator, the energy of the electron beam E and/or another property of the free electron laser FEL may be controlled. However many of the properties of a free electron laser FEL and the radiation beam B which is emitted by the free electron laser FEL may be interlinked and thus changing one property may cause an undesirable change in another property. For example, a change in the conversion efficiency of the undulator and/or in the energy of the electron beam E may result in changes in the wavelength, the bandwidth and/or the spatial intensity distribution of the radiation beam B. The transmittance of the optical path between the free electron laser FEL and a substrate W may be strongly dependent on properties of the radiation beam B such as the wavelength, bandwidth and/or spatial intensity distribution of the radiation beam B. Changes in properties of the radiation beam B (e.g. wavelength, bandwidth, spatial intensity distribution) may therefore disadvantageously result in unwanted changes in the dose of radiation which is received at a substrate W.

The dose of radiation which is received at a target location on the substrate may alternatively be controlled without affecting other properties of the radiation beam B (e.g. wavelength, bandwidth, spatial intensity distribution) by controlling the amount of time for which the that location on the substrate W is exposed to radiation.

In an embodiment, the lithographic apparatus may be configured such that a target portion of a substrate W is exposed by scanning the substrate relative to band of radiation which extends across the target portion transverse to the scanning direction. The band of radiation may be referred to as an exposure slit. The dose of radiation received at a target location on the substrate W depends on an exposure time period during which a radiation beam (e.g. patterned radiation beam $B_a'$) is directed onto that target location, and the number and duration of pulses which occur in the radiation beam during the exposure time period. For example, in a scanning lithographic apparatus, the amount of time for which a target location of the substrate W is exposed to a radiation beam depends on the time taken for the exposure slit to travel over that location. The dose of radiation which is received at the target location depends upon the number of pulses of the radiation beam which occur during that exposure time period and the average energy which is delivered to the target location with each pulse. In an embodiment, a wafer may be scanned relative to the exposure slit such that the exposure time period is approximately 1 ms. In other embodiments the exposure time period may be greater than 1 ms and may, for example, be as long as 5 ms (e.g. due to slower scanning movement of the wafer relative to the exposure slit).

In some embodiments the dose of radiation which is received at a target location on a substrate W may be controlled by controlling the number of pulses of radiation which are incident on the target location during an exposure time period of that location. Since a radiation beam (e.g. patterned radiation beam $B_a'$) which is incident on a substrate W originates from the radiation beam B which is emitted from the free electron laser FEL, the number of pulses of the radiation beam which is incident on the substrate W during an exposure time period depends on the number pulses of the radiation beam B during the exposure time period. As was described above, the pulses in the radiation beam B correspond to pulses of the laser beam 41 which are incident on the photocathode 43 and correspond to electron bunches 42 which are emitted from the photocathode 43 and which stimulate emission of radiation in the undulator 24. The number of pulses of radiation which are incident on a target location of a substrate W during an exposure time period may therefore be controlled by controlling the number of pulses in the laser beam 41 which is incident on the photocathode 43 and/or the number of electron bunches 42 which propagate through the undulator 24, during the exposure time period.

Controlling the number of pulses of radiation which are incident upon a target location of a substrate W may be considered to be equivalent to controlling the power of radiation incident upon the target location of the substrate. This may, at least in part, be achieved by controlling the power of the radiation beam B output from the free electron laser. The power of the radiation beam output from the free electron laser may be controlled by controlling the number of pulses in the radiation beam output from the free electron laser.

A first control apparatus 51, which is depicted in FIG. 4, may be used to control the number of pulses of the laser beam 41 which are incident on the photocathode 43 during an exposure time period and therefore control the number of electron bunches 42 which form the electron beam E during the exposure time period. Also depicted in FIG. 4 is a second control apparatus 52 which may be used to control the number of electron bunches 42 which are output from the injector 21 during an exposure time period. The first and/or second control apparatus 51, 52 may use feedback from a sensor apparatus ST (see FIG. 1) which measures the power of the EUV radiation beam output from the free electron laser (thus providing a feedback-based control loop). This controls the power of the radiation beam output from the free electron laser.

The first control apparatus 51 and/or the second control apparatus 52 may be used to control the number of electron bunches 42 which propagate through the undulator 24 during an exposure time period and therefore the number of pulse of the radiation beam B which are stimulated during the exposure time period and the number of pulses of radiation which are received at a substrate W during the exposure time period. The first control apparatus 51 and/or the second control apparatus 52 may therefore be used to control a dose of radiation which is received by a target location of a substrate W during an exposure time period. Advantageously, controlling the dose of radiation by controlling the number of pulses of the radiation beam B which occur during an exposure time period has little or no effect on other properties of the radiation beam B such as the wavelength, bandwidth or spatial intensity distribution of the radiation beam B. Controlling the dose of radiation by controlling the number of pulses of the radiation beam B which occur during an exposure time period is additionally advantageous because it allows the dose to be adjusted quickly, for example, as part of a feedback-based control loop which responds to one or more measurements of the radiation beam power. The feedback-based control loop may for example operate at a frequency of 10 kHz or more.

In some embodiments a dose of radiation which is received by a target location of a substrate W may be controlled by substantially preventing one or more pulses in the laser beam 41 from being incident on the photocathode 43. The one or more pulses in the laser beam 41 may be substantially prevented from being incident on the photocathode 43 by the first control apparatus 51.

Figure 5:
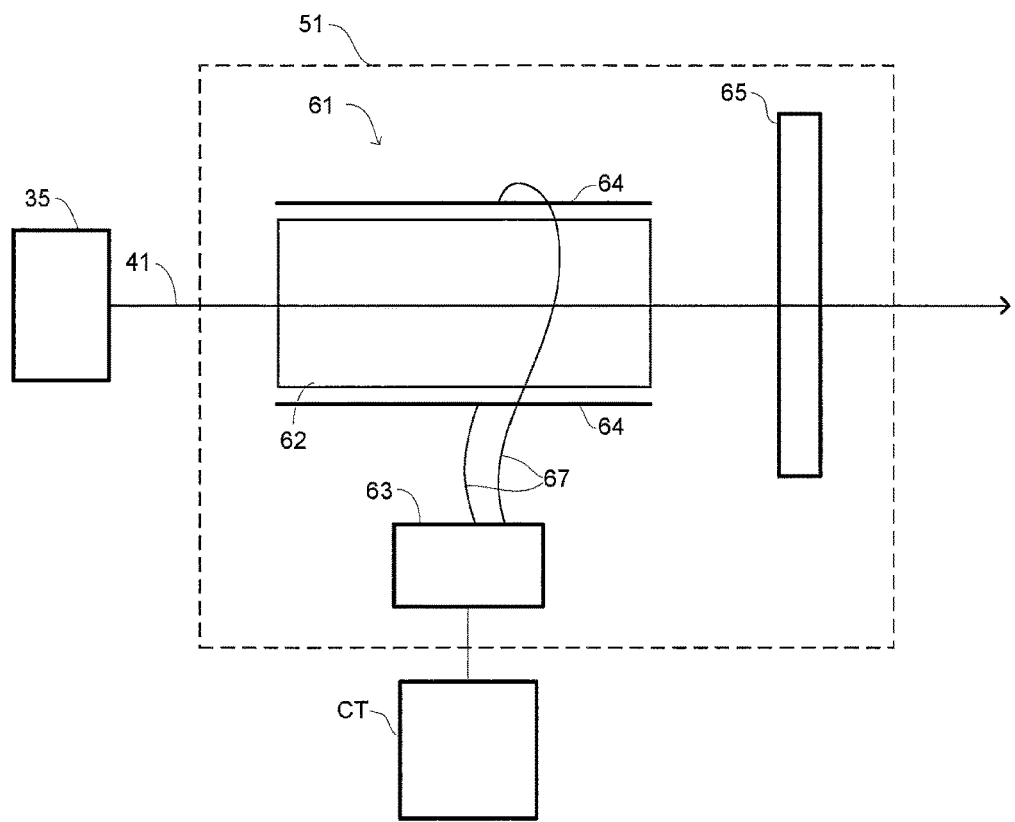
FIG. 5 is a schematic illustration of a first control apparatus which may form part of the injector of FIG. 4.

FIG. 5 is a schematic depiction of an embodiment of the first control apparatus 51 which comprises a Pockels cell 61, a voltage source 63 and a polarizer 65. The first control apparatus 51 receives the laser beam 41 from the laser 35 such that the laser beam 41 is incident on the Pockels cell 61. The Pockels cell 61 comprises an electro-optic crystal 62 and a pair of electrodes 64. The electrodes 64 are electrically coupled to the voltage source 63 by wires 67 such that the voltage source 63 is operable to generate a potential difference between the electrodes 64 and create an applied electric field in the electro-optic crystal 62. The refractive index of the electro-optic crystal 62 is modified in proportion to the applied electric field such that the potential difference between the electrodes 64 may be controlled in order to bring about a desired rotation of the polarization state of the laser beam 41 as it propagates through the electro-optic crystal 62.

The polarizer 65 is configured to only transmit radiation having a given polarization state. The voltage source 63 may be operated so as to control the polarization state of the laser beam 41 which is incident on the polarizer 65 and therefore control the amount of radiation from the laser beam 41 which is transmitted though the polarizer 65. The laser beam 41 which is incident on the Pockels cell 61 is linearly polarized. The polarizer 65 may, for example, be configured to only transmit radiation having the polarization state of the laser beam 41 before the laser beam 41 is incident on the Pockels cell 61. During normal operation the voltage source 63 may not generate a potential difference between the electrodes 64 such that the polarization state of the laser beam 41 is unchanged as it propagates through the electro-optic crystal 62 and thus substantially all of the laser beam 41 is transmitted by the polarizer 65. Radiation which is transmitted by the polarizer 65 propagates out of the first control apparatus 51 and is directed to be incident on the photocathode 43 (as is shown in FIG. 4).

At times it may be desirable to prevent a pulse of the laser beam 41 from being incident on the photocathode 43 or to reduce the energy of a pulse of the laser beam 41 which is incident on the photocathode 43. For example, it may be desirable to reduce the energy of a pulse of the laser beam 41 which is incident on the photocathode 43 such that the pulse has an energy of approximately 10% or less of a regular pulse of the laser beam 41 which is incident on the photocathode 43. The voltage source 63 is operable to generate a potential difference between the electrodes 64 which causes the polarization state of the laser beam 41 to be rotated by around 90° as it propagates through the electro-optic crystal 62. The laser beam 41 may therefore be substantially blocked by the polarizer 65 and thus substantially no radiation from the laser beam 41 is incident on the photocathode 43.

The voltage source 63 is operable to switch the Pockels cell 61 between a first mode of operation during which no potential difference is generated between the electrodes 64 and a second mode of operation during which a potential difference is generated between the electrodes 64. During the first mode of operation pulses of the laser beam 41 are transmitted by the polarizer 65, are incident on the photocathode 43 and cause emission of electron bunches 42 from the photocathode 43. During the second mode of operation the polarization state of pulses of the laser beam 41 is rotated such that they are not transmitted by the polarizer 65. Thus, the pulses of the laser beam 41 are not incident on the photocathode 43 and no corresponding electron bunches 42 are emitted from the photocathode 43. Preventing one or more pulses of the laser beam 41 from being incident on the photocathode 43 by switching the Pockels cell 61 to the second mode of operation means that no electron bunches 42 corresponding to the blocked pulses of the laser beam 41 are emitted from the photocathode 43. The electron beam E is therefore interrupted so that one or more pulses of the laser beam 41 have no associated electron bunch 42 in the electron beam E. An interruption of the electron beam E causes an interruption of the electron bunches 42 which propagate through the undulator 24 and thus causes an interruption of the stimulation of emission of radiation pulses in the undulator 24. The pulses of the radiation beam B which are emitted from the free electron laser FEL are therefore interrupted.

It will be appreciated that interrupting the pulses of the radiation beam B which are emitted from the free electron laser FEL will cause an interruption of pulses of radiation which are incident on a target location of a substrate W, thereby reducing the dose of radiation which is incident at the target location during an exposure time period of the target location (e.g. the time during which an exposure slit is scanned over that location). The voltage source 63 of the first control apparatus 51 may be controlled in order to control the number of pulses of radiation which are incident on a target location of a substrate W during an exposure time period in order to control the dose of radiation which is received by that location. The voltage source 63 may, for example, be controlled by a controller CT (which may correspond with the controller CT shown in FIG. 1).

In an ideal application the laser beam 41 is perfectly linearly polarized and the polarizer 65 is configured to transmit radiation having the polarization state of the laser beam 41 which is incident on the Pockels cell 61. In such an ideal application when the Pockels cell 61 is in the second mode of operation the polarization state of the laser beam 41 is rotated by 90° and no radiation from the laser beam 41 will be transmitted by the polarizer 65 and no pulse of the laser beam 41 will be incident on the photocathode 43. However, in practice the laser beam 41 may be slightly depolarized and may include a small component which has a perpendicular polarization state to the polarization state which is transmitted by the polarizer 65. When the Pockels cell 61 is in the second mode of operation the polarization state of the perpendicularly polarized component may be rotated by 90° such that it is transmitted by the polarizer 65. A small amount of radiation from the laser beam 41 may therefore be transmitted by the polarizer 65 and may be incident on the photocathode 43 even when the Pockels cell 61 is in the second mode of operation. For example, a low power pulse of the laser beam 41 may be incident on the photocathode 43 when the Pockels cell 61 is in the second mode of operation. The low power pulse may have a power which is approximately 10% or less of the power of a pulse of the laser beam 41 which is incident on the photocathode 43 when the Pockels cell is in the first mode of operation.

A low power pulse of the laser beam 41 which is incident on the photocathode 43 may cause a low charge electron bunch to be emitted from the photocathode 43. The low charge electron bunch may have a peak current which is approximately 10% or less of the peak current of a nominal electron bunch 42 which is emitted from the photocathode 43 when the Pockels cell is in the first mode of operation. A nominal electron bunch emitted in the first mode of operation may be referred to as a typical electron bunch 42.

In the undulator 24 the power of a pulse of the radiation beam B which is stimulated by a given electron bunch 42 is a function of the charge of the electron bunch 42 and the gain of radiation which is caused by the electron bunch 42 in the undulator 24. The gain which is caused by an electron bunch 42 in the undulator 24 is represented by a so-called gain length of the electron bunch 42. The gain length of an electron bunch 42 is representative of the length of an undulator section through which the electron bunch 42 must propagate in order to cause a given gain of radiation in the undulator 24. A typical electron bunch 42 which is emitted from the photocathode 43 when the Pockels cell 61 is in the first mode of operation may propagate for approximately 15-25 gain lengths in the undulator 24. The gain length of an electron bunch is proportional to one over the cubed root of the peak current of the electron bunch. A low charge electron bunch which has a peak current of approximately 10% of the peak current of a typical electron bunch 42 will therefore have a gain length which is approximately 2-3 times larger than the gain length of the typical electron bunch 42. For an undulator 24 of a given length the gain of a low current electron bunch will therefore be approximately 2-3 times less than the gain of a typical electron bunch 42.

A low charge electron bunch which is emitted from the photocathode 43 when the Pockels cell 61 is in the second mode of operation may have a charge which is approximately 10% of the charge of a typical electron bunch 42 and may cause a gain of radiation in the undulator 24 which is approximately 2-3 times less than the gain caused by a typical electron bunch. A pulse in the radiation beam B which is stimulated by a low current electron bunch may therefore have an energy which is less than about 0.1% of the energy of a pulse in the radiation beam B which is stimulated a typical electron bunch 42. Additionally, a pulse in the radiation beam B which is stimulated by a low current electron bunch may have a larger divergence (e.g. a divergence which is approximately 10 times larger) than the divergence of a pulse in the radiation beam B which is stimulated by a typical electron bunch 42. The combination of these factors means that a dose of radiation which is received at a target portion of a substrate W due to a pulse in the radiation beam B which is stimulated by a low current electron bunch is negligible when compared to the dose of radiation which is received due to a pulse in the radiation beam B which is stimulated by a typical current electron bunch 42. A low current electron bunch in the electron beam E may therefore be considered to have a negligible effect in the free electron laser FEL. The first control apparatus 51 may therefore be considered to interrupt the electron beam E so as to cause at least one pulse of the laser beam 41 to have substantially no associated electron bunch 42 in the electron beam E which is output from the injector 21 and substantially no associated pulse in the radiation beam B.

In some embodiments the power of a low power pulse of the laser beam 41 and the peak current of a low charge electron bunch may be reduced by positioning a second polarizer in the path of the laser beam 41 before the laser beam is incident on the Pockels cell 61. The second polarizer may be configured to only transmit radiation having the same polarization state as the radiation which is transmitted by the polarizer 65 and may act to reduce any depolarization of the laser beam 41 which is incident on the Pockels cell 61.

Whilst the polarizer 65 is configured to only transmit radiation having a given polarization state the polarizer 65 may also transmit some radiation with other polarization states. For example, approximately 1-0.1% of radiation with other polarization states may be transmitted by the polarizer 65. This radiation may be referred to as radiation which is leaked by the polarizer 65. When the Pockels cell 61 is in the second mode of operation such that the majority of the laser beam 41 is blocked by the polarizer 65 some radiation from the laser beam 41 may therefore still be leaked by the polarizer 65 such that some radiation from the laser beam 41 is still incident on the photocathode 43.

In some embodiments a frequency doubling crystal may be positioned in the path of the laser beam 41 which acts to double the frequency (and halve the wavelength) of the laser beam 41. For example, the laser 35 may be an Nd:YAG laser which emits a laser beam 41 having a wavelength which is approximately 1064 nm. After passing through the frequency doubling crystal the laser beam 41 may therefore have a wavelength which is approximately 532 nm.

Typically a frequency doubling crystal only acts to double the frequency of radiation which has a given polarization state. The frequency doubling crystal may, for example, be positioned in the optical path of the laser beam 41 after the laser beam 41 has been transmitted by the polarizer 65. The frequency doubling crystal may be configured to double the frequency of radiation which has the polarization state which the polarizer 65 is configured to transmit. In the event that the polarizer 65 transmits some radiation having a different polarization state (e.g. when the Pockels cell 61 is in the second mode of operation) the frequency doubling crystal will not therefore double the frequency of this leaked radiation since it does not have the polarization state needed for frequency doubling to occur. The frequency doubling crystal may therefore act as an additional polarizer and may prevent the leaked radiation from being incident on the photocathode 43.

Additionally, a frequency doubling crystal may act to increase the contrast between the power of a low power pulse of the laser beam 41 which is transmitted by the polarizer 65 when the Pockels cell 61 is in the second mode of operation, and a higher power pulse of the laser beam 41 which is transmitted by the polarizer 65 when the Pockels cell 61 is in the first mode of operation. The conversion efficiency with which a frequency doubling crystal converts a pulse of the laser beam 41 to a pulse having double the frequency is proportional to the power of the pulse of the laser beam 41. A low power pulse will therefore be converted with a lower conversion efficiency than a higher power pulse and thus the contrast between a low power pulse and a higher power pulse will be increased by the frequency doubling crystal.

Advantageously, using a Pockels cell 61 allows fast switching between blocking pulses of the laser beam 41 and allowing pulses of the laser beam 41 to be incident on the photocathode 43. It may be desirable for the voltage source 63 to be operable to switch the Pockels cell 61 between the first mode of operation and the second mode of operation fast enough such that only a single pulse of the laser beam 41 is prevented from being incident on the photocathode 43. For example, it may be desirable for the voltage source to switch the Pockels cell 61 to the second mode of operation for a time period in which one pulse of the laser beam 41 propagates through the Pockels cell 61 such that the pulse of the laser beam 41 is blocked by the polarizer 65 and then switch the Pockels cell 61 to the first mode of operation before a subsequent pulse of the laser beam 41 propagates through the Pockels cell 61 such that the subsequent pulse of the laser beam 41 is transmitted by the polarizer 65. Such fast switching of the Pockels cell 61 allows for control over each individual pulse of the laser beam 41.

The pulse repetition frequency of the laser beam 41 may be greater than 100 MHz. For example, the pulse repetition frequency of the laser beam 41 may be approximately 300 MHz. The spacing between consecutive pulses of the laser beam 41 as they propagate through the Pockels cell 61 may be approximately 70 cm. The length of the electro-optic crystal 62 may be approximately 100 mm and thus only a single pulse of the laser beam 41 propagates through the electro-optic crystal 62 at any one time. This allows the Pockels cell 61 to be switched between different modes of operation for each pulse of the laser beam 41.

The potential difference which is generated between the electrodes 64 in the second mode of operation (in order to bring about a rotation of the polarization state of the laser beam 41 of around 90°) may be approximately 100 V. The amount of time which it takes to generate a desired potential difference (e.g. 100 V) between the electrodes 64 is proportional to the capacitance of the Pockels cell 61 and the impedance of the cables 67 which connect voltage source 63 to the electrodes 64. The capacitance of the Pockels cell 61 is a function of the surface area of the electrodes, the separation between the electrodes and of the relative permittivity of the electro-optic crystal 62.

In an embodiment the relative permittivity of the electro-optic crystal 62 may lie in an approximate range of about 20-50. The surface area of each electrode 64 may be approximately 500 mm$^2$ and the separation between the electrodes 64 may be approximately 5 mm. The corresponding capacitance of the Pockels cell may be approximately 50 pF. The impedance of the cables 67 may be approximately 50 Ohms. In such an embodiment the amount of time which it takes to generate a desired potential difference of 100V between the electrodes 64 may be approximately 2.5 nanoseconds. Such a time period may be comparable to the delay between consecutive pulses of the laser beam 41 arriving at the Pockels cell 61 and thus such a time period may be too long to be able to switch the Pockels cell between the first and second modes of operation between consecutive pulses.

The amount of time which it takes to generate a desired potential difference (e.g. 100V) between electrodes 64 may be reduced by providing the Pockels cell with a plurality of pairs of electrodes 64 each connected to an independent voltage source 63. For example, in some embodiments a Pockels cell may be provided with 5 or more pairs of electrodes 64. In some embodiments a Pockels cell may be provided with up to about 10 pairs of electrodes 64. Each of the plurality of pairs of electrodes 64 may have a reduced surface area and thus the capacitance between each of the plurality of electrodes 64 may be reduced. In an embodiment in which a given surface area is split evenly amongst a plurality of pairs of electrodes 64 then the capacitance between each pair of electrodes 64 is reduced by a factor which is equal to the number of pairs of electrodes 64, when compared to an embodiment in which a single pair of electrodes 64 covers the given surface area. For example, in an embodiment in which 5 pairs of electrodes are provided to cover a given surface area the capacitance between each pair of electrodes is approximately 5 times less than the capacitance between a pair of electrodes 64 in an embodiment in which a single pair of electrodes covers the same surface area.

A reduction in the capacitance between each pair of electrodes 64 reduces the amount of time which it takes to generate a desired potential difference between each pair of electrodes 64. Each pair of electrodes 64 may be provided with an independent voltage source 63. The independent voltage sources 63 may operate synchronously to each other such that the potential difference between each pair of electrodes 64 may be substantially the same as each other. A plurality of voltage sources 63 may, for example, be synchronized to within less than about 1 picosecond of each other.

A Pockels cell 61 comprising a plurality of pairs of electrodes 64 may be switched between a first mode of operation in which no potential difference is generated between the pairs of electrodes 64 and a second mode of operation in which a desired potential difference is synchronously generated between each of the pairs of electrodes 64. Providing a Pockels cell 61 with a plurality of pairs of electrodes 64 such that the capacitance between each pair of electrodes 64 is reduced, reduces the amount of time which it takes to switch the Pockels cell 61 between the first mode of operation and the second mode of operation. For example, a Pockels cell 61 comprising a plurality of pairs of electrodes 64 may be switched between the first mode of operation and the second mode of operation in a time period which is less than approximately 1 nanosecond. This may allow the Pockels cell to be switched between the first and second modes of operation between the arrival of subsequent pulses of the laser beam 41 at the Pockels cell 61 and may therefore allow the mode of operation of the Pockels cell 61 to be switched for each individual pulse of the laser beam 41.

In alternative embodiments the first control apparatus 51 may comprise a plurality of Pockels cells 61 through which the laser beam 41 propagates before being incident on the polarizer 65. Each of the plurality of Pockels cells 61 may, for example, have a reduced length when compared to an embodiment comprising a single Pockels cell 61. For example, the plurality of Pockels cells 61 may each have a length of approximately 10 mm. Each of the plurality of Pockels cells 61 may comprise one or more pairs of electrodes 64 each coupled to an independent voltage source 63. The voltage sources 63 are operable to switch the Pockels cells 61 between a first mode of operation in which no potential difference is generated between pairs of electrodes 64 and a second mode of operation in which a potential difference is generated between each pair of electrodes. The potential difference between each pair of electrodes 64 when the Pockels cells 61 are in the second mode of operation may be such that each Pockels cell rotates the polarization state of the laser beam 41 by an angle which is less than 90°. The plurality of Pockels cells 61 may be configured such that when each of the plurality of Pockels cells 61 is in the second mode of operation and the laser beam 41 propagates through each of the Pockels cells 61, the combined effect of the plurality of Pockels cells 61 is to rotate the polarization state of the laser beam by around 90° such that substantially none of the laser beam 41 is transmitted by the polarizer 65.

The potential difference which is generated between pairs of electrodes 64 in a Pockels cell 61 which is configured to rotate the polarization state of the laser beam 41 by less than 90° when in a second mode of operation may be less than a potential difference between a pair of electrodes 64 which is configured to rotate the polarization state of the laser beam 41 by 90° (e.g. the Pockels cell depicted in FIG. 5). In an embodiment in which a plurality of Pockels cells 61 which each rotate the polarization state of the laser beam 41 by less than 90°, smaller potential differences are therefore generated between pairs of electrodes 64 when switching between a first mode of operation and a second mode of operation than in an embodiment in which a single Pockels cell 61 rotates the polarization state of the laser beam 41 by 90°.

This may advantageously reduce the amount of time which it takes to switch a Pockels cell 61 between a first mode of operation and a second mode of operation. As was described above a reduction of the amount of time which it takes to switch a Pockels cell 61 between a first mode of operation and a second mode of operation may allow Pockels cells 61 to be switched between the first and second modes of operation between the arrival of subsequent pulses of the laser beam 41 at the Pockels cell 61 and may therefore allow the mode of operation of the Pockels cell 61 to be switched for each individual pulse of the laser beam 41.

In an alternative but equivalent embodiment of the first control apparatus 51, the polarizer 65 may be configured to only transmit radiation having a polarization state which is orthogonal to the polarization state of the laser beam 41 before the laser beam 41 is incident on the Pockels cell 61. In such an embodiment, the laser beam 41 will be blocked by the polarizer 65 during times at which the voltage source 63 does not apply a voltage between the electrodes 64. During times at which the voltage source 63 does apply a voltage between the electrodes 64, the Pockels cell 61 rotates the polarization state of the laser beam 41 such that the laser beam 41 is transmitted by the polarizer 65 and is incident on the photocathode 43.

Figure 6:
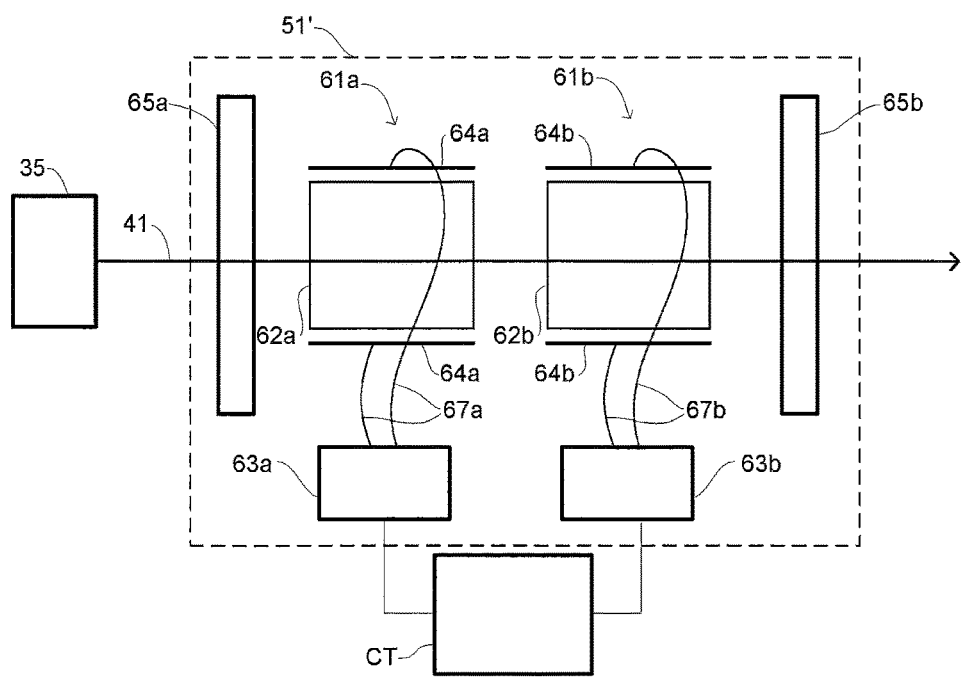
FIG. 6 is a schematic illustration of an alternative embodiment of a first control apparatus which may form part of the injector of FIG. 4.

FIG. 6 is a schematic depiction of an alternative embodiment of a first control apparatus 51'. The first control apparatus 51' which is depicted in FIG. 6 comprises a first polarizer 65a, a second polarizer 65b, a first Pockels cell 61a and a second Pockels cell 61b. The first and second Pockels cells 61a, 61b each comprise an electro-optic crystal 62a, 62b and a pair of electrodes 64a, 64b. The pairs of electrodes 64a, 64b are electrically coupled to voltage sources 63a, 63b by wires 67a, 67b as is shown in FIG. 6.

The first polarizer 65a is configured to transmit radiation having the polarization state of the laser beam 41 which is incident on the first polarizer 65a. The first polarizer 65a may serve to reduce any depolarization of the laser beam 41. The first and second Pockels cells 61a, 61b are each operable to switch between a first mode of operation in which no potential difference is generated between the respective pair of electrodes 64a, 64b and a second mode of operation in which a potential difference is generated between the respective pair of electrodes 64a, 64b such that the polarization state of the laser beam 41 is rotated by around 90° whilst propagating through the respective Pockels cell 61a, 61b. The first and second Pockels cells 61a, 61b may be independently switched between the first and second modes of operation by the independent voltage sources 63a, 63b.

The second polarizer 65b is configured to only transmit radiation which has a polarization state which is orthogonal to the polarization state of radiation which is transmitted by the first polarizer 65a. If both the first Pockels cell 61a and the second Pockels cell 61b are in the first mode of operation then the polarization state of the laser beam 41 will not be rotated by either of the Pockels cells 61a, 61b and the laser beam 41 will not be transmitted by the second polarizer 65b. If one (but not both) of the first or second Pockels cells 61a, 61b is in the second mode of operation then the polarization state of the laser beam 41 is rotated by around 90° between the first and second polarizers 65a, 65b and the laser beam 41 is transmitted by the second polarizer 65b. If both of the first Pockels cell 61a and the second Pockels cell 61b are in the second mode of operation then the polarization state of the laser beam 41 is rotated by 180° between the first and second polarizers 65a, 65b and the laser beam 41 is not transmitted by the second polarizer 65. Therefore in order for the laser beam 41 to be transmitted by the second polarizer 65, one (but not both) of the first or second Pockels cells 61a, 61b must be in the second mode of operation. The voltage sources 63a, 63b may be controlled by a controller CT (which may correspond with the controller CT shown in FIG. 1) in order to control how many pulses of the laser beam 41 are transmitted by the second polarizer 65b such that they are incident on the photocathode 43.

Figure 7:
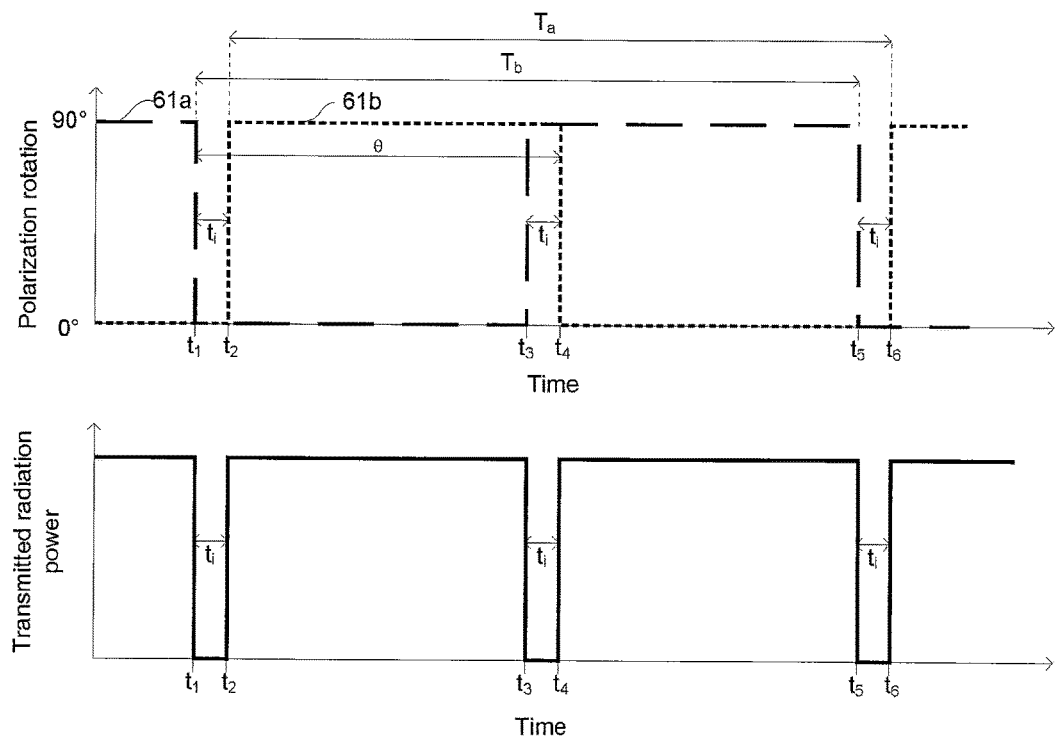
FIG. 7 is a schematic representation of a polarization rotation and a transmitted radiation power which may result from operation of the first control apparatus of FIG. 6.

FIG. 7 is a schematic representation of the rotation of the polarization state of the laser beam 41 (top panel of FIG. 7) which is caused by the first and second Pockels cells 61a, 61b over a period of time and the power of radiation which is transmitted by the second polarizer 65b (bottom panel of FIG. 7) over the same period of time. In the top panel of FIG. 7 the polarization rotation which is caused by the first Pockels cell 61a is shown with a dashed line and the polarization rotation which is caused by the second Pockels cell 61b is shown with a dotted line.

At the beginning of the time period which is shown in FIG. 7, the first Pockels cell 61a is in the second mode of operation and rotates the polarization state of the laser beam 41 by 90°. The second Pockels cell 61b is in the first mode of operation and does not rotate the polarization state of the laser beam 41. The total rotation of the polarization state of the laser beam 41 which is caused by the first and second Pockels cells 61a, 61b is therefore 90° and the laser beam 41 is transmitted by the second polarizer 65b as can be seen from the transmitted power shown in the bottom panel of FIG. 7.

At a time $t_1$ which is shown in FIG. 7 the first Pockels cell 61a is switched to the first mode of operation such that it does not rotate the polarization state of the laser beam 41. At a time $t_2$ the second Pockels cell 61b is switched to the second mode of operation such that it rotates the polarization state of the laser beam 41 by 90°. In between the time $t_1$ and the time $t_2$ there is a time period $t_i$ during which neither the first Pockels cell 61a or the second Pockels cell 61b rotates the polarization state of the laser beam 41. The laser beam 41 is not transmitted by the second polarizer 65b during the time period $t_i$ and thus the laser beam 41 is not incident on the photocathode 43. After the time $t_2$ the second Pockels cell 61b rotates the polarization state of the laser beam 41 by 90° and the laser beam 41 is again transmitted by the second polarizer 65b and is incident on the photocathode 43.

At a time $t_3$ which is shown in FIG. 7 the first Pockels cell 61a is switched back to the second mode of operation such that it rotates the polarization state of the laser beam 41 by 90°. At a time $t_4$ the second Pockels cell 61b is switched to the first mode of operation such that it doesn't rotate the polarization state of the laser beam 41 by 90°. In between the time $t_3$ and the time $t_4$ there is a time period $t_i$ during which both the first Pockels cell 61a and the second Pockels cell 61b rotate the polarization state of the laser beam 41 by 90° to give a combined rotation of 180°. The laser beam 41 is not transmitted by the second polarizer 65b during the time period $t_i$ and thus the laser beam 41 is not incident on the photocathode 43. After the time $t_4$ the second Pockels cell 61b stops rotating the polarization state of the laser beam 41 by 90° and the laser beam 41 is again transmitted by the second polarizer 65b and is incident on the photocathode 43.

Also shown in FIG. 7 is a time $t_5$ when the first Pockels cell 61a is switched back to the first mode of operation and a time $t_6$ when the second Pockels cell 61b is switched back to the second mode of operation. There is a time period $t_i$ between the time $t_5$ and the time $t_6$ during which neither the first Pockels cell 61a or the second Pockels cell 61b rotates the polarization state of the laser beam 41 and thus the laser beam 41 is not transmitted by the second polarizer 65b.

In the embodiment which is shown in FIG. 7 the first and second Pockels cells 61a, 61b are periodically switched between first and second modes of operation with time periods $T_a$ and $T_b$ respectively. The periodic switching of the first and second Pockels cells 61a, 61b have a phase difference θ with each other which causes the time periods $t_i$ during which the laser beam 41 is not transmitted by the second polarizer 65b and therefore the electron beam E is interrupted. It will be appreciated from FIG. 7 that the length of the time periods $t_i$ during which the electron beam E is interrupted is determined by the phase difference θ between the switching of the first and second Pockels cells 61a, 61b and not by the time periods $T_a$, $T_b$ of the switching. The embodiment of the first control apparatus 51' which is depicted in FIG. 6 therefore advantageously allows the laser beam 41 to be blocked and the electron beam E to be interrupted for time periods $t_i$ which are much shorter than the time periods $T_a$, $T_b$ with which the modes of operation of the Pockels cells 61a, 61b are switched. The time periods $t_i$ during which the laser beam 41 is blocked and the electron beam E is interrupted may, for example, be approximately equal to the time period during which one pulse of the laser beam 41 propagates through the first and second Pockels cells 61a, 61b. The first control apparatus 51' of FIG. 6 may therefore be used to prevent a single pulse of the laser beam 41 from being incident on the photocathode and may therefore interrupt the electron beam so as to cause a single pulse of the laser beam 41 to have substantially no associated electron bunch 42 in the electron beam E which is output from the injector 21. In some embodiments the first control apparatus 51' may interrupt the electron beam E such that more than one consecutive pulse of the laser beam 41 has substantially no associated electron bunch 42 in the electron beam E which is output from the injector 21.

When adjusting the number of pulses of the laser beam 41 which are blocked from being incident on the photocathode 43 in a given time, it may be desirable to keep the amount of time during which each of the Pockels cells are in the first and second modes of operation approximately constant. This may allow the amount of power from the laser beam 41 which is dissipated into the Pockels cells to remain approximately constant and thus the temperature of the Pockels cells may remain approximately constant. In order to adjust the number of pulses of the laser beam 41 which are blocked from being incident on the photocathode 43 in a given time, the phase difference θ between the first and second Pockels cells may be adjusted such that the time periods $t_i$ during which the laser beam 41 is blocked are adjusted.

In an alternative embodiment a half wave plate may be positioned in between the first Pockels cell 61a and the second Pockels cell 61b. The half wave plate may be configured to rotate the polarization state of the laser beam 41 by around 90°. In such an embodiment the laser beam 41 may be transmitted by the first control apparatus 51' at times during which both the first and second Pockels cells are in the same mode of operation and the laser beam 41 may be blocked by the first control apparatus 51' at times during which the first and second Pockels cells are in different modes of operation.

Embodiments have been described above in which one or more Pockels cells 61 are switched between a first mode of operation and a second mode of operation. Switching a Pockels cell 61 between a first mode of operation and a second mode of operation may cause some power to be dissipated into an electro-optic crystal 62 of the Pockels cell 61. Dissipation of power into an electro-optic crystal 61 may cause the electro-optic crystal 61 to be heated. In some embodiments one or more Pockels cells 61 may be cooled in order to stabilize the temperature of the Pockels cells 61.

The first control apparatus 51, 51' may be operable to control the power of the laser beam 41 which is incident on the photocathode 43 and thereby control the current of electron bunches which are emitted from the photocathode 43. For example, referring to FIGS. 1 and 4 in combination, the power of the laser beam 41 which is transmitted through the first control apparatus 51, 51' may be controlled by the controller CT in response to the power of the EUV radiation beam B as measured by the sensor apparatus ST. The first control apparatus 51, 51' may thus form part of the feedback-based control loop F1. If the measured power of the EUV radiation beam B is too high then the controller CT will cause the first control apparatus 51, 51' to block more pulses from the laser beam 41. Conversely, if the measured power of the EUV radiation beam B is too low then the controller CT will cause the first control apparatus 51, 51' to block less pulses from the laser beam 41.

In an embodiment, the current of the electron beam E may be measured instead of the power of the EUV radiation beam. The measured current may be used to provide a feedback-based control loop instead of the measured EUV radiation beam power.

In the above described embodiments the voltage applied to the photocathode 43 may be controlled to accommodate the fact that, due to missing laser beam pulses, bunches of electrons will not be emitted from the photocathode. In general, the voltage applied to the photocathode 43 may be stabilized, and this stabilization may take into account missing laser beam pulses. The voltage stabilization may for example be feed-forward stabilization.

Embodiments of a first control apparatus 51, 51' have been described above which are operable to block one or more pulses of the laser beam 41 from being incident on the photocathode 43 so as to interrupt the electron beam E and to cause at least one pulse of the laser beam 41 to have substantially no associated electron bunch in the electron beam E which is output from the injector. This may allow the power of the radiation beam B which is output from the free electron laser to be controlled. In addition to or as an alternative to the use of a first control apparatus 51, 51' the power of the radiation beam B which is output from the free electron laser may be controlled with a second control apparatus 52 as shown in FIG. 4. The second control apparatus 52 is operable to remove electron bunches 42 which are emitted from the photocathode 43 from the electron beam E thereby interrupting the electron beam E so as to cause at least one pulse of the laser beam 41 to have substantially no associated electron bunch in the electron beam E.

Figure 8:
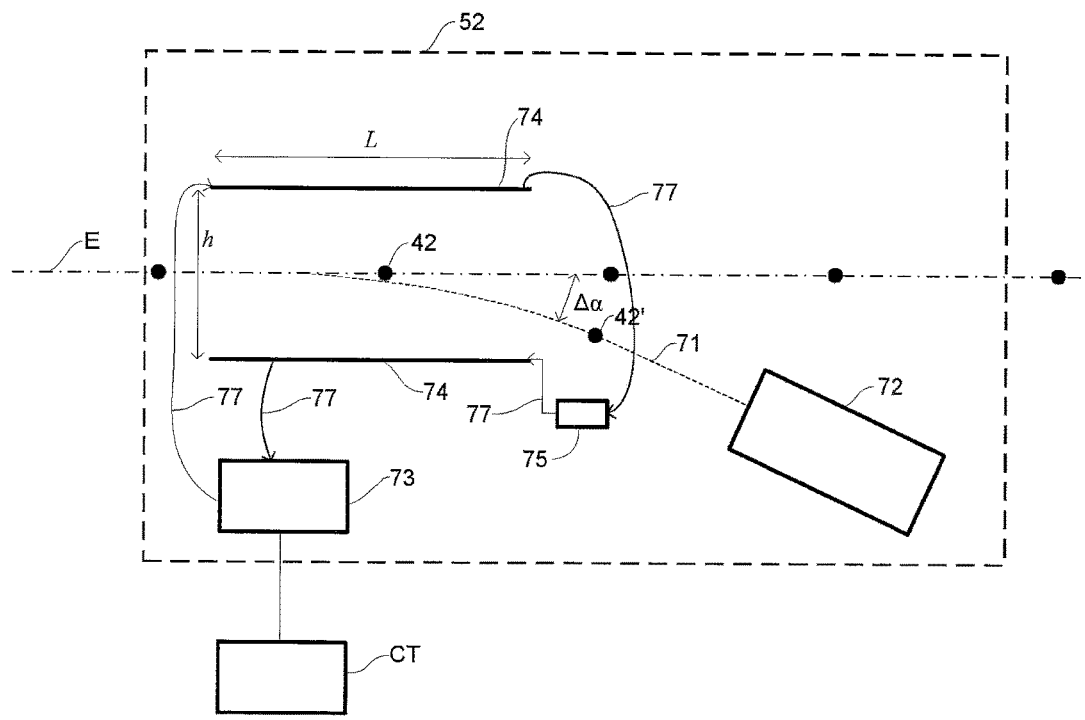
FIG. 8 is a schematic illustration of a second control apparatus which may form part of the injector of FIG. 4.

FIG. 8 is a schematic depiction of an embodiment of the second control apparatus 52. The second control apparatus 52 comprises a pair of conducting plates 74 disposed either side of the trajectory of the electron beam E. The conducting plates 74 are electrically coupled to a voltage source 73 by wires 77. The wires 77, the conducting plates 74 and the voltage source 73 form an electric circuit through which a current may flow. The direction of the current flow is indicated by arrow heads on the wires 77 in FIG. 8. Also included in the electric circuit is a resistor 75. Preferably the impedance of the wires 77, the conducting plates 74 and the resistor 75 are matched. The voltage source is operable to generate a potential difference between the plates 74 so as to cause a current to flow through the conducting plates. The current flows in opposite directions through the conducting plates 74 thereby generating a magnetic field between the plates 74. The voltage source 73 is controlled by a controller CT (which may correspond with the controller CT shown in FIG. 1). At times at which a potential difference is generated between the conducting plates 74 so as to create a magnetic field between the plates 74, the generated magnetic field serves to alter the trajectory of electron bunches 42 in the electron beam E so as to direct the electron bunches towards a beam dump 72. An electron bunch 42' is shown in FIG. 8 whose trajectory has been altered by a magnetic field between the conducting plates 74 so as to direct the electron bunch 42' along a trajectory 71 towards the beam dump 72.

The beam dump 72 comprises a sufficient quantity of material to absorb the deflected electron bunch 42'. The beam dump 72 absorbs electrons so as to prevent the creation of secondary electrons which may disadvantageously reach the booster 33 and be accelerated by the linear accelerator 22. In some embodiments alternative means may be used to prevent creation of secondary electrons. For example, one or more orifices may be positioned in a beam pipe in which the electron beam E propagates so as to allow a deflected electron bunch 42' to propagate out of the beam pipe without creating secondary electrons. In some embodiments secondary electrons may be directed away from the booster 33 by, for example, generating an electric and/or a magnetic field which is configured to prevent secondary electrons from propagating towards the booster 33.

The voltage source 73 is operable to switch a potential difference between the conducting plates 74 on and off so as to switch between a first state where no potential difference is generated between the conducting plates 74 and the electron bunches 42 continue along the same trajectory and remain in the electron beam E and a second state where a potential difference is generated between the conducting plates 74 and one or more electron bunches 42' are deflected out of the electron beam E and are directed to the beam dump 72. The voltage source 73 may, for example, be operable to switch between the first and second states sufficiently fast enough so as to only deflect a single electron bunch 42' out of the electron beam E at a time. For example, a first electron bunch 42 may pass through the conducting plates 74 whilst the potential difference between the conducting plates 74 is turned off such that the first electron bunch 42 is not deflected out of the electron beam E. A potential difference between the conducting plates 74 may then be switched on before a subsequent second electron bunch 42' passes between the conducting plates 74 such that the second electron bunch is deflected out of the electron beam E and directed along the trajectory 71 to the beam dump 72. The potential difference between the conducting plates 74 may then be turned off again before a subsequent third electron bunch 42 passes between the conducting plates 74 such that the third electron bunch 42 is not deflected out of the electron beam E. The potential difference between the conducting plates 74 may, for example, be generated for a time period of less than approximately 10 nanoseconds. For example, the potential difference between the conducting plates 74 may be generated for a time period of approximately 1 nanosecond or less.

Alternatively a potential difference may be generated between the conducting plates 74 for a sufficient period of time so as to deflect more than one consecutive electron bunch 42' out of the electron beam E and towards the beam dump 72 (e.g. 100 electron bunches or less, e.g. 10 electron bunches or less).

An approximation of the angular deflection Δα of an electron bunch 42' which is caused by a potential difference between the conducting plates 74 is given by equation 3.

$$\Delta\alpha = 2\tanh\left(\frac{\pi w}{2h}\right)\frac{qVL}{E_e h} \quad (3)$$

Where q is the charge of an electron, L is the length along the direction of propagation of the electron beam E of the conducting plates 74, V is the potential difference between the conducting plates 74, $E_e$ is the energy of the electrons in the electron bunch 42', h is the separation between the conducting plates 74 and w is the width of the conducting plates 74.

In an embodiment a potential difference V may be generated between the conducting plates 74 which results in an angular deflection Δα of approximately 1°. This may result in a separation between the deflected electron bunch 42' and the electron beam E of approximately 2 cm at a distance of approximately 1 meter downstream from the conducting plates 74. In other embodiments the angular deflection Δα may be greater than 1° and may, for example, be as large as 6°. This may result in a separation between the deflected electron bunch 42' and the electron beam E of up to approximately 10 cm at a distance of approximately 1 meter from the conducting plates 74.

The potential difference V which is generated between the conducting plates 74 may, for example, be greater than about 0.2 kV. In some embodiments the potential difference V may be as large as 1 kV. Voltage sources 73 which are capable of switching a potential difference of 0.2-1 kV on and off sufficiently fast to deflect a single electron bunch 42' out of the electron beam E are commercially available.

As was described above the second control apparatus 52 is operable to deflect one or more electron bunches 42' out of the electron beam E. Deflected electron bunches 42' are not therefore accelerated by the booster 33 or the linear accelerator 22 and do not propagate through the undulator 24. The second control apparatus 52 is thus operable to interrupt the electron beam E so as to cause at least one pulse of the laser beam 41 to have substantially no associated electron bunch in the electron beam E which is output from the injector 21. As was described above with reference to the first control apparatus 51 interrupting the electron beam E causes an interruption in pulses of the radiation beam B which are emitted from the free electron laser FEL and therefore reduces a dose of radiation which is received at a target location of a substrate W. The second control apparatus 52 may be controlled (e.g. by controller CT) in order to control the power of radiation which is emitted by the free electron laser. The controller CT may receive as input a signal corresponding with the power of the EUV radiation beam (or the current in the electron beam). Thus, a feedback-based control loop may be provided which allows the power of the EUV radiation beam to be controlled. This may allow fluctuations of EUV radiation beam power over an exposure time period to be reduced.

The number of electron bunches 42' deflected out of the electron beam E may be sufficiently small that resulting transients in the free electron laser are relatively low. Thus, for example, the wavelength of the EUV radiation beam output from the free electron laser may remain substantially constant. References to a substantially constant wavelength may be interpreted as meaning that the wavelength does not change or changes by an amount which is sufficiently small that dose variation at a target location due to wavelength dependent mirror transmission remains below a desired threshold.

In alternative embodiments one or more electron bunches 42' may be deflected out of the electron beam E so as to interrupt the electron beam E and interrupt pulses in the radiation beam B at other locations in the free electron laser FEL. For example, one or more electron bunches 42 may be deflected out of the electron beam E after the booster 33 and/or after the linear accelerator 22. It is however advantageous to deflect an electron bunch 42' out of the electron beam E at a time when the electron bunch 42' has a relatively low energy. For example it is advantageous to deflect an electron bunch 42' out of the electron beam E before the electron bunch is accelerated by the booster 33 and/or before the electron bunch 42' is accelerated by the linear accelerator 22. This is because as the energy of an electron bunch 42 is increased in the booster 33 and/or the linear accelerator 22, the magnitude of an electric field which is required to provide a desired deflection of the electron bunch 42 increases. Deflecting electron bunches 42 which have been accelerated by the booster 33 and/or the linear accelerator 22 therefore requires a larger potential difference V to be generated between conducting plates 74. Generating a larger potential difference may take more time and thus the speed with which the potential difference may be generated may be increased. This may mean that deflecting single electron bunches 42' out of the electron beam E may be problematic.

Furthermore an electron bunch which is deflected out of the electron beam after being accelerated in the booster 33 and/or the linear accelerator 22 will have a higher energy than an electron bunch 42' which is deflected out of the electron beam before being accelerated. A higher energy deflected electron bunch 42' will generate secondary electrons and secondary isotopes which may require removal from the free electron laser FEL.

In the embodiment of the second control apparatus 52 which is depicted in FIG. 8 the voltage source 73 causes an electric current to flow in opposite directions in the conducting plates. In an alternative embodiment one or more voltage sources may be configured to cause a current to flow in each of the conducting plates 74 in the same direction. In such an embodiment a magnetic field may be generated between the plates 74 such that electron bunches 42 which pass between the plates 74 are defocussed by the magnetic field. A defocussed electron bunch 42 may stimulate emission of radiation in the undulator 24 with greatly reduced conversion efficiency when compared to an electron bunch 42 which has not been defocussed. A pulse of radiation which is stimulated in the undulator 24 by a defocussed electron bunch may therefore have a lower power than a pulse of radiation which is stimulated in the undulator 24 by an electron bunch which has not been defocussed. An electron bunch 42 may therefore be defocussed in a second control apparatus in order to reduce the power of a corresponding pulse of radiation which is stimulated in the undulator 24 (e.g. to a level of power which is negligible). This may be considered to substantially interrupt pulses in the radiation beam B which is emitted from the free electron laser FEL and may therefore cause a reduction of a number of pulses of radiation which are received by a target location of a substrate W in a given exposure time period, thereby reducing a dose of radiation which is received at the target location.

Embodiments of a first control apparatus 51 and a second control apparatus 52 have been described above which are operable to interrupt the electron beam E so as to cause at least one pulse of the laser beam 41 to have substantially no associated electron bunch 42 in the electron beam E which is output from the injector 21. As was described above, interrupting the electron beam E which is output from the injector 21 causes an interruption of pulses in the radiation beam B which is emitted from the free electron laser FEL and therefore causes a reduction of a number of pulses of radiation which are received by a target location of a substrate W in a given exposure time period, thereby reducing the dose of radiation which is received by the target location. The electron beam E may therefore be interrupted by a first control apparatus 51 and/or by a second control apparatus 52 in order to control the dose of radiation which is received by a target location of the substrate W.

The first control apparatus 51 and/or the second control apparatus 52 may be controlled (e.g. by the controller CT) in response to one or more measurements of the radiation beam B. For example, a radiation sensor (not shown) may be arranged to measure the power of the radiation beam B which is output from the free electron laser FEL. The first control apparatus 51 and/or the second control apparatus 52 may be controlled in response to the measured power of the radiation beam B such that a desired dose of radiation is received by a target location of the substrate W. For example, if the radiation sensor measures an increase in the power of the radiation beam B then the first control apparatus 51 and/or the second control apparatus 52 may respond to this measurement by interrupting the electron beam E so as to reduce the number of pulses of radiation which are received by a target location of a substrate W in a given exposure time period such that the dose of radiation which is received by the target location continues to be a desired dose despite the increase in power of the radiation beam B.

In some embodiments measurements of the power of the radiation beam B may be measured at other locations in a lithographic system LS than at the output of the free electron laser FEL. For example, the power of the radiation beam which is output from the beam expanding optics (if present) and which is input to the beam splitting apparatus 19 may be measured. Additionally or alternatively the power of one or more branch radiation beams $B_a$-$B_n$ may be measured after having been output by the beam splitting apparatus 19. Additionally or alternatively the power of one or more branch radiation beams $B_a$-$B_n$ may be measured within one or more lithographic apparatus $LA_a$-$LA_n$. For example, the power of a patterned radiation beam (e.g. patterned radiation beam $B_a'$) which is received at a substrate W may be measured. In general any measurements of the radiation beam B or of branch radiation beams $B_a$-$B_n$ may be made and may be used to control the first control apparatus 51 and/or the second control apparatus 52 so as to control a dose of radiation which is received at a target location of a substrate W in a given exposure time period.

In general any measurements of the radiation beam B or of branch radiation beams $B_a$-$B_n$ may be made and may be used to control the first control apparatus 51 and/or the second control apparatus 52 so as to control the power of radiation which is output from the free electron laser. The measurement(s) may form part of a feedback-based control loop which acts to stabilize the power of the radiation output from the free electron laser. An example of a feedback-based control loop F1 is shown in FIG. 1.

In some embodiments the first control apparatus 51 and/or the second control apparatus 52 may during normal operation interrupt the electron beam E so as to reduce the number of electron bunches 42 in the electron beam E and the number of pulses in the radiation beam B by a given amount. This may allow the first control apparatus 51 and/or the second control apparatus 52 to stabilize the power of the radiation beam output by the free electron laser by increasing or decreasing the number of electron bunches 42 in the electron beam as needed. This may reduce fluctuations of the EUV radiation beam power when that power is averaged over a given time period (e.g. 1 ms).

A target location of a substrate W may be exposed for an exposure time period of approximately 1 ms. The pulse repetition frequency of the laser beam 41 and therefore the pulse repetition frequency of the radiation beam B may be approximately 300 MHz. Therefore, in this example, during an exposure time period of 1 ms a target location of a substrate W is exposed to approximately $3 \times 10^5$ pulses of radiation. It may be desirable to interrupt the electron beam E in a periodic manner. For example, the first control apparatus 51 and/or the second control apparatus 52 may interrupt the electron beam E such that the every $100^{th}$ or every $1000^{th}$ pulse of the laser beam 41 has substantially no associated electron bunch 42 in the electron beam E. In some embodiments time periods during which the electron beam is interrupted may in total comprise approximately 1-10% of the time periods during which the electron beam is not interrupted. In some embodiments the frequency with which the electron beam is interrupted may be 1 MHz or more (e.g. in the range 1 MHz to approximately 100 MHz). The number of pulses of the laser beam 41 which have substantially no associated electron bunch 42 in the electron beam E during the exposure time period may be increased or decreased in order to control the dose of radiation which is received during the exposure time period (e.g. to keep dose variations below a desired threshold). Thus, fluctuations of the EUV radiation beam power averaged over the exposure time period are reduced. Variations in the dose of EUV radiation received at target locations on the substrate are correspondingly reduced.

In an embodiment in which an exposure slit of radiation is scanned over a target location on a substrate in a scanning exposure it may be desirable to interrupt the electron beam E in a periodic manner with a time period $T_i$ such that the exposure time period $T_e$ is an integer multiple of the time period $T_i$ (i.e. $T_e = nT_i$ where n is an integer). This may ensure that each target location of the substrate W receives the same number of pulses of radiation as the exposure slit is scanned over the target location.

As was described above it may be desirable to interrupt the electron beam E such that only a small number of consecutive electron bunches 42 (for example less than 100, or less than 10) are removed from the electron beam E. For example, it may be desirable to only remove a single electron bunch 42 from the electron beam E at a time. Removing only a small number of consecutive electron bunches 42 from the electron beam E may ensure that there is only a small gap in the electron beam E which propagates through the linear accelerator 22 and the undulator 24. This will reduce the size of transients which will arise in the free electron laser due to the gap in the electron beam E (compared with if a bigger gap were present). The transients may be sufficiently small that for example the wavelength of EUV radiation generated by the free electron laser remains substantially constant. References to a substantially constant wavelength may be interpreted as meaning that the wavelength does not change or changes by an amount which is sufficiently small that dose variation at a target location due to wavelength dependent mirror transmission remains below a desired threshold.

The linear accelerator 22 may comprise a plurality of resonant cavities (e.g. superconducting radio frequency cavities) in which externally driven oscillating electromagnetic fields resonate. Each electron of an electron bunch 42 which passes through a resonant cavity has its own associated electromagnetic field. As an electron passes through a cavity its electromagnetic field is perturbed causing an electromagnetic field known as wakefield to exist within the cavity. The electromagnetic field in a cavity at a given time is therefore a combination of an externally driven electromagnetic field and the wakefields of electrons which have previously passed through the cavity. An electron bunch 42 which immediately follows an interruption in the electron beam E may therefore experience a different electromagnetic field in cavities of the linear accelerator 22 than an electron bunch 42 which does not follow an interruption in the electron beam E. An electron bunch 42 which immediately follows an interruption in the electron beam E may therefore be accelerated by a different amount in the linear accelerator 22 than an electron bunch 42 which does not follow an interruption in the electron beam E and may therefore have a different energy in the undulator 24.

In some embodiments the electron beam E which is output from the undulator 24 is passed back through the linear accelerator 22 in order to recover energy from the electron beam E and to decelerate the electron beam E. Such an arrangement is known as an energy recovering linear accelerator (ERL). The energy which is recovered from the decelerated electrons is used to accelerate the electron beam E which is output from the injector 21. If the electron beam E is interrupted by removing an electron bunch 42 from the electron beam E then there will be an interruption in the recovery of energy from the electron beam in the linear accelerator 22. Such an interruption in the recovery of energy may cause a reduction in the amount by which accelerating electrons passing through the linear accelerator 22 are accelerated and may therefore change the energy of some electron bunches 42 which are output from the linear accelerator 22 and which propagate through the undulator 24.

As was described above the effect of interrupting wakefields in cavities of the linear accelerator 22 and/or the effect of interrupting the recovery of energy from decelerating electrons in the linear accelerator 22 may cause some electron bunches 42 to pass through the undulator 24 with a different energy to electron bunches 42 which are not affected by these effects. The wavelength of radiation whose emission is stimulated in the undulator 24 is dependent on the energy of the electron bunches in the undulator 24 and thus variations in the energy of electron bunches in the undulator 24 may lead to variations in the wavelength of the radiation beam B which is emitted from the free electron laser FEL. An interruption in the electron beam E may therefore cause a variation in the wavelength of pulses of the radiation beam B which immediately follow the interruption in the electron beam E.

The transmittance of the optical path which the radiation beam B follows from the free electron laser FEL to a substrate W may be dependent on the wavelength of the radiation beam B. Variations in the wavelength of the radiation beam B may therefore cause variations in the power of a radiation beam (e.g. patterned radiation beam $B_a'$) which is incident on a substrate and may therefore affect the dose of radiation which is received at the substrate W. It may be desirable to reduce any impact that interruptions in the electron beam E have on the wavelength of the radiation beam B.

A change in the wavelength of the radiation beam B which is caused by an interruption in the electron beam E may depend on the length of time for which the electron beam E is interrupted. For example, removing only a single electron bunch 42 from the electron beam E may cause the electron beam E to be interrupted for only a short amount of time and may cause only a small variation in the wavelength of pulses of the radiation beam B which follow the interruption. If the number of consecutive electron bunches 42 which are removed from the electron beam E is increased then this will increase the amount of time for which the electron beam E is interrupted and may therefore increase the variation in the wavelength of pulses of the radiation beam B which follow the interruption. It may therefore be desirable to interrupt the electron beam E such that only a limited number of consecutive electron bunches 42 are removed from the electron beam E in order to reduce the impact of the interruption on the wavelength of the radiation beam B. For example, it may be desirable to only remove a single electron bunch 42 from the electron beam E at a time. In practice this may not be possible due to the high frequency of the electron pulses (e.g. around 100 MHz). In general, it may be desirable to interrupt the electron beam with a repetition rate of 1 MHz or more, and to limit total interruptions of the electron beam to less than 10% of the beam time. This will limit the extent to which the interruptions cause variations of the wavelength of pulses in the radiation B. For example 100 consecutive electron bunches or less may be removed from the electron beam at a time.

In an embodiment, transients which are caused by removing a plurality of electron bunches 42 from the electron beam E may be measured and taken into account. For example, transient changes of the wavelength of the radiation beam may be measured and taken into account. As noted above, the transmission of mirrors of the lithographic apparatus LA is wavelength dependent. The collective transmission of the mirrors has a peak transmission wavelength, with the transmission of the mirrors being highest at that peak and falling off along a slope either side of the peak as a function of wavelength. The free electron laser may be configured to operate at a wavelength which lies on a slope of the collective mirror transmission (e.g. around a mid-point of the slope). When a plurality of electron bunches are removed from the electron beam E the accelerator 21 retains energy which would otherwise have been transferred to the electron bunches. When the next electron bunches pass through the accelerator 21 they receive this additional energy. This is a transient effect which may last for around 1 µs. Since the electron bunches have additional energy they will generate EUV radiation with a shorter wavelength. The collective transmission of the mirrors at this shorter wavelength will be different (e.g. lower), and as a result the EUV radiation will be attenuated more by the mirrors before it is incident upon a substrate. This effect may be used to compensate, at least in part for the effect of transients caused by removing a plurality of electron bunches 42 from the electron beam (or defocusing the electron bunches in the manner described above).

In a related embodiment, the amount of charge in the electron bunches 42 may be altered by changing the power of the pulses of the laser beam 41. This will yield an immediate change in the intensity of EUV radiation emitted by those electron bunches 42 and the wavelength of the EUV radiation. In addition, it will create a transient change of the energy in the accelerator 21 which will influence the energy and wavelength of subsequent electron bunches 42 (e.g. for a period of a few µs). These energy and wavelength changes may be used, in combination with the wavelength dependent collective transmission of the mirrors, to control a dose of EUV radiation delivered to a target location on a substrate W.

In a further related embodiment the wavelength of the EUV radiation beam may be adjusted by changing the acceleration of the electron bunches 42. As explained above, changing the wavelength may be used as a way of controlling the dose of radiation delivered to a target location on a substrate W. The acceleration provided to the electron bunches 42 may be changed using an extra cavity (e.g. formed from copper) in the electron booster 33 or the accelerator 21. The extra cavity may have a peak electric field significantly smaller than electric fields used by other cavities but large enough to be able to control the wavelength of the resulting EUV radiation pulses. If the extra cavity is not superconducting (e.g. is formed from copper) then it will have a smaller Q factor and will be able to control the wavelength more rapidly.

The free electron laser FEL may include one or more safety monitoring systems which monitor properties of the free electron laser FEL. For example, the current of electron bunches 42 which are output from the injector 21, the electron beam E which propagates through the free electron laser FEL and/or pulses of the radiation beam B may be monitored by one or more safety monitoring systems. One or more safety systems may act upon measurements made by a safety monitoring system in order to regulate a monitored variable and/or to provide an error alert in the event that a monitored variable differs from a desired state. For example, in the event that pulses of the radiation beam B and/or electron bunches 42 are missing this may be detected by one or more safety monitoring systems and may be acted upon by a safety system (e.g. by shutting down the free electron laser FEL). In the event that first control system 51 and/or the second control system 52 interrupts the electron beam E then this interruption may be communicated to the safety monitoring system and/or the safety system such that a missing electron bunch E and/or a missing pulse in the radiation beam B is not acted upon by the safety system.

Advantages of interrupting an electron beam E have been described above in the context of controlling a dose of radiation which is received by a target location of a substrate W. Interrupting an electron beam E may be additionally advantageous since it may allow ions which may congregate along the path of the electron beam E to dissipate away from the path of the electron beam E. Ions may be created in a beam pipe through which the electron beam E propagates in the free electron laser FEL and may be attracted to the path of the electron beam E by the potential well which is caused by the electrons. Electrons in the electron beam E may be scattered by the ions and may create harmful radiation. Scattered electrons may additionally cause damage to magnets in the undulator 24. An interruption in the electron beam E causes an interruption in the potential well which is created by the electron beam E during which the ions may dissipate away from the path of the electron beam E. Dissipated ions may, for example, be absorbed by the walls of a beam pipe such that they are removed from the beam pipe.

Reference has been made above to the removal of one or more electron bunches 42 from the electron beam E. Removal of one or more electron bunches 42 from the electron beam E may comprise substantially preventing one or more pulses of the laser beam 41 from being incident on the photocathode 43 such that substantially no electron bunch 42 is emitted from photocathode 43 (e.g. using the first control apparatus 51). Removal of one or more electron bunches 42 from the electron beam E may comprise reducing the power of one or more pulses of the laser beam 41 incident on the photocathode 43 to less than 10% of the nominal power and thereby reducing the charge of electron bunches 42 emitted from photocathode 43 such that they produce a negligible amount of EUV radiation (e.g. using the first control apparatus 51). Removal of one or more electron bunches 42 from the electron beam E may comprise deflecting one or more electron bunches 42 from the electron beam E (e.g. using the second control apparatus 52).

In an alternative approach, as explained above, instead of removing one or more electron bunches 42 from the electron beam E, one or more electron bunches may be defocussed such that they produce a negligible amount of EUV radiation (e.g. using the second control apparatus 52)

Figure 9:
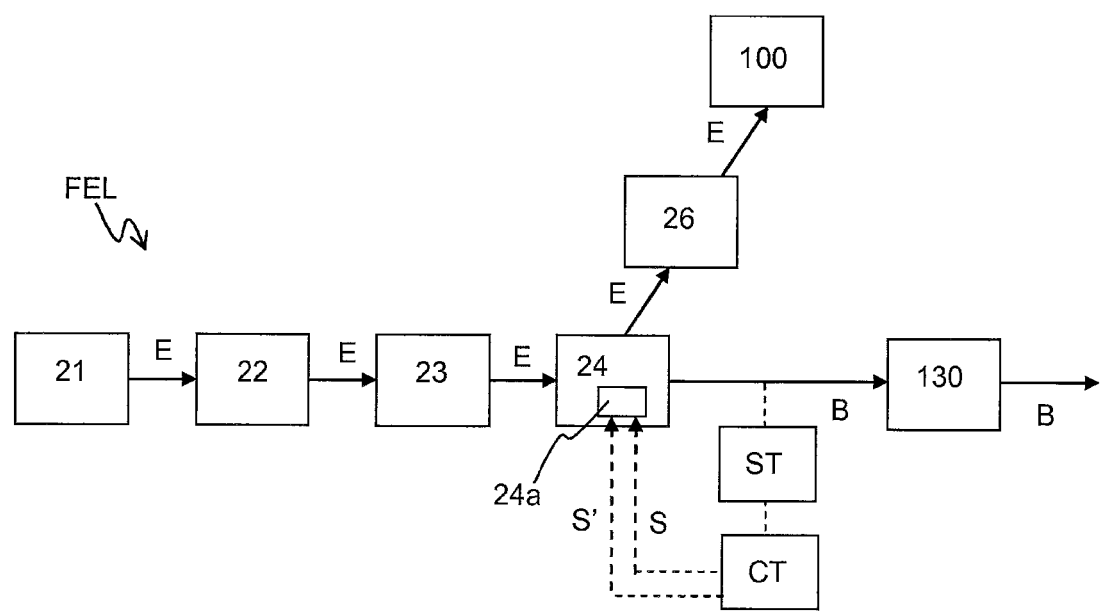
FIG. 9 schematically depicts a free electron laser according to an embodiment of the invention.

An alternative embodiment of the invention will now be described with reference to FIG. 9. FIG. 9 shows an FEL which has many features in common with the FEL shown in FIG. 3. To avoid repetition these features are not described again here. The free electron laser FEL comprises a radiation sensor 25, which is operable to determine the power of the radiation beam B. A portion of the radiation beam B may be directed towards the radiation sensor apparatus ST (which may correspond with the radiation sensor apparatus ST shown in FIG. 1), and the irradiance of that portion may be measured. This may be used to determine the power of the beam B. Alternatively, or additionally, the power of the beam B may be determined indirectly. For example, residual gas present in the vacuum pipe through which the radiation beam B passes may fluoresce (absorbing EUV radiation and emitting radiation with a different wavelength) and/or cause Rayleigh scattering of the EUV radiation. A measurement of fluorescence and/or Rayleigh scattering by such residual gas, together with a measurement of residual gas pressure, may be sufficient to determine the power of the beam B. The measurement of the power may be substantially continuous or intermittent.

The undulator 24 has an adjustment mechanism 24a that is operable, in response to the power determined by the radiation sensor apparatus ST, to vary one or more parameters of the undulator such that the power of the radiation beam is altered as will now be described in further detail.

As electrons move through the undulator 24, they interact with the electric field of the radiation, exchanging energy with the radiation. An electron which meets the resonance condition as it enters the undulator will lose energy as radiation is emitted, so that the resonance condition is no longer satisfied. Therefore, as explained above, in some embodiments the undulator may be tapered. That is, the amplitude of the periodic magnetic field and/or the undulator period $\lambda_u$ may vary along the length of the undulator in order to keep bunches of electrons at resonance as they are guided though the undulator. Advantageously, tapering of the undulator has the capacity to significantly increase conversion efficiency. The use of a tapered undulator may increase the conversion efficiency (i.e. the portion of the energy of the electron beam E which is converted to radiation in the radiation beam B) by more than a factor of 2. The tapering of the undulator may be achieved by reducing the undulator parameter K along its length.

The undulator period $\lambda_u$ and the magnetic field strength $B_0$ along the axis of the undulator may be matched to the electron bunch energy to help ensure that the resonance condition is met. In the case of an untapered undulator, the undulator period $\lambda_u$ and the amplitude of the periodic magnetic field $B_0$ remain constant throughout the undulator. In the case of a tapered undulator, the undulator period $\lambda_u$ and/or the amplitude of the periodic magnetic field $B_0$ varies with distance along the axis of the undulator so as to help ensure that the resonance condition is met. This matching provides maximum or increased energy extraction from the electrons to EUV radiation for a given length of undulator. This matching of the undulator period $\lambda_u$ and the magnetic field strength $B_0$ to help ensure that the resonance condition is met may be a default configuration of the free electron laser FEL.

In an embodiment, at least part of the magnetic field of the undulator 24 is adjustable, the adjustment mechanism 24a being operable to vary it. When required, the strength of at least part of the magnetic field in the undulator can be dynamically changed in order to reduce conversion efficiency from the above described matched configuration. In some embodiments, the adjustment mechanism 24a is operable to alter the magnetic field strength on, or close to, the axis of the undulator 24.

Advantageously, this provides control of the power of the output EUV radiation while one or more properties of the electrons such as, for example, energy, charge, compression, focusing and repetition rate may remain constant. Such an arrangement is beneficial for, for example, one or more reasons. For example, such an arrangement allows for changes in demand for the EUV radiation to be accounted for. For example, such an arrangement allows varying requirements of the lithographic apparatus LA that uses the EUV radiation to be accommodated. The lithographic apparatus LA comprises several mirrors, which may deteriorate over time and the arrangement, for example, allows such deterioration to be compensated for. As another example, such an arrangement allows for degradation of the magnets in the undulator 24 due to electron and/or neutron bombardment to be compensated for.

A further benefit is that the conversion efficiency of the FEL can change relatively quickly. In particular the power of the radiation beam B may be changed within the timescale for exposure of a target location on a substrate W by the lithographic apparatus LA (e.g. within around 1 ms). This may allow the power of the radiation beam B to be controlled such that the dose of radiation received at a target location on a substrate is controlled. That is, feedback from the sensor apparatus ST may be used to reduce fluctuations in the dose of radiation received at the target location (e.g. such that variation of the dose is kept below a desired threshold).

Depending on the repetition rate of the bunched electron beam E, it may not be possible to correct pulse to pulse variations in power.

The magnetic field strength on, or close to, the axis of the undulator 24 may be altered by moving the magnets which provide the magnetic field of the undulator 24 towards or away from the beam axis. This may be considered to be an altering of the tapering of the undulator 24. The magnets may be adjusted independently or in dependence on the other magnets. In an embodiment, the magnets are moved relative to the beam axis in such a way that the polarization of the EUV radiation remains substantially unaltered. This may be advantageous if it is desired or required to provide the lithographic apparatus LA with radiation of a specific polarization. For example, the lithographic apparatus LA may require circularly polarized radiation. Adjustment of the tapering of a planar undulator 24 by moving the magnets will have substantially no effect on polarization. However, adjustment of the magnets of a helical undulator will alter the polarization of the radiation unless the adjustment of magnets is in both the vertical and horizontal directions.

In an embodiment, magnets of the undulator 24 may be arranged on either side of the beam axis with a gap between them. The gap may for example be between 4 and 10 mm.

The size of the gap between magnets may for example be controlled to an accuracy of around 1 micron. The adjustment mechanism 24a may be operable to change the size of the gap by for example 10 microns or more.

Additionally or alternatively, the magnetic field strength on, or close to, the axis of the undulator 24 may be altered by altering the magnetic field produced by the magnets. The magnets may be permanent magnets and the magnetic field that they produce may be altered by altering a current flowing through coils positioned next to the magnets and/or the temperature of the magnets. An increase in the temperature of the magnets may cause a decrease in the magnetic field strength.

In an embodiment, the adjustment mechanism 24a is operable to alter the undulator period $\lambda_u$ of the undulator 24.

In an embodiment, the radiation sensor apparatus ST can be used to monitor the power of the radiation beam B. In response to this determined power, the adjustment mechanism 24a may alter the periodic magnetic field of the undulator 24, which, in turn, will alter the power of the radiation beam B. In this manner a feedback-based control loop may be established which controls the power of the radiation beam B output by the free electron laser.

The adjustment mechanism 24a may by controlled by a controller CT. The radiation sensor apparatus ST may be connected to the controller CT and may be operable to send a signal S to the controller indicative of the determined power. The connection between the radiation sensor ST and the controller may physical or wireless (for this or other embodiments). The controller CT may be operable to receive the signal S and, in response thereto, alter one or more parameters of the undulator 24. The parameter may be altered in dependence on the signal S received from the radiation sensor 25 according to a certain (e.g. predetermined) algorithm. The sensor apparatus ST, controller CT and adjustment mechanism 24a comprise a feedback-based control loop which may be used to control the power of the radiation beam output by the free electron laser (e.g. to reduce power fluctuations).

The controller CT may be operable to receive an additional signal S' and, in response thereto, alter one or more parameters of the undulator 24. For example, the processor may receive a signal S' from a lithographic apparatus LA indicating an anticipated period of low or high demand for EUV radiation and the processor may alter one or more parameters of the undulator 24 accordingly.

The free electron laser FEL may comprise a first deflecting magnet disposed between the accelerator 22 and the undulator 24, which can be in: a first state wherein the electrons are guided along the periodic path by the undulator 24 such that they interact with radiation in the undulator 24, stimulating emission of coherent radiation; or a second state wherein the electrons are guided along a different path through the undulator 24 such that they decouple from radiation in the undulator 24 and substantially no emission of coherent radiation is stimulated. For example, the first deflecting magnet may be switched on (wherein it is in the second state) or off (wherein it is in the first state). This arrangement is particularly applicable to helical undulators wherein a small change in the angle between the direction of the electrons and the axis of the undulator (for example by around 10 μrad) can cause complete decoupling of the EUV radiation from the electron bunches. Therefore stimulated emission of EUV radiation is effectively switched off, reducing EUV output of the free electron laser FEL to negligible levels. Advantageously, this provides an emergency switch off feature which may be desirable. The free electron laser FEL may comprise a second deflecting magnet disposed downstream of the undulator 24, which is arranged to compensate for the action of the first deflecting magnet so that electrons exiting the second deflecting magnet when the first deflecting magnet is in the on state follow substantially the same the trajectory as electrons exiting the second deflecting magnet when the first deflecting magnet is in the off state. This allows the electrons to be directed towards the beam dump 100 when the first deflecting magnet is on or off.

The typical divergence of EUV radiation from a SASE FEL is in the order of at least several tens of μrad. Therefore, in principle, it is possible by controlling the beam direction at the input of undulator to change the power of EUV output without significantly changing the position of the radiation beam B exiting the free electron laser FEL. A deflection of the electron beam E can be achieved dynamically using deflecting magnets (driven by pulsed current), by mechanical movement of bending magnets and/or by changing a current through the coils of one or more dipole magnets.

As noted above, the free electron laser FEL may comprise a deceleration mechanism 26 disposed between the undulator 24 and the beam dump 100, which is operable to reduce the energy of the electrons before they are absorbed by the beam dump 100. Such an arrangement reduces the amount of energy the electrons have when absorbed by the beam dump and, therefore, will reduce the levels of induced radiation and secondary particles produced. This removes, or at least reduces, the need to remove and dispose of radioactive waste from the beam dump. This is advantageous since the removal of radioactive waste requires the free electron laser FEL to be shut down periodically and the disposal of radioactive waste can be costly and can have serious environmental implications.

The deceleration mechanism 26 may be operable to reduce the energy of the electrons to below 7 MeV and, desirably, below 5 MeV. Advantageously, electrons below this energy do not induce any significant level of radioactivity in the beam dump 100. During operation of the free electron laser FEL, gamma radiation will be present but when the electron beam E is switched off, the beam dump 100 will be safe to handle.

One known deceleration mechanism uses a linear accelerator to decelerate the electrons. For example, the linear accelerator 22 that is for acceleration may also be used for deceleration, by injecting the electron bunches E that leave the undulator 24 into the linear accelerator 22 with a phase difference of 180 degrees relative to the radio frequency (RF) field. Such an arrangement is known as an energy recovering LINAC. However, there is a limit to the spread of electron energies within the bunches that such an arrangement can accept. The undulator 24 will introduce a spread in the energy of the electron beam E as it passes through. This will result in imperfect deceleration of electron bunches that are injected into the linear accelerator 22 with a phase difference of 180 degrees relative to the radio frequency (RF) field. As a result, some of the electrons may have a larger energy as they leave the linear accelerator 22 than that of electrons leaving the injector 21. Therefore some of these electrons may have energies in excess of the desired threshold of 7 or 5 MeV. As a result, a mechanism to further reduce the energy of these electrons may be required.

Figure 11A:
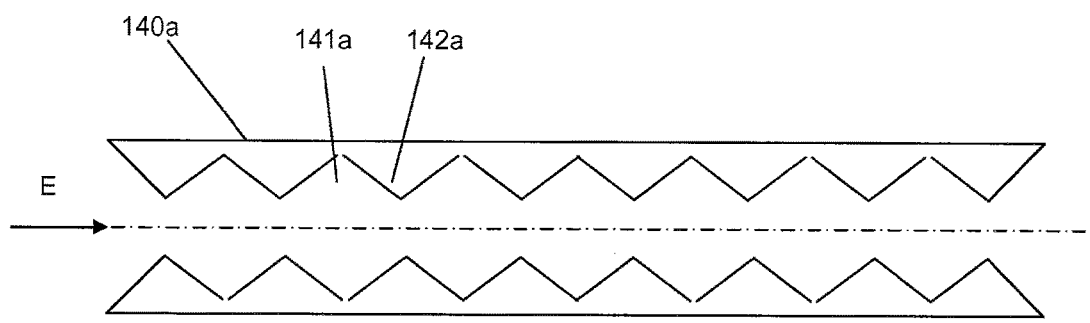
FIG. 11A and FIG. 11B schematically depict two different geometries of conductive piping which may form part of a deceleration mechanism.
Figure 11B:
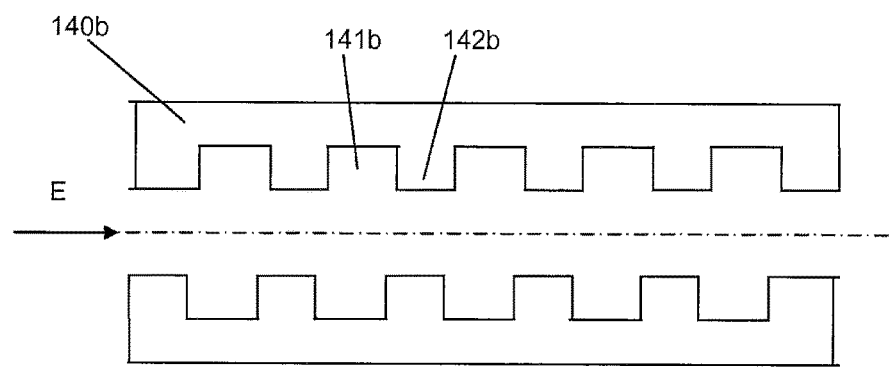

Therefore, at least part of the deceleration mechanism 26 may be separate from the electron source. In particular, the deceleration mechanism 26 may comprise a synchrotron or a cyclotron, which may be used to decelerate the electrons actively. Advantageously, such an arrangement allows for greater spreads of electron energies within the bunches leaving the undulator, in turn allowing an increase in the efficiency of the free electron laser. In an alternative embodiment, the deceleration mechanism 26 may comprise a conductive conduit which the electrons pass through to passively decelerate them. For example, referring to FIGS. 11A and 11B, the deceleration mechanism 26 may comprise a section of conductive piping 140a, 140b with a rough inner surface to promote energy dissipation due to wake fields. For example, the inner surface may comprise a plurality alternating recesses 141a, 141b and protrusions 142a, 142b. The alternating recesses 141a, 141b and protrusions 142a, 142b may have any suitable shape in profile such as, for example, triangular (141a, 142a) or rectangular (141b, 142b). The inner surface of the conductive piping may contain any suitable source of discontinuities for inducing large wake fields such as holes, slits, etc as appropriate. The conductive piping 140a, 140b may comprise a cooling system (not shown) such as water cooling.

Figure 10:
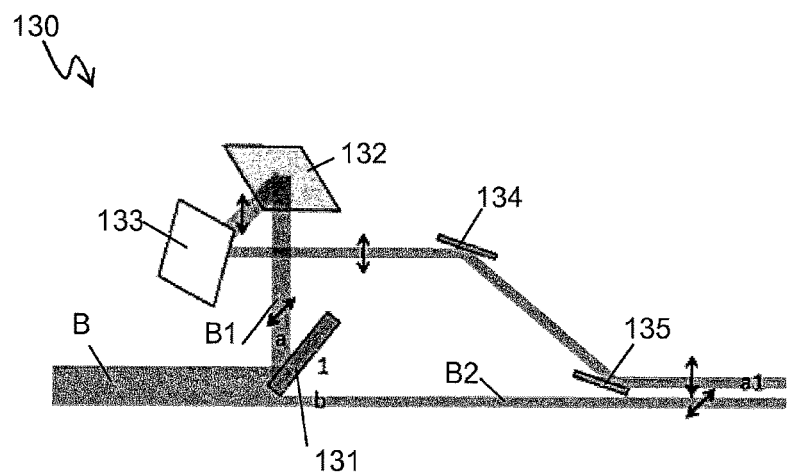
FIG. 10 schematically depicts an apparatus for converting a beam of linearly polarized radiation to circularly polarized radiation.

In an embodiment, the adjustment mechanism 24a is operable to vary the polarization of the radiation beam B. This may be in response to a signal S' received by the adjustment mechanism. As will be described further below, the polarization of the output radiation beam B may be altered by (a) changing the geometry of the undulator 24; and/or (b) manipulating the radiation beam B leaving the undulator 24, for example, using a system of mirrors (see FIG. 10).

In one embodiment, the radiation beam B produced by the free electron laser is guided into the illumination system IL of the lithographic apparatus LA and to the patterning device MA. In general, the radiation will change direction between the free electron laser FEL and the patterning device MA, the change in direction being achieved using one or more mirrors. The one or more mirrors may include the facetted field mirror device 10 and facetted pupil mirror device 11 in the illumination system IL and/or any other mirror positioned between the free electron laser FEL and the lithographic apparatus LA and/or in the illumination system IL. In general, each reflection will alter a ratio of intensities of components wherein the electric field is parallel or perpendicular to the plane of incidence (often referred to as s- and p-components of the radiation), changing the polarization of the radiation. The change in the polarization is dependent upon the angle of incidence with a grazing incidence mirror producing the greatest change and a near normal incidence mirror (such as the facetted field mirror device 10 and/or facetted pupil mirror device 11 in the illumination system IL) not producing any significant change in the polarization.

The free electron laser FEL may be configured so that the polarization of the radiation beam B is chosen in dependence on the one or more mirrors disposed between the free electron laser FEL and the patterning device MA, such that the radiation incident upon the patterning device has a desired polarization. For example, it may be desirable to irradiate the patterning device with circularly polarized radiation. If this is the case then the undulator 24 may produce elliptically polarized radiation with the relative intensities of s- and p-components being such that the radiation incident upon the patterning device MA is circularly polarized. The relative intensities of s- and p-components may be chosen by only taking into account any grazing incidence mirrors in the optical path, and neglecting the effect of any normal or near normal incidence mirrors.

In order to produce elliptically polarized radiation, any suitable undulator 24 may be used such as a helical undulator. In an embodiment, the undulator 24 may comprise two coaxial planar undulators whose planes are substantially mutually perpendicular wherein the lengths, undulator periods and magnetic field strengths of the two planar undulators are chosen to help ensure that the ratio of horizontal and vertical intensities of polarization produces the desired elliptical radiation. In an embodiment, the undulator may comprise more than two coaxial planar undulators, the planes of each planar undulator being different. Such an arrangement may allow for smoother polarization matching than an arrangement using only two planar undulators. In an embodiment, the undulator may comprise a first and second coaxial planar undulators whose planes are substantially mutually perpendicular and a coaxial helical undulator disposed between the first and second planar undulators. Such an arrangement is advantageous because it allows for efficient coupling of energy from a first polarization radiation (from the first planar undulator) into the radiation of a substantially perpendicular polarization (corresponding to the second planar undulator) by introduction of the middle helical undulator.

The lithographic apparatus LA may require circularly polarized EUV radiation. This may be achieved using a helical undulator, which generates circularly polarized radiation. However, if the undulator is planar then conversion from linear to circular polarization may be required. Optionally, this may be done using the apparatus 130, which will now be described further with reference to FIG. 10.

The apparatus 130 is operable to split the radiation beam B into two components using a mirror 131. A first portion B1 of the radiation beam B is reflected through 90° by the mirror 131, a second portion B2 of the radiation beam B continuing past the mirror 131. The polarization vector of the radiation beam B is parallel to the mirror 131 and therefore the polarization vector of the first portion B1 is the same as that of the radiation beam B. The first portion B1 then undergoes two subsequent reflections through 90° by mirrors 132, 133. The second reflection, from the mirror 132, rotates the polarization vector of the first portion B1 by 90°, whereas the third reflection, from the mirror 133, does not. After the three rotations through 90°, the first portion B1 is parallel to, but offset from the second portion B2 and the polarization vectors of the two portions B1, B2 are mutually orthogonal. Two grazing incidence mirrors 134, 135 are used to guide the first portion B1 so that it converges with the second portion B2. Although the first and second portions B1, B2 converge, as a result of the reflections of the first portion B1, the polarization vectors of the first and second portions B1, B2 are no longer parallel. By taking into account the different reflective losses of the first and second portions B1, B2 and choosing the power of the first and second portions B1, B2 appropriately, it is possible to produce two converging beams of substantially equal power and substantially mutually orthogonal polarization. These two beams may together, via appropriate selection of their relative phase, form a circularly or elliptically polarized radiation beam. In practice, precise phase matching may not be possible. Therefore, alternatively, the co-propagating or overlapping beams B1 and B2 may both be received by the lithographic apparatus LA and projected onto the substrate W (having been patterned by the mask MA). The apparatus 130 may be used to ensure that both polarizations are present during exposure of the substrate W and that the doses delivered by the two polarizations are, on average, approximately equal.

Figure 12:
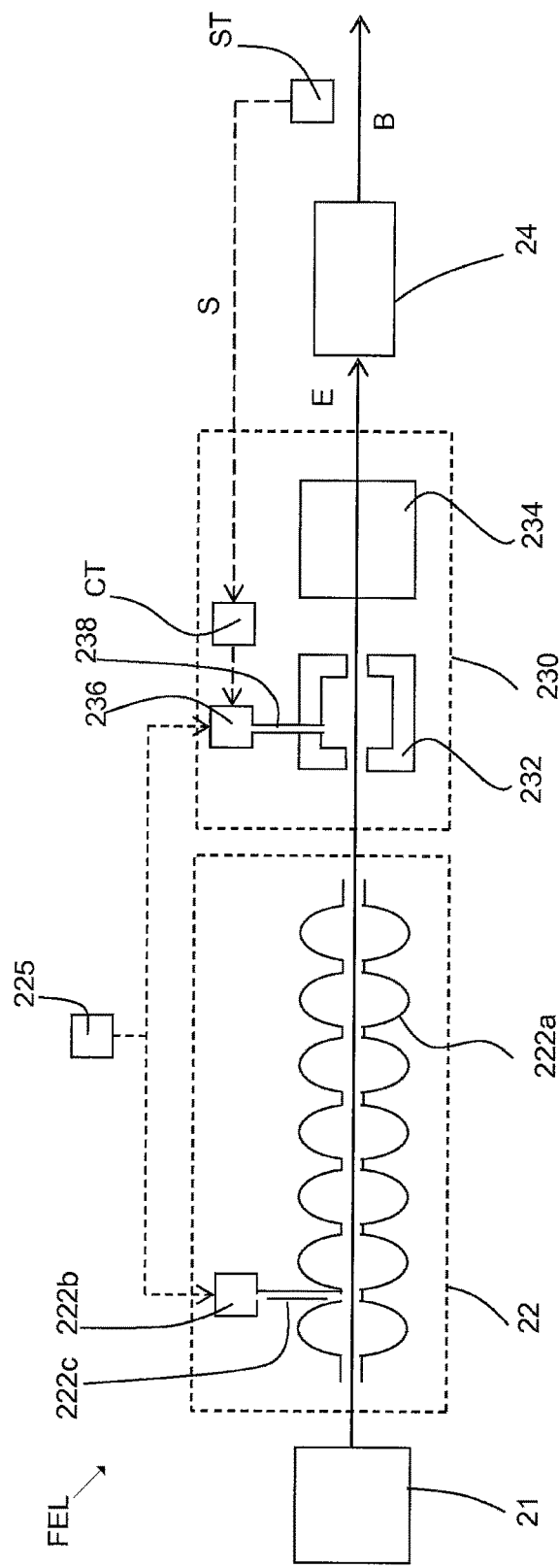
FIG. 12 is a schematic illustration of a free electron laser according to an embodiment of the invention, which may form part of the lithographic system of FIG. 1.

The bunch compressor of the free electron laser may comprise an adjustable bunch compressor. FIG. 12 illustrates a free electron laser FEL with an adjustable bunch compressor 230. The adjustable bunch compressor 230 may be arranged to adjustably control at least one of: (i) a charge density distribution of the electron bunches of the electron beam E along its direction of propagation before they enter the undulator 24; or (ii) an average energy of the electron bunches in the electron beam E before they enter the undulator 24. The adjustable bunch compressor 230 comprises a resonant cavity 232 and a magnetic compressor 234. The resonant cavity 232 is disposed 'up stream' of the magnetic compressor 234, i.e. the electron beam E passes first through the resonant cavity 232 and then through the magnetic compressor 234.

In the arrangement of FIG. 12, the linear accelerator 22 comprises a plurality of superconducting radio frequency cavities 222a, which are axially spaced along a common axis. These are supplied with electromagnetic radiation by one or more radio frequency power sources so as to excite an oscillating electromagnetic standing wave within the cavities 222a. The radio frequency power source comprises a low power radio frequency source 225 and a high power amplifier 222b. The electromagnetic energy is communicated to the superconducting radio frequency cavities 222a via a waveguide 222c. A frequency at which the electric field along the common axis oscillates is chosen to substantially match that of the electron beam E. The timing is such that as each bunch of electrons passes through each cavity, the electric field along the common axis accelerates the electrons.

As each bunch of the electron beam E passes through the linear accelerator 22, the electrons in different parts of the bunch will, in general, experience different accelerating forces due to the length of each bunch. For example, electrons towards the front of the bunch will experience a different accelerating force to those towards the rear of the bunch since the electromagnetic standing wave within the superconducting resonant cavities at a given point on the common axis will change in the time taken for the electron bunch to traverse that point. Therefore, in addition to accelerating the electron beam, the linear accelerator 22 will also introduce a correlation between the energy of the electrons and their position within the bunch. Such an energy-position correlation is known as a 'chirp' of the electron bunch.

By convention, if the energy of the individual electrons increases towards the front (rear) of the electron bunch then the chirp of the electron beam may be said to be positive (negative). The chirp of the electron bunches in the electron beam E may be positive or negative depending on whether the electron bunches are accelerated (or decelerated) on the rising or falling slope of the radio frequency electromagnetic wave. Although the radio frequency standing wave may be sinusoidal, for relatively short electron bunches, wherein the time taken for the electron bunch to traverse a given point on the common axis is relatively short, the chirp of the electron beam E may be substantially linear. For longer electron bunches, the chirp may not be linear.

The magnetic compressor 234 is arranged to compress the electron bunches in the electron beam E along a direction of propagation of the electron beam. Further, the compression is dependent on the chirp of the electron bunches as they enter the magnetic compressor. For example, the magnetic compressor 234 may comprise a plurality of magnets arranged to spread each electron bunch and subsequently recombine it so that the length of a path followed by each electron as it passes through the magnetic compressor 234 is dependent upon its energy. Such an arrangement can be used to use a given chirp to compress the beam. For example, the magnetic compressor 234 may be arranged such that for an electron bunch with a negative chirp (i.e. the electrons towards the rear of the bunch have more energy than those towards the front of the bunch) higher energy electrons within each bunch follow a shorter path than lower energy electrons.

Altering the charge density distribution of the electrons in the electron bunches along their propagation direction will alter a gain of the undulator 24 (the conversion efficiency is dependent on the peak current of the electron bunches). In turn, this will alter the power of the radiation beam B output by the undulator 24.

Under steady operating conditions, the chirp introduced to electron bunches of the electron beam E as it is accelerated by the linear accelerator 22 may be substantially constant. By either: (a) altering this chirp slightly before the electron beam E enters the magnetic compressor 234; or (b) altering the magnetic compressor 234 such that it applies a different compression for a given chirp, the charge density distribution of the electron beam along its propagation direction can be controlled before it enters the undulator 24. In turn, this provides a mechanism to control the power of the radiation beam B output by the undulator 24. The adjustable compressor 230 is operable to control the power of the radiation beam B by altering the chirp of the electron bunches in the beam E slightly before they enter the (passive) magnetic compressor 234. Therefore, advantageously, the arrangement of FIG. 12 provides a free electron laser whose output power can be actively controlled.

The magnetic compressor 234 is passive and remains fixed. The resonant cavity 232 is arranged to control the chirp of the electron beam before it enters the magnetic compressor 234. By using the resonant cavity 232 to increase or decrease the chirp of the electron bunches in the electron beam E the power of the radiation beam B output by the undulator 24 can be controlled.

The resonant cavity 232 is provided separate from the linear accelerator 22. The resonant cavity 232 is 'phase locked' with the linear accelerator 22, i.e. the resonant cavity 232 operates at substantially the same frequency as the linear accelerator 22 and is arranged such that a phase of the resonant cavity 232 with respect to the electron beam E remains substantially constant. This may be achieved by using the same low power radio frequency power source 225 to supply electromagnetic energy to the linear accelerator 22 and the resonant cavity 232. The resonant cavity 232 is provided with its own amplifier 236 and electromagnetic energy is communicated from the amplifier 236 to the resonant cavity 232 via a waveguide 238.

The free electron laser of FIG. 12 further comprises a controller CT. The controller CT is operable to receive an input signal S from a sensor apparatus ST which measures the power of the EUV radiation beam B output from the undulator. In response to the signal S, the controller CT is operable to adjust the electromagnetic power that is supplied to the resonant cavity 232 via the amplifier 236 and waveguide 238. Thus, a feedback-based control loop is provided which comprises the sensor apparatus ST, the controller CT and the adjustable compressor 230. The feedback-based control loop may be used to reduce fluctuations in the power of the EUV radiation beam (e.g. when the power is averaged over a time period such as around 1 ms). The feedback-based control loop may be used to keep variations of EUV radiation dose incident upon substrate target locations below a desired threshold.

As described above, the adjustable compressor 230 of FIG. 12 may be used to control the power of the radiation beam B by altering the chirp of the electron bunches in the electron beam E slightly before they enter the (passive)

magnetic compressor 234. Alternatively or in addition, the adjustable compressor 230 of FIG. 12 may be used to control an average energy of the electron beam E before it enters the undulator 24.

A relatively small alteration to the mean energy of the electron bunches in the electron beam E before they enter the undulator 24 will result in an alteration of the wavelength of the output radiation beam B. In turn, this will also result in an alteration of the power of the output radiation beam B. This is a result of two factors: (i) a small change in the average energy of each bunch will affect the gain of the free electron laser; and (ii) the energy of each photon produced in the undulator 24 is dependent upon its wavelength. Therefore, advantageously, such an arrangement provides a free electron laser whose output power and wavelength can be actively controlled.

The free electron laser of FIG. 12 may form part of the lithographic system LS of FIG. 1, wherein radiation produced by the free electron laser is ultimately received by one or more substrates W within one or more lithographic apparatuses $LA_a$-$LA_n$. These substrates may be exposed using scanning exposures, wherein a given target location on a substrate W is illuminated by EUV radiation for a predetermined period of time (e.g. around 1 ms). Within the lithographic system LS, radiation is transported from the free electron laser to the substrates via: (i) a beam delivery system (for example comprising a beam splitting apparatus 19); and (ii) optics within the lithographic apparatuses $LA_a$-$LA_n$ (for example optics 10, 11, 13, 14—see FIG. 2). For thermal reasons, the optics within the beam delivery system may comprise mainly grazing incidence mirrors and, as such, a combined reflectivity of these optics may be relatively independent of the wavelength of the radiation beam B. In contrast, optics within the lithographic apparatuses $LA_a$-$LA_n$ may comprise near normal incidence mirrors, and may comprise multilayer mirrors that are optimized for a given nominal wavelength. As such, a combined reflectivity of the optics within the lithographic apparatuses $LA_a$-$LA_n$ may be strongly dependent on the wavelength, and bandwidth, of the radiation beam B.

A change in the output power of the radiation beam B will directly affect a dose of radiation delivered by the free electron laser to a target location on a substrate W. Furthermore, for the reasons explained above, altering the wavelength of the radiation beam B will affect the dose of radiation delivered to a target location on the substrate. The change in wavelength of the radiation beam may have a greater effect on the dose delivered to the target location by the radiation source than the change in the power of the radiation beam. The feedback-based control loop comprising the sensor apparatus ST, the controller CT and the adjustable compressor 230 may be used to reduce fluctuations in the power and wavelength of the radiation beam B. This may in turn keep variations of EUV radiation dose incident upon substrate target locations below a desired threshold.

The adjustable compressor 230 may operate in a plurality of different modes. For example, the adjustable compressor 230 of FIG. 12 may be used to control the charge density distribution of the plurality of electron bunches along their propagation direction before they enter the undulator 24. Alternatively, the adjustable compressor 230 of FIG. 12 may be used to control an average energy of electrons in the plurality of electron bunches before they enter the undulator 24. In a further alternative, the adjustable compressor 230 of FIG. 12 may be used to control both: (i) the control charge density distribution of the plurality of electron bunches along their propagation direction before they enter the undulator 24; and (ii) an average energy of the plurality of electron bunches before they enter the undulator 24. The controller CT may be operable to switch the adjustable compressor 230 from one mode of operation to another. This may be achieved by altering a phase of the electromagnetic wave within the resonant cavity 232 relative to the electron beam E. The controller CT may be provided with an input mechanism (not shown), which may allow a user to select a mode of operation for the adjustable compressor 230.

In order to alter the chirp of the plurality of electron bunches before they enter the magnetic compressor 234 (for example in the first mode), the phase of the electromagnetic wave within the resonant cavity 232 may be such that an electric field within the cavity 232 is substantially zero for electrons at a centre of each bunch of the electron beam E passing through the resonant cavity. For such an arrangement, the change in the chirp of each electron bunch is defined by the amplitude of RF field oscillations within the resonant cavity 232. Advantageously, since such an arrangement only adjusts the chirp of the electron bunches and does not change a mean energy of electrons within the electron bunches, the radio frequency power required to drive the resonant cavity 232 does not depend on the average current of the electron beam E. Therefore, the power required is low and it is possible to use a less efficient, complex and expensive resonant cavity to alter the chirp.

In order to alter an average energy of the electrons in each electron bunch before it enters the undulator 24 (for example in the second mode), the phase of the electromagnetic wave within the resonant cavity 232 may be such that an electric field within the cavity is substantially at its maximum or minimum value for electrons at a centre of each bunch of the electron beam E passing through the resonant cavity 232. With such an arrangement, the resonant cavity 232 tends to accelerate or decelerate the electron beam E as it propagates through the cavity 232, altering the average energy of the electrons within each bunch. For such an arrangement, the change in the average energy of electrons within each bunch is defined by the amplitude of RF field oscillations within the resonant cavity 232.

In the first mode of operation, varying the electromagnetic power that is supplied to the resonant cavity 232 will in turn vary the charge density distribution of the electron bunches and therefore the power of the radiation beam B output by the undulator 24. In the second mode of operation, varying the electromagnetic power that is supplied to the resonant cavity 232 will vary the average energy of the electrons within each electron bunch and therefore the wavelength (and, to a lesser extent, the power) of the radiation beam B output by the undulator 24. Therefore, since the controller CT varies the electromagnetic power that is supplied to the resonant cavity 232 in response to the signal S received from the sensor apparatus ST, the arrangement of FIG. 12 provides a convenient feedback system for control of the power and/or wavelength of the output radiation beam B. This active feedback system may, for example, be used to stabilize a dose of radiation provided by the radiation beam to a target location on a substrate.

The sensor apparatus ST may be arranged to determine a total power and/or an intensity distribution of the main radiation beam B output by the undulator 24. The controller CT may determine, based on the total power and/or an intensity distribution of the main radiation beam B and the spectral response of the optical path between the undulator 24 and the substrate W, how the dose received at the substrate W will vary as the electromagnetic power that is supplied to the resonant cavity 232 via the amplifier 236 and waveguide 238 is varied.

A dependence of the dose received at a substrate target location on the wavelength and power of the radiation beam B may be determined during a calibration step, prior to exposure of a substrate W. This may be achieved by measuring a dose of radiation received at the substrate table WT for a plurality of different wavelengths and/or total powers of the main radiation beam B. During this calibration step (before exposure of a substrate W), the dose may for example be measured using a sensor disposed on the substrate table WT. The dose of energy received by a target location on a substrate may be an integral with respect to time of a power of the radiation beam over an exposure time period. The exposure time period may, for example, be of the order of 1 ms. The plurality of different wavelengths may be produced by varying the electromagnetic power that is supplied to the resonant cavity 232 via the amplifier 236 and waveguide 238 to vary the wavelength. In this way, a calibration map may be determined, which characterizes the dependence of the dose received by the substrate W on the wavelength and power of the radiation beam B. The calibration map may be stored in a memory, which may be accessible by the controller CT. This approach may be used in connection with other embodiments of the invention which control the power of the radiation beam B (or other properties of the radiation beam).

The controller CT may be operable to convert the wavelength, bandwidth, total power and/or an intensity distribution of the main radiation beam B into a dose of radiation that would be received by a target location on a substrate W during an exposure time period. This conversion may use a calibration map that was determined previously and which may be stored in a memory. Advantageously, this provides a convenient active feed-back system for control of the dose of radiation received by a target location on a substrate W, which may, for example, be used to stabilize said dose. This approach may be used in connection with other embodiments of the invention which control the power of the radiation beam B (or other properties of the radiation beam).

In some embodiments, the resonant cavity 232 is a normally conducting resonant cavity. For example, it may be formed from copper. Normally conducting resonant cavities such as, for example, copper cavities have relatively low Q values compared to, for example, the superconducting cavities that are used to accelerate the electron beam E within the linear accelerator 22. Since the bandwidth of a resonator is inversely proportional to its Q value, the radio frequency power of such a normally conducting cavity can therefore be adjusted with high bandwidth. Advantageously, this allows for significantly faster change of the accelerating field gradient within the cavity, as compared to a superconducting RF cavity. Therefore the use of a normally conducting resonant cavity 232 is particularly beneficial since it allows the power and/or wavelength of the radiation beam B output by the free electron laser to be adjusted quickly. This is especially advantageous since it allows a radiation dose supplied by the radiation beam B (for example to a substrate W within one of the lithographic apparatuses $LA_a$-$LA_n$) to be controlled in real time. It may for example allow the radiation dose supplied by the radiation beam to be controlled sufficiently quickly that variations of dose received at target locations are reduced (e.g. control is faster than 1 ms).

Although an arrangement has been discussed wherein the dose of radiation received by a target location may be controlled by varying the wavelength of radiation output by a free electron laser, any radiation source with an adjustable wavelength may alternatively be used for such a dose control method. Further, although the arrangement of FIG. 12 has been discussed within the context of a lithographic system, it may alternatively relate to the control of a dose of radiation received by a target location other than a substrate W within a lithographic apparatus $LA_a$-$LS_8$.

For the arrangement of FIG. 12, wherein the adjustable compressor 230 comprises a passive magnetic compressor 234, in order to provide control over the charge density distribution of the electron beam E along its propagation direction before it enters the undulator 24 the resonant cavity 232 is disposed 'up stream' of the magnetic compressor 234. However if only control over the average energy of the electron beam E before it enters the undulator 24 is desired or required, the resonant cavity 232 may be disposed either 'up stream' or 'down stream' of the magnetic compressor 234.

Figure 13:
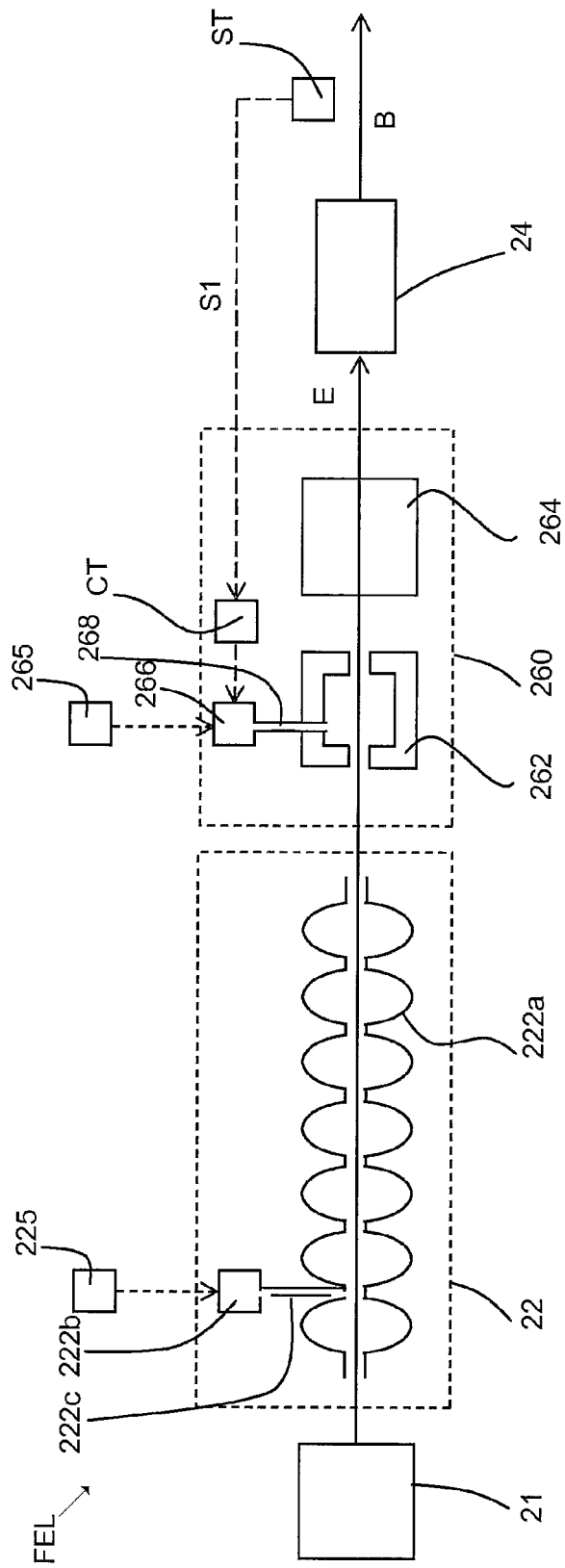
FIG. 13 is a schematic illustration of a free electron laser according to an embodiment of the invention, which may form part of the lithographic system of FIG. 1.

FIG. 13 illustrates an alternative arrangement of a free electron laser comprising an adjustable bunch compressor 260 arranged to continuously vary the chirp of the plurality of electron bunches in the electron beam E and an average energy of electron within the bunches. The adjustable bunch compressor 260 comprises a resonant cavity 262 and a magnetic compressor 264. The resonant cavity 262 is disposed 'up stream' of the magnetic compressor 264, i.e. the electron beam E passes first through the resonant cavity 262 and then through the magnetic compressor 264.

The magnetic compressor 264 is arranged to compress the electron bunches with the electron beam E along a direction of propagation of the electron beam, the compression being dependent on the chirp of the electron bunches as they enter the magnetic compressor 264.

The resonant cavity 262 is separate from the linear accelerator 22. The resonant cavity 262 is provided with an amplifier 266 and electromagnetic energy is communicated from the amplifier 266 to the resonant cavity 262 via a waveguide 268.

The resonant cavity 262 is arranged to operate at a frequency that is, in general, different from that of the electron beam E such that a chirp of the electron bunches and/or an average energy of the electron bunches varies with time. This may be achieved by using different low power radio frequency power sources 225, 265 to supply electromagnetic energy to the linear accelerator 22 and the resonant cavity 262 respectively.

When the frequency of the resonant cavity 262 is different to that of the electron beam E, the resonant cavity 262 will continuously vary the chirp the electron bunches and the mean energy of electrons within the electron bunches. The rate of change of the chirp and mean energy is dependent upon difference between the frequencies of the linear accelerator 22 and the resonant cavity 262. Altering the mean energy of electrons within the electron bunches will alter the wavelength of the radiation beam (as the mean energy increases, the wavelength of the radiation beam decreases). Therefore the arrangement of FIG. 13 provides a mechanism for increasing the effective bandwidth of the radiation output by a free electron laser.

In some embodiments, the resonant cavity 262 is a normally conducting resonant cavity. For example, it may be formed from copper. Normally conducting resonant cavities such as, for example, copper cavities have relatively low Q values compared to, for example, the superconducting cavities that are used to accelerate the electron beam E within the linear accelerator 22. Since the bandwidth of a resonator is inversely proportional to its Q value, the radio frequency power of such a normally conducting cavity can therefore be adjusted with high bandwidth. Advantageously, this allows for significantly faster change of the accelerating field gradient within the cavity, as compared to a superconducting RF cavity. Therefore the use of a normally conducting resonant cavity 262 is particularly beneficial since it allows the power of the radiation beam B output by the free electron laser to be adjusted quickly. It may for example allow the radiation dose supplied by the radiation beam to be controlled sufficiently quickly that variations of dose received at target locations are reduced (e.g. control is faster than 1 ms).

The free electron laser of FIG. 13 further comprises a controller CT. The controller CT is operable to receive an input signal 51 from a sensor apparatus ST. In response to the signal S1 the controller CT is operable to vary one or more parameters of the resonant cavity 262. For example, the controller CT may be operable to vary the electromagnetic power that is supplied to the resonant cavity 262 via the amplifier 266 and waveguide 268. Alternatively or additionally, the controller CT may be operable to vary the frequency of the electromagnetic standing wave within the radio frequency cavity 262. This may be achieved by adjusting both: (a) a frequency of the electromagnetic radiation supplied to the resonant cavity 262 by the low power source 265; and (b) a geometry of the resonant cavity 262 to maintain a resonance condition. The geometry of the resonant cavity 262 may be altered using, for example, one or more piezoelectric stretchers and/or compressors to match a resonant frequency of the resonant cavity 262 to the frequency of the low power radio frequency source 265.

The sensor apparatus ST may be arranged to output a value indicative of a power of the radiation beam B. Advantageously, this provides a convenient feedback-based control loop for control of the power of the output radiation beam B, which may, for example, be used to stabilize said power. The controller CT may use the power measured by the sensor apparatus ST, together with the calibration described above, to calculate a dose of radiation delivered to a target location on a substrate by the radiation beam B, and to adjust the power of the radiation beam accordingly. The dose of energy received by the target location may be an integral with respect to time of a power of the radiation beam over an exposure time period. The exposure time period may, for example, be of the order of 1 ms.

The described embodiments of a free electron laser comprise an adjustable bunch compressor 230, 260 disposed downstream of the linear accelerator 22 and upstream of the undulator 24. That is, the electron beam E passes through the linear accelerator 22, the adjustable bunch compressor 230, 260 and the undulator 24 in that order. However, in alternative embodiments the free electron may comprise an adjustable bunch compressor which is disposed upstream of the linear accelerator 22. As with the above embodiments, this adjustable bunch compressor may be operable to control at least one of: (i) a charge density distribution of each of the plurality of electron bunches along a direction of propagation of the electron beam before it enters the undulator; or (ii) an average energy of each of the plurality of electron bunches before it enters the undulator. For example, the adjustable bunch compressor may comprise a beam buncher within the injector 21, which may comprise a resonant cavity. For such embodiments, the electrons within the electron bunches are not relativistic. Therefore an energy chirp imposed by the beam buncher may cause a significant difference of velocities of electrons at a head and a tail of each bunch. Therefore, for such embodiments the adjustable compressor may not comprise a magnetic compressor.

Figure 14:
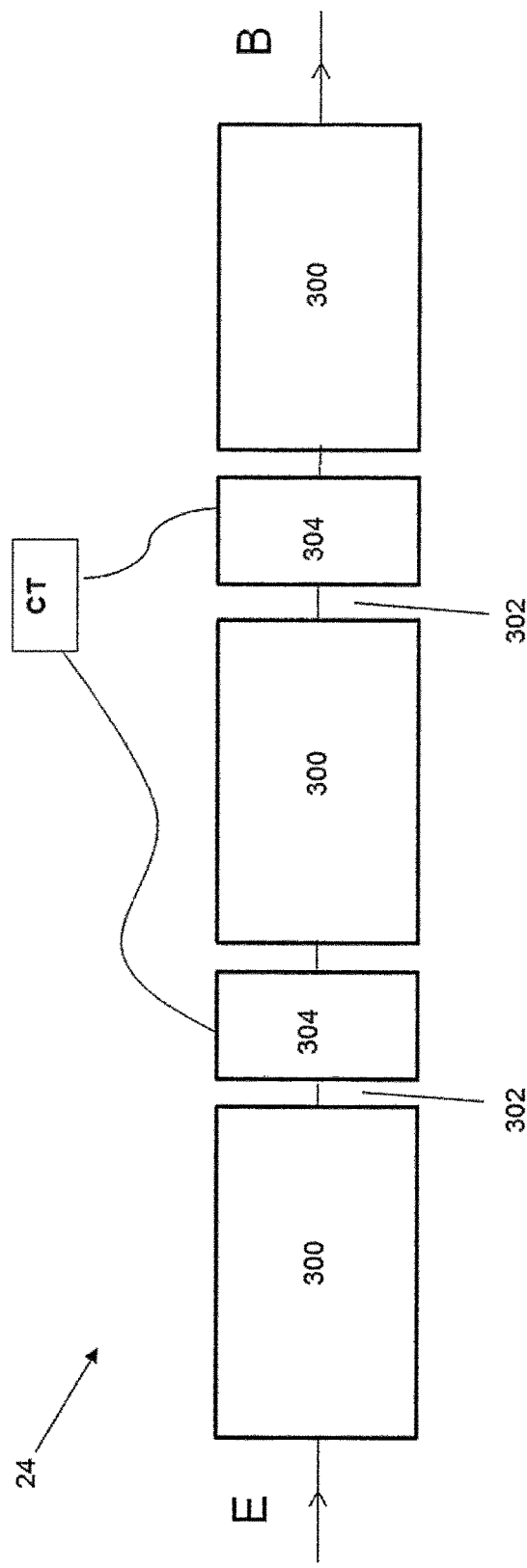
FIG. 14 schematically depicts an undulator of the free electron laser according to an embodiment of the invention.

FIG. 14 shows schematically an undulator 24 according to an embodiment of the invention. The undulator comprises three modules 300. Each undulator module 300 comprises a periodic magnet structure which guides an electron beam E along a periodic path such that the electrons radiate electromagnetic radiation in the direction of a central axis of their periodic path, thereby forming an EUV radiation beam B (which may be considered to be a laser radiation beam). Gaps 302 are provided between the undulator modules 300. Dynamic phase shifters 304 are located in the gaps. The term "dynamic phase shifter" may be interpreted as meaning as phase shifter which can be controlled to apply a phase shift or not apply a phase shift, and/or controlled to apply phase shifts of different sizes and/or magnitudes. The dynamic phase shifters 304 are controlled by a controller CT. Although three undulator modules 300 are shown in FIG. 14, the undulator 24 may comprise more undulator modules (or less undulator modules). Similarly, although two dynamic phase shifters 304 are shown in FIG. 14, more than two dynamic phase shifters may be provided or a single dynamic phase shifter may be provided.

During operation of the free electron laser the efficiency with which the electron beam power is converted to laser radiation beam power is affected by the relative phase between the oscillating motion of electrons in the periodic magnetic field of the undulator modules 300 and the phase of the electromagnetic wave of the radiation beam (i.e. the phase of radiation already produced upstream in the undulator by oscillating motion of the electrons).

The gaps 302 between undulator modules 300 each introduce a phase shift between the electron transverse velocity and the phase of the electromagnetic field of the radiation beam B. When these are in phase (i.e. the phase difference is close $2*\pi*N$, where N is an integer), energy is transferred from the electrons to the radiation beam B (this is the amplification process of the free electron laser). When the phase difference is close to $(2*N+1)*\pi$, the phase difference causes the electrons to gain energy from the radiation beam, thus reversing the amplification process of the free electron laser. The phase shift $\Phi$ introduced by a gap between two undulator modules is governed by:

$$\phi = \frac{L_g}{2\gamma^2 \lambda_r} = \frac{L_g}{\lambda_u \left(1 + \frac{K^2}{A}\right)} \quad (4)$$

where $L_g$ is the length of the gap 302 (the distance from the end of a first undulator module to the beginning of the next undulator module), $\gamma$ is the Lorentz factor of the electrons, $\lambda_r$ is the wavelength of radiation, $\lambda_u$ is the period of the undulator, K is the undulator parameter and A is dependent upon the geometry of the undulator and the resulting radiation beam polarization (as explained above in connection with Eq. (1).

As can be seen from Eq. (4) in normal circumstances the phase shift $\varphi$ introduced by each gap 302 is fixed. However, the phase shift may be modified using a dynamic phase shifter 304. The controller CT may control the dynamic phase shifter to control the phase shift and thereby control the efficiency with which the electron beam is converted to photons. Thus, the controller CT may use the dynamic phase shifter to control the power of the EUV radiation beam B emitted from the undulator 24.

Figure 15:
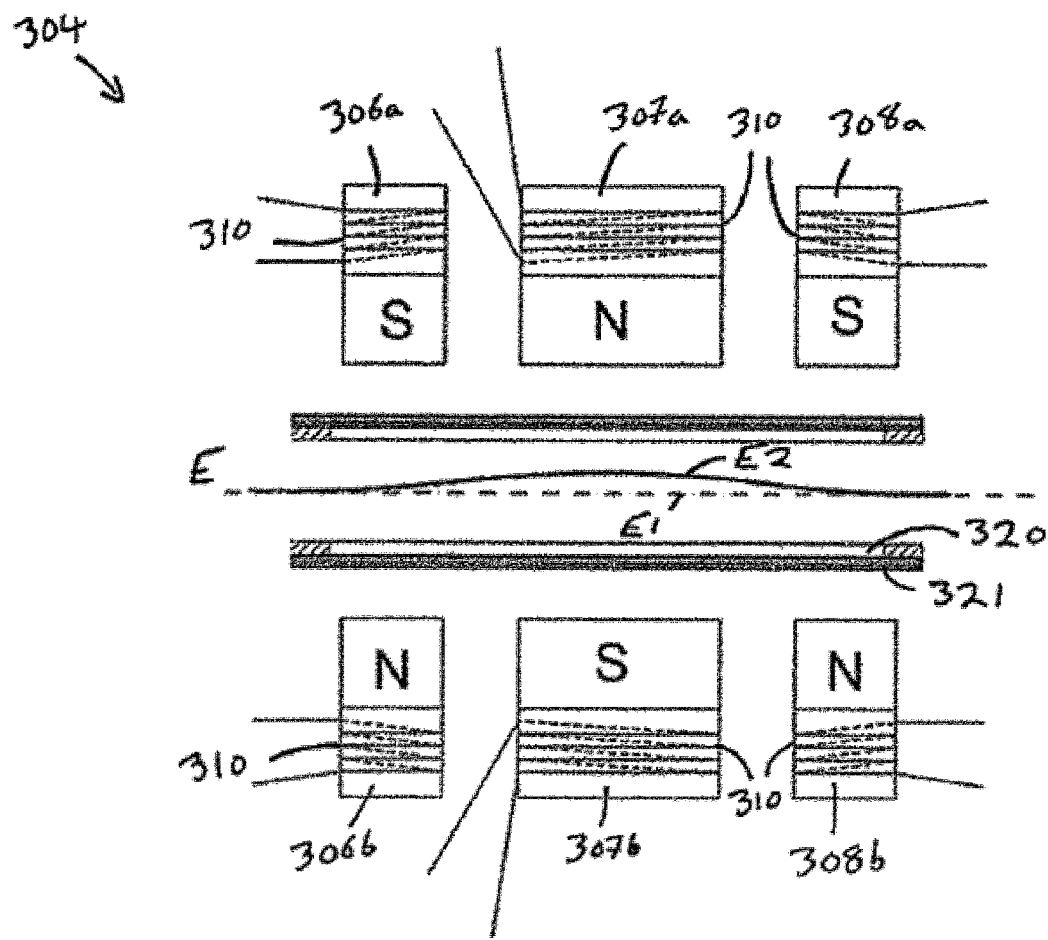
FIG. 15 schematically depicts an embodiment of a dynamic phase shifter which may form part of the undulator.

FIG. 15 shows schematically an example of a dynamic phase shifter 304. The dynamic phase shifter 304 comprises three pairs of electromagnetics 306-308, an electromagnet of each pair being located on either side of the trajectory of the electron beam E. The first pair of electromagnets 306a,b comprises a first magnet 306a formed from ferrite material and loops of wire 310 arranged such that a south pole which faces the electron beam trajectory is generated when current is supplied to the wire. The second electromagnet 306b of the pair comprises ferrite material with loops of wire 310 arranged such that when current passes through the wire a north pole which faces the electron beam trajectory is generated. Thus, when current flows through the wires a magnetic field extends across the electron beam trajectory. When current does not flow through the wires the magnetic field is not present.

The second electromagnet pair 307a,b similarly comprises two pieces of ferrite material around which loops of wire 310 are provided. However, in this case the north and south poles generated by current passing through the wires 310 are on opposite sides of the electron beam trajectory (relative to the first pair of electromagnets 306a,b). In addition, the second electromagnet pair 307a,b is configured to generate a magnetic field which is double the size of the magnetic field generated by the first electromagnet pair. Thus, when current flows through the wires a magnetic field extends across the electron beam trajectory which is opposite in sign and twice as large as the magnetic field generated by the first electromagnet pair 306a,b.

The third pair of electromagnets 308a,b has the same configuration as the first pair of electromagnets 306a,b. Thus, when current flows through the wires this pair of electromagnets 308a,b provides a magnetic field which extends across the electron beam trajectory with the same sign and magnitude as the magnetic field generated by the first pair of electromagnets 306a,b.

In use, when no current is flowing through the wires of the electromagnets 306-308 the electron beam E travels without its trajectory being modified (i.e. along the trajectory indicated by the dashed line E1). When current flows through the wires the electromagnets 306-308 introduce bends into the trajectory of the electron beam E such that the electron beam follows the longer path indicated by the solid line E2 in FIG. 15.

The first pair of electromagnets 306a,b bends the trajectory of the electron beam in a first direction (upwards in FIG. 15). The second pair of electromagnets 307a,b applies a bend in the opposite direction with twice the magnitude (the electron beam bends downwards in FIG. 15). Finally, the third pair of electromagnets 308a,b applies a further bend to the electron beam (upwards in FIG. 15). This further bend corresponds with the bend applied by the first pair of electromagnets 306a,b and as a result returns the electron beam E to its initial trajectory. The trajectory of the electron beam E2 when the electromagnets are active may be referred to as a chicane.

As may be seen from FIG. 15, the trajectory of the electron beam E on leaving the dynamic phase shifter 304 is the same irrespective of whether or not current is flowing through wires 310 of the electromagnets 306-308 (i.e. irrespective of whether or not the electromagnets are active). However, the length of the trajectory E2 traveled by the electron beam when the electromagnets are active is greater than the length of the trajectory E1 traveled by the electron beam when the electromagnets are not active. Consequently, activating the electromagnets 306-308 introduces a phase shift into the electron beam E which is not present when the electromagnets are not active. Since the phase shift affects the conversion efficiency of the electron beam to EUV radiation, the electromagnets 306-308 can be used to change the power of the EUV radiation beam emitted by the undulator 24 of the free electron laser FEL.

The phase difference introduced into the electron beam E by the dynamic phase shifter 304 may be calculated as follows:

$$\Delta\phi = \frac{2\pi\Delta l}{\lambda_r}\left(\frac{e}{mc\gamma}\right)^2 (l_m B_0)^2 \sim 2.158 * 10^9 \frac{\Delta l[m]}{\lambda_r[nm]}\left(\frac{l_m B_0[Tmm]}{\gamma}\right)^2 \quad (5)$$

where $\Delta l$ is the distance between centers of the first pair of electromagnets 306a,b and the second pair of electromagnets 307a,b along the electron trajectory, m is the electron mass, c is the speed of light, $l_m$ is the length of the first electromagnet pair along the electron trajectory, and $B_0$ is the strength of the magnetic field generated by the first electromagnet pair (and by the third electromagnet pair 308).

In an embodiment, it may be desired to apply a phase shift of $\pi$ using the dynamic phase shifter 304. In a free electron laser generating EUV radiation the following parameters may apply: $\lambda_r$=13.5 nm, $\gamma$~1500, $\Delta l$=0.5 m and $l_m$=0.1 m. Where these parameters apply the magnitude of the magnetic field $B_0$ needed in order to introduce a phase shift of $\pi$ is around 0.01 T. This is a relatively small magnetic field and may be generated using an appropriate ferrite material such as MnZn or NiZn.

The size of the bend of electron trajectory (which may be referred to as a kick angle) applied by a pair of electromagnets 306-308 may be estimated as follows:

$$\alpha[Rad] = 0.586 * \left(\frac{l_m B_0[Tmm]}{\gamma}\right) \quad (6)$$

When the above example parameters are used this will increase the path length of the electron beam trajectory by around 0.03 mm.

The electromagnets 306-308 of the dynamic phase shifter 304 may all be activated by the same wire 310. That is, current from a single source passes through each of the electromagnets 306-308. An advantage of this arrangement is that it ensures that the electromagnets 306-308 are all activated together and switched off together. This avoids the possibility that one electromagnet is switched on without the others, which would cause deviation of the beam trajectory output from the dynamic phase shifter 304. The deviated beam would be likely to be incident upon a component of the free electron laser and cause damage to that component.

The electron beam E may be surrounded by a protective tube 320. The protective tube 320 acts to protect components outside of the tube from wake-field disturbances and from electrons which are lost from the electron beam E. The protective tube 320 also seals the electron beam E from an external environment in order to allow a vacuum to be established. The protective tube 320 may be made from a conducting material such as copper or aluminum. The protective tube 320 may be supported by a supporting tube 321 which may be formed from a dielectric material.

Figure 16:
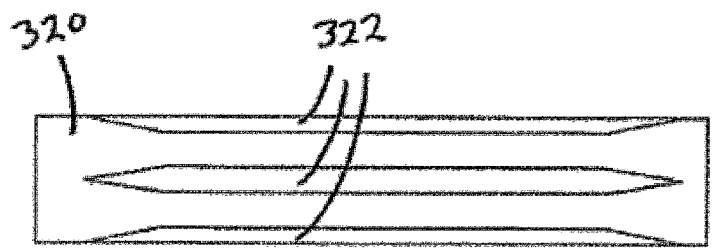
FIG. 16 schematically depicts a protective tube which may form part of the undulator.

As shown in FIG. 16, the protective tube 320 may be provided with openings 322 which run parallel to the electron beam trajectory. The openings 322 are positioned to allow the magnetic fields generated by the electromagnets 306-308 to pass through the protective tube such that they can act to modify the trajectory of the electron beam E. The openings may be sealed (e.g. using dielectric material) in order to prevent leakage of vacuum from within the protective tube 320. The openings 322 may have tapered ends in order to minimize wake-field induced heating and electron bunch degradation (which could occur, for example, if the openings had squared-off ends).

In an alternative arrangement, instead of providing holes in the protective tube 320 the thickness of the tube may be made thinner than the skin layer thickness which is expected for a frequency of operation of the electromagnets 306-308. For example, if the electromagnets generate an oscillating magnetic field at a frequency of around 100 kHz, then the skin depth for copper or aluminum will be a few hundred microns. The frequency of wake-field disturbances associated with electron bunches of the electron beam E is of the order of GHz, and thus a field penetration depth of a few microns may be expected. Therefore, a conducting protective tube 320 with a wall thickness which is greater than a few microns but less than a few hundred microns will protect the electromagnets 306-308 from wake-field disturbances whilst at the same time allowing the electromagnetic field generated by the electromagnets 306-308 to modify the trajectory of the electron beam. In embodiments in which the conductive wall is thin (e.g. hundreds of microns or less), the supporting tube 321 may provide structural support for the conductive wall. In general, the conductive wall thickness may be greater than 10 microns. In general, the conductive wall thickness may be less than 1 mm.

The above described alternative arrangements may be combined. For example, openings 322 in a metal protective tube 320 that are filled with dielectric material may in addition be provided with a thin layer of conducting material (e.g. on an inner surface). This is beneficial since it prevents charging of the dielectric material and thus prevents damage occurring due to subsequent electrical discharges.

Figure 17:
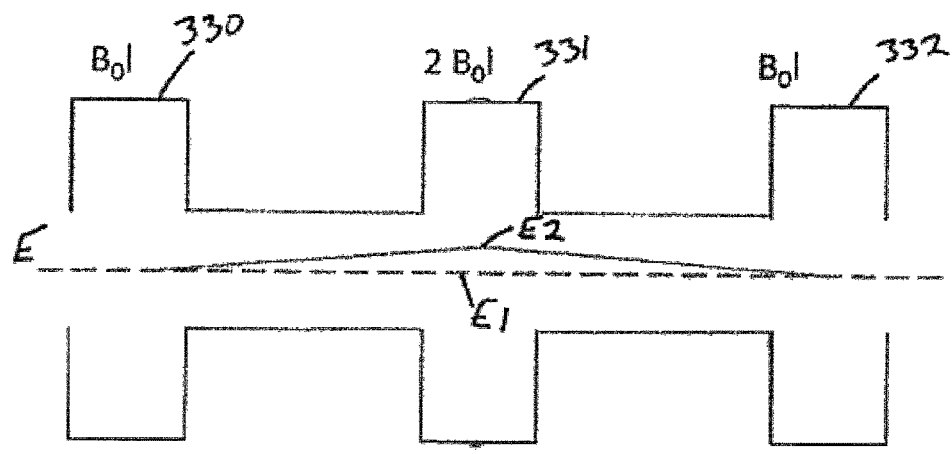
FIG. 17 schematically depicts an alternative embodiment of a dynamic phase shifter.

An alternative embodiment of a dynamic phase shifter 304 is shown schematically in FIG. 17. The alternative embodiment comprises three transverse kick cavities 330-332. The transverse kick cavities are generally cylindrical cavities having a central axis which corresponds with the electron beam trajectory E and which generate electromagnetic fields that cause the electron beam to deviate from a straight-line path E1 (i.e. to follow a chicane path E2 as shown schematically). The transverse kick cavities 330-332 are activated by supplying RF power to them. Thus, the transverse kick cavities 330-332 may be activated and switched off by supplying and removing RF power. Alternatively, RF power may be supplied continuously to the transverse kick cavities, and the shapes of the cavities may be adjusted to move the cavities into and out of resonance with the RF power. The kicking field is at its nominal size when the cavity is in resonance and is approximately zero when the cavity is out of resonance. The shapes of the cavities may be adjusted using tuning elements (not shown) provided in the cavities.

The effect of the transverse kick cavities 330-332 is identical to the effect of the electromagnets 306-308. The transverse kick cavities 330-332 may be used to selectively introduce a phase shift to the electron beam E. As explained above, the phase shift will in turn affect the conversion efficiency of the undulator and therefore affect the power of EUV radiation output from the free electron laser.

In an embodiment, the separation between adjacent undulator modules 300 may be selected to provide an electron beam phase change which is an integer multiple of $2\pi$. Where this is done, the relative phase between the oscillating motion of electrons in periodic magnetic field in the undulator modules 300 and the electromagnetic field of the radiation beam B does not change between undulator modules when the dynamic phase shifter 304 is not active. In an embodiment, the dynamic phase shifter 304 may configured to apply a phase shift of approximately $\pi$. Thus, modulating operation of the dynamic phase shifter will apply a $\pi$ phase shift to the electron beam.

As explained further above, it may be desirable to control the power of the EUV radiation beam generated by the free electron laser FEL with a control frequency of around 10 kHz or higher (e.g. around 100 kHz or more). This will allow control of the dose of EUV radiation received by a target location on a substrate (for example if the target location is exposed for 1 ms). The dynamic phase shifter 304 may thus be configured to operate at a frequency of 10 kHz or higher. For an embodiment which uses electromagnets a ferrite material which is capable of operating at such frequencies may be used. MnZn or NiZn are examples of ferrite material which is capable of operating at these frequencies. In general, fast ferrite material may be used. In an embodiment, one or more of the electromagnets may be an air-coil (i.e. a loops of wire without a core of ferrite material). For embodiments which use transverse kick cavities an RF power supply with a control frequency of 10 kHz or higher may be used. Additionally or alternatively a cavity tuning element with a control frequency of 10 kHz or higher may be used.

An advantage of using a dynamic phase shifter 304 to modify the power of EUV radiation emitted by the free electron laser FEL is that it does not affect properties of electron bunches before they arrive at the undulator 24. Thus, referring to FIG. 3, the accelerator 22 used to accelerate electron bunches of the electron beam E may be unaffected. If the free electron laser FEL uses recirculation of the electrons through the accelerator 22 to decelerate electrons after generation of electromagnetic radiation by the undulator 24, then the electrons which pass into the accelerator for deceleration will have been affected by the dynamic phase shifter 304. However, a change of energy of the electrons caused by the dynamic phase shifter 304 will typically be around 0.1%, and thus has only a very minor influence upon the accelerator 22.

In an embodiment, a pair of dynamic phase shifters 304 may be provided (e.g. as shown in FIG. 14), each dynamic phase shifter being provided in a different gap 302. Where this is done the first dynamic phase shifter may be arranged to apply a first phase shift and the second dynamic phase shifter arranged to apply a second phase shift. The first and second phase shifts may for example have different magnitudes. The first and second phase shifts may for example have the same magnitudes but opposite signs.

In one control scheme the phase shifts applied by the dynamic phase shifters 304 may be equal in magnitude but opposite in sign. If a phase shift is already present in the electron beam E before it reaches the dynamic phase shifters then one of the dynamic phase shifters 304 may act to increase the size of that phase shift and the other may act to decrease the size of the phase shift. The combined effect of the two dynamic phase shifters 304 on the electron beam E will be no resultant change of phase. Thus, the conversion efficiency of the undulator 24 when the dynamic phase shifters 304 are active will be the same as the conversion efficiency when the dynamic phase shifters 304 are not active.

Alternatively, a control scheme may be implemented such that only one of the two dynamic phase-shifters is active at any given time. Operation of either dynamic phase shifter will modify radiation amplification in the undulator by the same amount. As a result, the output radiation beam will have the same power irrespective of which dynamic phase shifter is active.

Alternatively, a control scheme may be implemented such that the two dynamic phase shifters are adjusted together, the adjustments having magnitudes and signs such that the power of the output radiation beam does not change. The adjustments may be pre-determined magnitudes and signs and/or may be calibrated and monitored magnitudes and signs.

In all three above described control schemes the power of the EUV radiation beam will remain the same. However, because the phase of electrons when they are travelling between the two dynamic phase shifters 304 is modified, this will alter generation of the radiation beam E in the undulator 300 which is between the dynamic phase shifters. The radiation beam E will be generated with a modified bandwidth and/or spatial power distribution of the radiation in the undulator 300 which is between the dynamic phase shifters. Radiation beam generation may also be modified in undulators downstream of dynamic phase shifters. Therefore, when the dynamic phase shifters 304 are active the radiation beam E is generated with the same power but a different bandwidth and/or power distribution (compared with the radiation beam generated when the dynamic phase shifters are not active). As explained elsewhere in this document, the collective transmission of mirrors of the lithographic system is wavelength dependent. The mirrors also have finite spatial/angular acceptance. Therefore, changing the radiation beam bandwidth and/or power distribution using the dynamic phase shifters 304 may be used to control the dose of radiation delivered to a substrate by a lithographic apparatus. The effect of bandwidth and/or spatial power distribution changes caused by dynamic phase shifters 304 on the power of radiation delivered by a lithographic apparatus projection system PS may be calibrated and the results of the calibration used by the controller CT when controlling the dynamic phase shifters 304.

The above approach can be generalized to use more than two dynamic phase shifters. The effect of different combinations of phase shifters on the radiation beam power delivered by a lithographic apparatus projection system PS may be measured and then subsequently used by the controller CT to control the radiation beam bandwidth and/or spatial power distribution. For example, ten dynamic phase shifters may be provided, and different combinations of dynamic phase shifters may be activated and switched off by the controller CT in order to achieve different variations of the power of the radiation beam delivered by the projection system (e.g. without significantly changing the power of the radiation beam as output from the free electron laser).

Embodiments have been described in which control of the dynamic phase shifters 304 comprises switching between the dynamic phase shifters being active and not being active (e.g. modulated between being on and off). The size of the phase shift applied by a dynamic phase shifter when it is active may also be controlled (e.g. by the controller CT). This may be achieved for example by adjusting the size of the current supplied to the electromagnets 306-308, thereby adjusting the size of the phase shift that is applied by the dynamic phase shifter.

FIGS. 18-27 depict various configurations of sensor apparatus which may comprise the sensor apparatus ST referred to above in connection with various embodiments of the invention.

Figure 18:
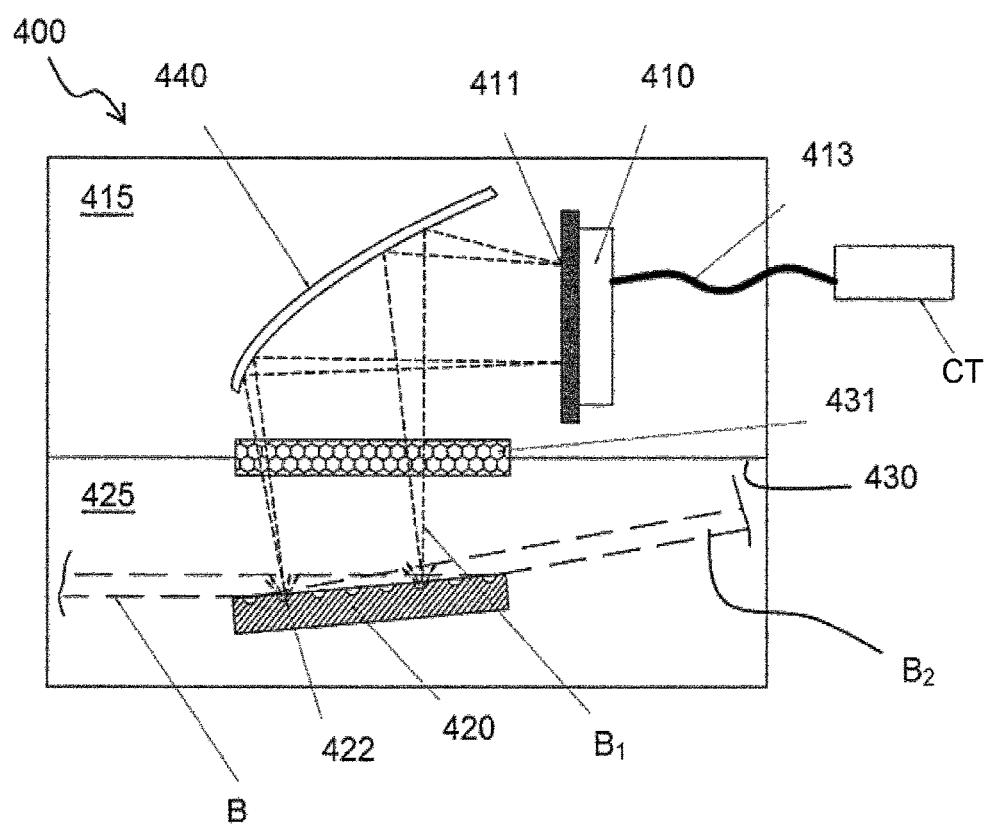
FIG. 18 schematically depicts an embodiment of a measurement apparatus according to an embodiment of the invention.

Referring first to FIG. 18, a first embodiment of a sensor apparatus 400 for determining a value indicative of a power of an EUV radiation beam B is shown. The sensor apparatus 400 comprises a sensor 410 and an optical element 420 for receiving a main radiation beam $B_m$. The sensor 410 may comprise an array of sensing elements such as, for example, charged coupled devices (CCDs) and/or photodiodes. The optical element 420 is a mirror, which may be a grazing incidence mirror. The EUV radiation beam B may, for example, be the primary radiation beam B produced by the free electron laser FEL or one of the secondary radiation beams $B_a$-$B_n$ produced by the beam splitting apparatus 20.

The sensor 410 is disposed in a sensing environment 415 and the optical element 420 is disposed in a main beam environment 425. In general, conditions within the sensing environment 415 may differ from those in the main beam environment 425. For example, the radiation beam B may comprise EUV radiation and therefore the main beam environment 425 may be held at vacuum conditions. In this embodiment, a wall 430 separates the sensing environment 415 from the main beam environment 425. A transparent membrane or window 431 is provided in the wall 430.

Figure 19:
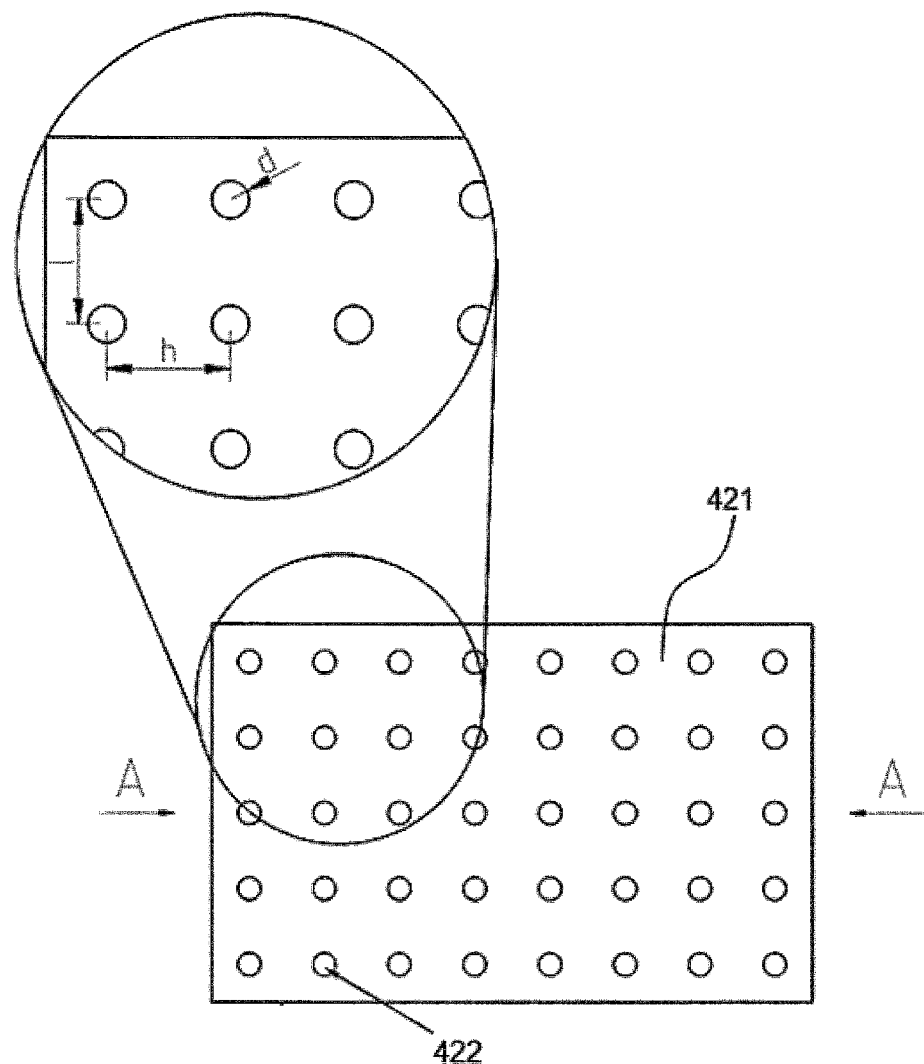
FIG. 19 schematically depicts a plan view of an optical element that forms part of the measurement apparatus of FIG. 18.

Referring to FIG. 19, a reflective surface 421 of the optical element 420 is generally smooth but is provided with a plurality of marks 422 distributed over the reflective surface. In the present embodiment, each of the plurality of marks 422 is of the form of a generally hemi-spherical recess in the reflective surface 421. The plurality of marks 422 may for example be etched into the reflective surface using any suitable process such as, for example, ion milling. The plurality of marks 422 form a first region of the optical element 420 that is arranged to receive a first portion of the radiation beam B. The remaining substantially smooth portion of the reflective surface forms a second region of the optical element 420 that is arranged to receive a second portion of the radiation beam B. Since these first and second regions of the optical element form spatially distinct regions of the reflective surface 421, the first and second portions of the radiation beam B correspond to different regions of a spatial intensity distribution of the radiation beam B.

The first portion of the radiation beam is scattered by the plurality of marks 422 to form a first branch radiation beam $B_1$. This scattering is such that the first branch radiation beam $B_1$ is directed through the window 431 to the sensing environment 415. The second portion of the radiation beam B is reflected by the second region to form a second branch radiation beam $B_2$. The second branch radiation beam $B_2$ remains within the main beam environment 425 and may, for example, be directed to one or more of the lithographic apparatuses $LA_a$-$LA_n$.

A screen 411 of fluorescent material is provided over the sensor 410. Within the sensing environment 415, the first branch radiation beam $B_1$ is directed to the sensor 410 by an optical element 440. Optical element 440 produces an image of the plurality of marks 422 on the screen 411. This image may be focused or de-focused. The first branch radiation beam $B_1$ is absorbed by the screen 411 of fluorescent material, which emits radiation with a longer wavelength. This emitted radiation is detected by the sensor 410. The use of such a fluorescent screen significantly simplifies power measurements for radiation beams with relatively short pulses. For example, a free electron laser may produce sub-picosecond pulses (a typical pulse may be of the order of 100 fs). Such short pulses may be too short to be resolved by known sensing elements, such as fast photo diodes. However, fluorescence typically occurs over nanosecond time scales, even if the fluorescent material is excited by femtosecond pulses. Therefore the radiation emitted by the fluorescent screen can be resolved using known sensing elements. Suitable fluorescent materials include zinc oxide (ZnO), which is a semiconductor grade material that is routinely produced in single crystal disks up to 3 inches in diameter, or yttrium aluminium garnet (YAG) doped with a rare earth element such as, for example cerium (YAG:Ce).

The sensor 410 is connected to a controller CT by a cable 413. The sensor 410 is operable to send a signal to the controller CT which is indicative of the power determined by the sensor 410.

Advantageously, this sensor apparatus 400 allows a power of a first portion of the radiation beam B to be determined without requiring sensors to be placed in the path of the radiation beam B. Therefore, the invention enables the measurement of the power of radiation beams with very high powers and intensities, which would otherwise place too high a thermal load on sensors placed directly in their path. For example, it enables measurement of the power of a primary radiation beam B produced by the free electron laser that provides radiation to a plurality of lithographic apparatuses $LA_a$-$LA_n$. Such a radiation beam may have a power of the order of tens of kilowatts and a relatively small etendue.

In addition, since sensors need not be placed in the path of the radiation beam B, this embodiment of the invention provides an arrangement wherein there are no limits on the dimensions of the plurality of marks 422. In particular, this allows the marks 422 to be sufficiently small that the part of the intensity distribution that is used for the power measurement (i.e. the part that contributes to the first branch radiation beam) is significantly smaller than would be the case if one or more sensors were placed in the path of the radiation beam.

Figure 20:
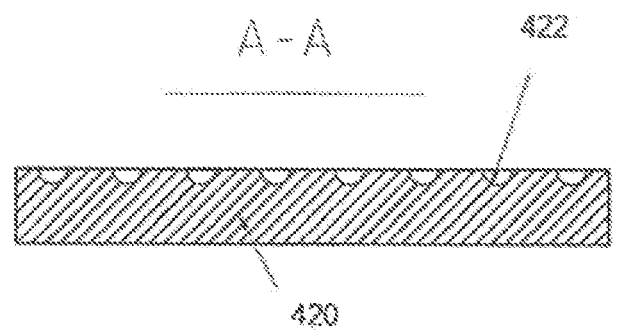
FIG. 20 schematically depicts a cross sectional view of an optical element that forms part of the measurement apparatus of FIG. 18, through the line A-A in FIG. 19.
Figure 21:
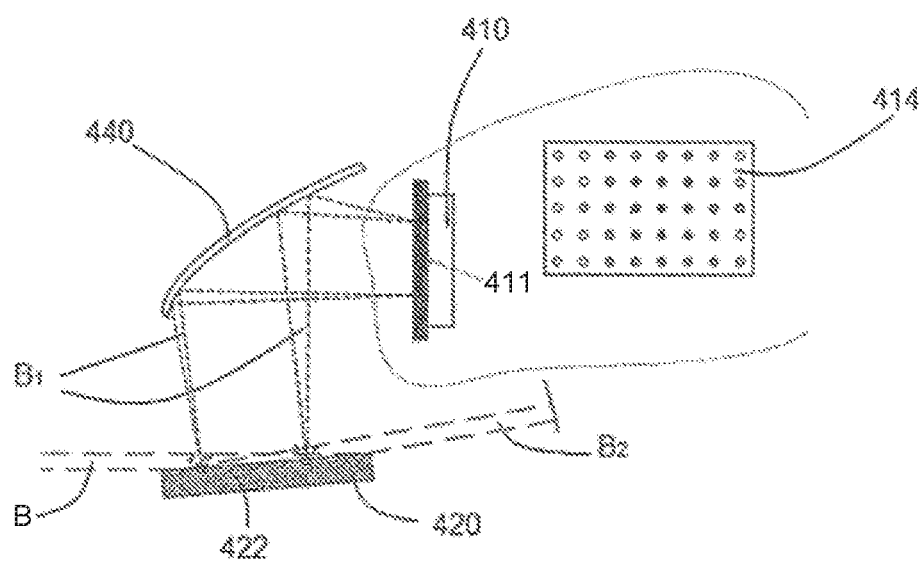
FIG. 21 schematically depicts part of the measurement apparatus of FIG. 18 and a discretely sampled intensity distribution determined by the sensor of the measurement apparatus.

Referring to FIGS. 19 and 20, the plurality of marks 422 are distributed over the reflective surface 421. In this embodiment the plurality of marks 422 form a rectangular lattice over the reflective surface 421, with a spacing between adjacent marks of l in a first direction and a spacing between adjacent marks of h in a second, perpendicular direction. Alternative embodiments may use other distributions of marks 422 over the reflective surface. A dimension d of each mark 422 is significantly smaller than the spacing between adjacent marks l, h. Advantageously, this ensures that the first portion of the radiation beam B that is used for power measurement is relatively small.

The dimension d of each mark 422 may be relatively small. For example, the dimension d of each mark 422 may be smaller than around 100 µm.

In a near field, close to the optical element, the power distribution of the second branch radiation beam $B_2$ will be similar to that of the radiation beam B except for a plurality of gaps, each corresponding to a different one of the marks 422, where the power distribution is substantially zero. The second branch radiation beam $B_2$ may, for example, be directed to one or more of the lithographic apparatuses $LA_a$-$LA_n$, which may be disposed in a far field of the optical element 420. For such embodiments, the dimension d of each mark 422 is preferably sufficiently small that in the far field the plurality of gaps in the power distribution corresponding to the marks 422 have been smoothed out by diffraction due to the divergence of the second branch radiation beam $B_2$.

Further, the dimension d of each mark 422 is preferably sufficiently small that when the mirror is illuminated by the radiation beam B mirror thermal expansion distortion and disturbance of the shape of the reflective surface 421 in the proximity of the marks 422 is negligible. Advantageously, this ensures that focusing effects due to variation of thermal expansion are negligible or can be corrected for.

Further, the dimension d of each mark 422 is preferably sufficiently small that power emitted or scattered by a single mark is relatively small (e.g. less than 1%). Advantageously, this ensures that no, or relatively little, attenuation is required to before it can be measured directly.

The first branch radiation beam $B_1$ comprises a part corresponding to each of the plurality of marks 422. The plurality of marks 422 and the optical element 420 may be arranged such that each such part is directed to a different spatial part of the fluorescent screen 411. The fluorescent screen 411 may be operable to emit a separate beam of radiation for each such part. In such embodiments, the sensor 410 is operable to determine the power of each such beam of radiation emitted by the fluorescent screen 411. Therefore, referring to FIG. 21, the sensor 410 may be operable to determine the power of the radiation beam B at a number of discrete points across its beam profile. As such the sensor may be operable to output a signal that is indicative of a discretely sampled intensity distribution 414 of the radiation beam.

The controller CT may be operable to determine a power distribution of the radiation beam from the discretely sampled intensity distribution 414 by interpolation. For example, an expected beam profile shape may be assumed and a number of parameters of the profile shape may be fit to the data output by the sensor 410. This may use, for example, a least squares algorithm.

The controller CT may be operable to use the determined power or intensity distribution to control an aspect of the radiation beam B. For example, the controller CT may be connected to the free electron laser FEL to control a parameter of the source free electron laser based on the determined power or intensity distribution. For example, the controller may be arranged to adjust the direction and/or position the radiation beam B, and/or to adjust the power intensity or the intensity distribution of the radiation beam B.

Figure 22:
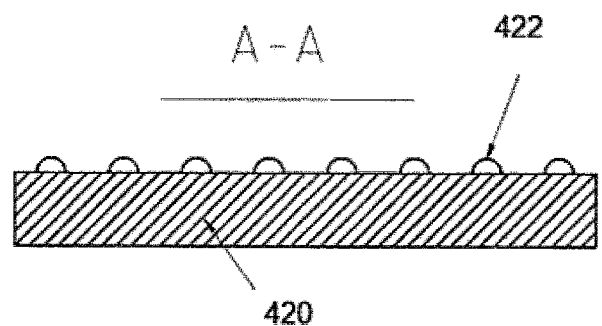
FIG. 22 schematically depicts a cross sectional view of an alternative embodiment of an optical element that may form part of the measurement apparatus of FIG. 18, through the line A-A in FIG. 19.

Referring to FIG. 22, in an alternative embodiment the plurality of marks 422 may be of the form of generally hemi-spherical protrusions on the reflective surface 421. In other alternative embodiments, the marks 422 may comprise differently shaped recesses or protrusions.

Figure 23:
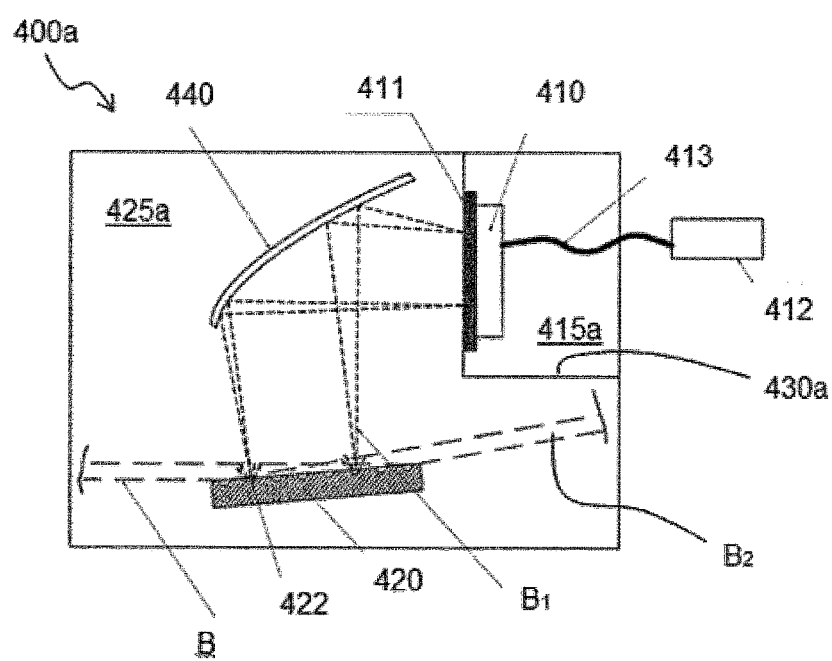
FIG. 23 schematically depicts an alternative embodiment of the measurement apparatus.

In the embodiment shown in FIG. 18, the wall 430 with the transparent membrane or window 431 is provided to separate the sensing environment 415 from the main beam environment 425. An alternative embodiment of a sensor apparatus 400a for determining a value indicative of a power of a radiation beam is shown in FIG. 23. Features of sensor apparatus 400a that directly correspond to sensor apparatus 400 have the same labels. Only the differences between sensor apparatus 400a and sensor apparatus 400 will be described in detail here. In this alternative embodiment all EUV optics, including optical element 440 that is arranged to direct the first branch radiation beam $B_1$ to the fluorescent screen 411 are disposed in a main beam environment 425a, whereas the sensor 410 is disposed in a sensing environment 415a. A wall 430a is provided to separate the sensing environment 415a from the main beam environment 425a, which may in general be held under different conditions. In this alternative embodiment of a sensor apparatus 400a, the fluorescent screen 411 acts as a window in the wall 430a, separating the sensing environment 415a from the main beam environment 425a.

Figure 24:
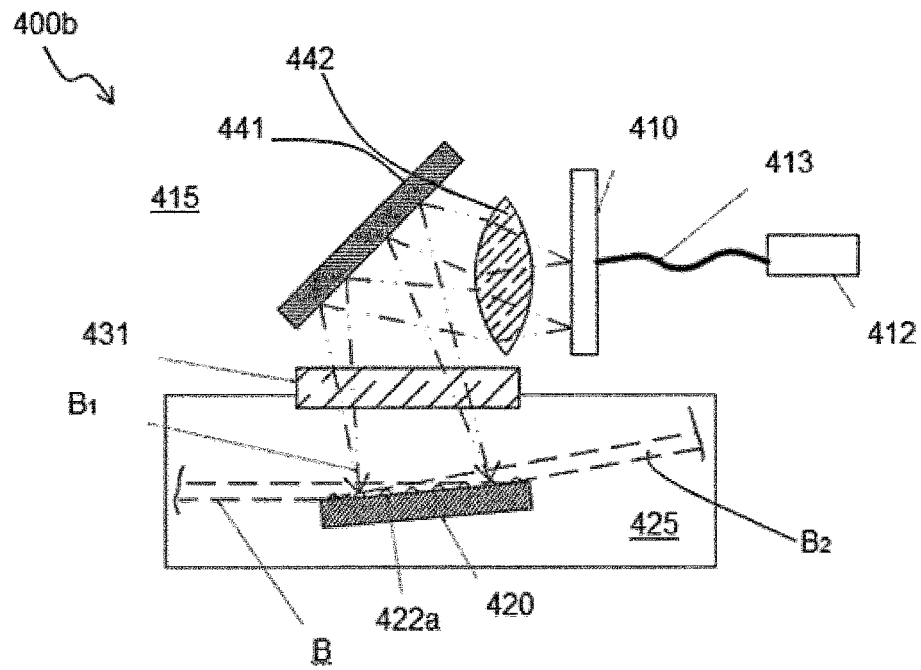
FIG. 24 schematically depicts a further alternative embodiment of the measurement apparatus.

Referring to FIG. 24, a further alternative embodiment of a sensor apparatus 400b for determining a value indicative of a power of a radiation beam is shown. Features of sensor apparatus 400b that directly correspond to sensor apparatus 400 have the same labels. Only the differences between sensor apparatus 400b and sensor apparatus 400 will be described in detail here. In this alternative embodiment, a reflective surface 421 of the optical element 420 is generally smooth but is provided with a plurality of fluorescent marks 422a distributed over the reflective surface. In the present embodiment, each of the plurality of fluorescent marks 422a is of the form of a generally hemi-spherical protrusion formed from a fluorescent material.

The first portion of the radiation beam is absorbed by the plurality of fluorescent marks 422a, which emits radiation with a longer wavelength to form a first branch radiation beam $B_1$. The fluorescent marks 422a are arranged such that the first branch radiation beam $B_1$ is directed through window 431 to sensing environment 415. The use of such a fluorescent screen simplifies power measurements for radiation beams with relatively short pulses. Suitable fluorescent materials include zinc oxide (ZnO), which is a semiconductor grade material that is routinely produced in single crystal disks up to 3 inches in diameter, or yttrium aluminium garnet (YAG) doped with a rare earth element such as, for example cerium (YAG:Ce).

As with the previous embodiments, the second portion of the radiation beam B is reflected by the second region to form a second branch radiation beam $B_2$ that remains within the main beam environment 425 and may, for example, be directed to one or more of the lithographic apparatuses $LA_a$-$LA_n$.

The first branch radiation beam $B_1$, which comprises radiation with a wavelength longer than EUV radiation, is directed to the sensor 410 via dedicated optics. No fluorescent screen is provided since the first radiation beam $B_1$ already comprises radiation of a longer wavelength and pulses that are on the scale of the fluorescence process (typically nanosecond time scales rather than femtosecond time scales). In this embodiment the dedicated optics comprises a reflective optical element 441 and a focusing optical element 442. Other combinations of optical elements may alternatively be used as required. The dedicated optics 441, 442 and the sensor 410 are disposed in a sensing environment 415. A relative advantage of the sensor apparatus 400b over, for example, sensor apparatus 400 is that the first branch radiation beam does not comprise EUV radiation and therefore a cheaper and simpler optical arrangement and sensing environment 415 may be used for the first branch radiation beam $B_1$. For example, lenses may be used rather than expensive EUV mirrors and the sensing environment 415 may, for example, comprise air at atmospheric pressure.

A relative advantage of the sensor apparatus 400 over sensor apparatus 400b is that the fluorescent material is provided on the reflective surface 421 of the optical element (fluorescent marks 422a) rather than in the sensing material (fluorescent screen 411). Therefore the fluorescent material is not exposed to such high power EUV radiation in sensor apparatus 400 and may therefore be expected to have a longer lifetime. Further, in sensor apparatus 400b, the fluorescent marks 422a may experience different temperature changes depending on which portion of the radiation beam B profile is incident thereon. Since the fluorescence process may be temperature dependent, this may make it more difficult to accurately map the distribution determined by the sensor 410 to the intensity profile of the radiation beam B.

Figure 25:
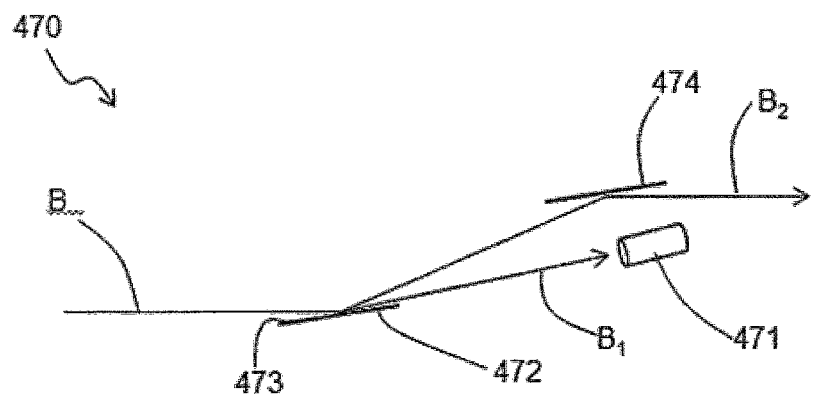
FIG. 25 schematically depicts a further alternative embodiment of the measurement apparatus.

Referring to FIG. 25, a further embodiment of a sensor apparatus 470 according to the present invention for determining a value indicative of a power of a radiation beam is shown. The sensor apparatus 470 comprises a sensor 471 and an optical element 472 for receiving a radiation beam B. The sensor 471 may be substantially similar to sensor 410 described above. In particular, sensor 471 may comprise an array of sensing elements such as, for example, charged coupled devices (CCDs) and/or photodiodes.

The optical element 472 is a mirror, which may be a grazing incidence mirror. As with previous embodiments, the radiation beam B may, for example, be the primary radiation beam B produced by the free electron laser FEL or one of the secondary radiation beams $B_a$-$B_n$ produced by the beam splitting apparatus 20.

Optical element 472 comprises a reflective surface 473. A plurality of regularly spaces grooves extend across the reflective surface 473. The grooves may be formed by any suitable process such as, for example, etching or stamping.

The optical element 472 may form part of the beam splitting apparatus 20 of FIG. 1 and may be disposed at a distance of the order of tens or hundreds of meters from the output of the undulator 24 for thermal reasons. Similarly, the optical element 472 may be a grazing incidence mirror with a relatively small grazing incidence angle such as, for example, or the order of 1 to 4 degrees.

Figure 26:
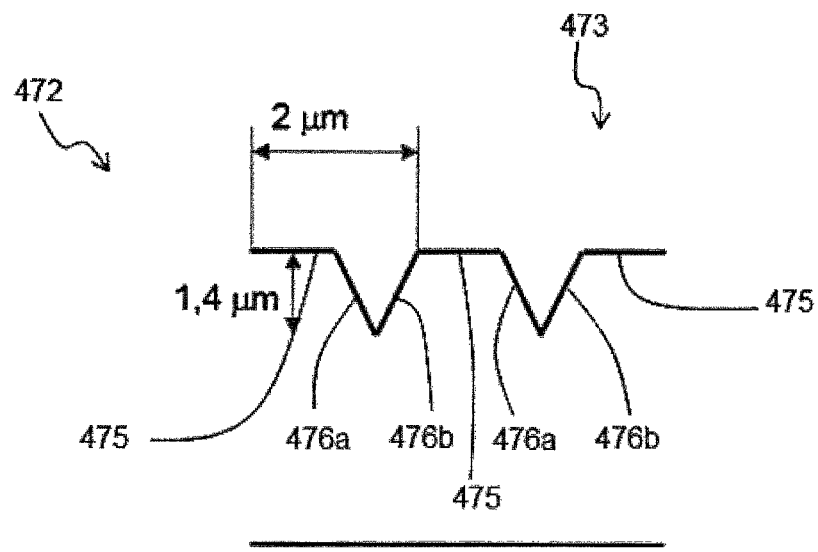
FIG. 26 schematically depicts a cross sectional view of a section of an optical element that may form part of the measurement apparatus of FIG. 25.

The optical element 472 can be formed from silicon by, for example, etching along crystal planes of the silicon. Referring to FIG. 26, an example of a reflective surface 473 of the optical element 472 is shown for an embodiment wherein the optical element 472 is formed from silicon. In this illustrated example, the top faces 475 are formed from the <100> crystallographic plane and the faces 476a, 476b forming the grooves can be formed from the <111> and <-111> planes. With such an arrangement, the angle at the bottom of the grooves is 70.529 degrees. The grooves run along the <01-1> direction. The direction of the incoming radiation beam B is disposed at a small (grazing incidence) angle to the <01-1> direction. Such a grating would form three branch radiation beams, which may be considered to be the 0th and ±1st orders. The ratios of intensities of the branch radiation beams are dependent on the ratios of the areas of the faces from which they are reflected (for example top faces 475 or the faces 476a, 476b forming the grooves) and on the angle of incidence of the incoming radiation beam B.

The optical element 472 may be provided with a coating of a more reflective material (for EUV radiation). For example, the optical element may be provided with a coating of ruthenium (Ru). This may, for example, have a thickness of around 50 nm.

An advantage of using silicon for the optical element 472 is that its thermal expansion during operation may be limited by operating at about 123 K. At this temperature the heat conductivity of silicon is of the order of 400 b W/m/K or more, which is a factor of 4 better than its heat conductivity at room temperature and around 50% better than copper (Cu). Therefore, even a relatively large heat load can be drained, while keeping the temperature in the range where expansion is low and the optical element 472 will keep its designed structural dimensions.

The grooves divide the reflective surface 473 into a plurality of groups of surface elements. Each group of surface elements comprises a plurality of substantially parallel surface elements. For example, the top faces 475 of FIG. 26 form a first group of surface elements, faces 476a forming one side of each ridge form a second group of surface elements and faces 476b forming an opposite side of each ridge form a third group of surface elements. Although only a small section of the optical element is shown in FIG. 26, each group may comprise of the order of 1000 surface elements. Such an arrangement acts as a reflective grating. Each group of surface elements forms a different region of the optical element 472 that is arranged to receive a different portion of the radiation beam B. Since these different regions of the optical element 472 form spatially distinct regions of the reflective surface 473, the different portions of the radiation beam B correspond to different parts of an intensity distribution of the radiation beam B.

The surface elements may each have a width of the order of 1 to 100 µm.

Each branch radiation beam may comprise a plurality of sub-beams, each reflected from a different surface element from a single group. Since each of the surface elements within a given group of surface elements is substantially parallel, each of the sub beams is substantially parallel, at least in the near field of the optical element 472. The surface elements from a given group are disposed at a non-zero angle to those of other groups, i.e. surface elements from different groups are not substantially parallel. Therefore, in a near field of the optical element 472, the power distribution of each branch radiation beam will be similar to that of the radiation beam B except there will be a plurality of strips, corresponding to the surface elements of other groups of surface element, where the power distribution is substantially zero. However, due to a non-zero divergence of the radiation beam B, in a far field of the optical element 472, the plurality of sub beams will overlap and will interfere to form a power distribution that is substantially similar in shape to the radiation beam B.

Alternatively, the plurality of sub-beams from different surface elements may spread out sufficiently to interfere with each other in the far field and each branch radiation beam may correspond to a local maximum in an interference pattern from this interference.

Referring again to FIG. 25, in one embodiment, the geometry of the reflective surface 473 of the optical element 472 is such that first and second branch radiation beams $B_1$ $B_2$ are formed. Further, the geometry of the reflective surface 473 of the optical element 472 is such that a power of the first branch radiation beam $B_1$ is significantly smaller than that of the second branch radiation beam $B_2$. The first branch radiation beam $B_1$ is directed to a sensor which is operable to determine a power and/or a power intensity distribution of the first radiation beam $B_1$. The second branch radiation beam $B_2$ may, for example, be directed to one or more of the lithographic apparatuses $LA_a$-$LA_n$, which may be disposed in a far field of the optical element 472. For such embodiments, an angular width of the surface elements that form the first branch radiation beam $B_1$ is preferably sufficiently small that, in the far field, the plurality of strips in the power distribution corresponding to these surface elements have been smoothed out by diffraction due to the divergence of the second branch radiation beam $B_2$.

Optionally, a second optical element 474 may be provided to direct the second branch radiation beam $B_2$. The second optical element 474 may be arranged to ensure that the second branch radiation beam $B_2$ is substantially parallel to the radiation beam B. In some embodiments, further optical elements may be provided to ensure that the second branch radiation beam $B_2$ is substantially aligned with the radiation beam B.

In some embodiments, the geometry of the reflective surface 473 of the optical element 472 is such that more than two branch radiation beams are formed. For such embodiments, the geometry of the reflective surface 473 of the optical element 472 may be such that a power of the first branch radiation beam $B_1$ is significantly smaller than that of the remaining branch radiation beams, which may have substantially equal power. With such an arrangement, the apparatus for determining a value indicative of the power of a radiation beam is combined with a beam splitting apparatus that is arranged to split the beam into a plurality of secondary beams. For such embodiments, the optical element may form part of the beam splitting apparatus of FIG. 1.

Figure 27:
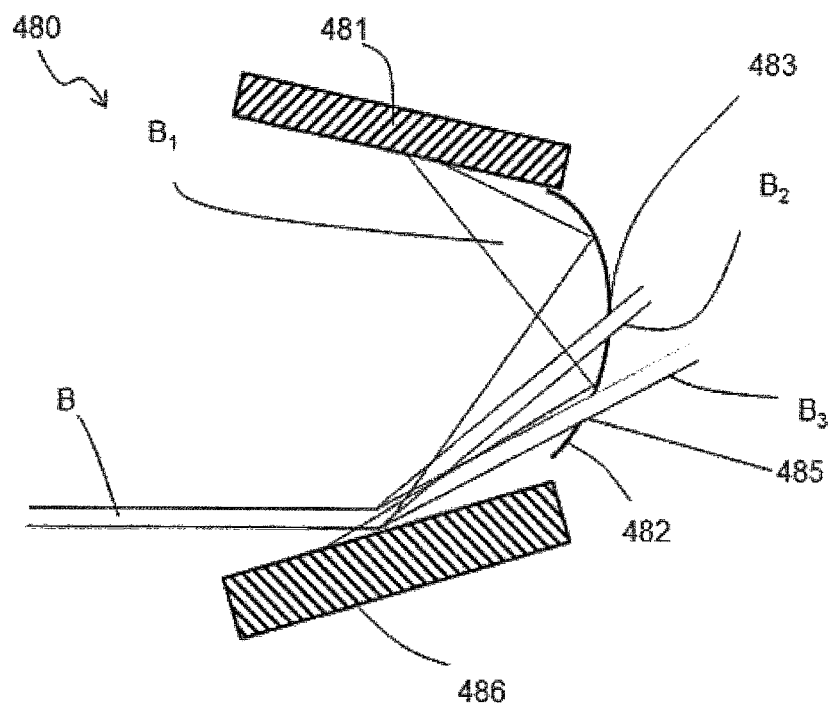
FIG. 27 schematically depicts a further alternative embodiment of the measurement apparatus.

An alternative embodiment of a sensor apparatus 480 for determining a value indicative of a power of a radiation beam is shown in FIG. 27. Features of sensor apparatus 480 that directly correspond to sensor apparatus 470 have the same labels. Only the differences between sensor apparatus 480 and sensor apparatus 470 will be described in detail here. In this alternative embodiment, the sensor apparatus 480 comprises a sensor 481 and an optical element 486 for receiving a radiation beam B.

The optical element 486 is a mirror, which may be a grazing incidence mirror. As with previous embodiments, the optical element is a reflective grating arranged to produce a plurality of branch radiation beams (in the example embodiment of FIGS. 28A and 28B, three). The second and third branch radiation beams $B_2$, $B_3$ each comprise a plurality of sub-beams, each reflected from a different surface element from a single group of surface elements.

In addition, there will be a first portion of the radiation beam which is not reflected by the surface elements so as to form part of the second or third branch radiation beams $B_2$, $B_3$. This scattered radiation may predominantly comprise radiation which is incident upon edges formed at the intersections of adjacent surface elements. This scattered radiation may cover a substantial solid angle and may be considered to form a first branch radiation beam $B_1$.

The sensor apparatus 480 further comprises a near-normal incidence radiation collector 482 which is arranged to collect the first radiation beam $B_1$ and direct it towards a sensor 481. The collector 482 is provided with two apertures 483, 485 to allow the second and third branch radiation beams $B_2$, $B_3$ to propagate away from the optical element 486.

Such an arrangement conveniently uses the small fraction of unavoidable scattered radiation which would not contribute to the radiation received by the lithographic apparatuses $LA_a$-$LA_n$. Further, only a relatively small fraction of the incident radiation beam B is scattered in this way, advantageously avoiding excessive heat loading of the sensor. To determine an intensity distribution of the radiation beam B, the sensor apparatus 480 is calibrated to ensure that the relationship between the power and power distribution of the first branch radiation beam $B_1$ and that of the radiation beam B is known.

Sensor apparatuses according to embodiments may form part of a beam steering unit. In particular, measurements indicative of a power distribution of a radiation beam B made by sensor apparatuses according to embodiments of the invention may provide an input for a feedback-based control loop that is used to steer the radiation beam B. In response to the input, a direction of the radiation beam B may be altered. This may be achieved, for example, by moving one or more optical elements in the path of the radiation beam B. Additionally or alternatively, this may be achieved by altering a trajectory of the bunched electron beam E in the free electron laser FEL. As a result of the optical guiding effect, the direction of the primary radiation beam B output by the free electron laser FEL will be dependent upon the trajectory of the electron beam, especially within an end portion of the undulator 24.

The far field power distribution of a radiation beam produced by a free electron laser is expected to be Gaussian-like but to deviate from a true Gaussian distribution. Sensor apparatuses according to embodiments are particularly well suited providing an input for a feedback-based control loop that is used to steer a radiation beam B with such an unknown intensity distribution since that allow the radiation beam profile to be sampled across the beam profile and, in particular, near to the maximum of the beam power distribution. Further, the plurality of marks that form the first region of the optical element can be sufficiently dense to allow the power and intensity distribution directed to each lithographic apparatus $LA_a$-$LA_n$ to be determined by interpolation.

A free electron laser that is operable to supply radiation to a plurality of EUV lithographic apparatuses may, for example, have a power of the order of tens of kilowatts and a diameter of the order of 100 μm at the output of the undulator 24, i.e. an average power density of the order of $GW/cm^2$. Further, free electron laser radiation beam may have pulse lengths of the order of 100 fs or less, which can give rise to peak power densities of the order of $10^{14}$ $W/cm^2$. One way to measure the power and/or position of such a radiation beam may be to place sensors on the periphery of the radiation beam profile. However, with such high peak power intensities, the sensors would need to be placed several sigma from the peak of the distribution. Therefore, such an arrangement will not yield information regarding the intensity distribution of the total power. Further, such an arrangement would be very sensitive to pointing instabilities of the free electron laser beam.

Referring again to FIGS. 1 and 2, the lithographic system LS may include attenuators 15*a*-15*n*. The branch radiation beams $B_a$-$B_n$ are directed through a respective attenuator 15*a*-15*n*. Each attenuator 15*a*-15*n* is arranged to adjust the intensity of a respective branch radiation beam $B_a$-$B_n$ before the branch radiation beam $B_a$-$B_n$ passes into the illumination system IL of its corresponding lithographic apparatus $LA_a$-$LA_n$.

Figure 28A:
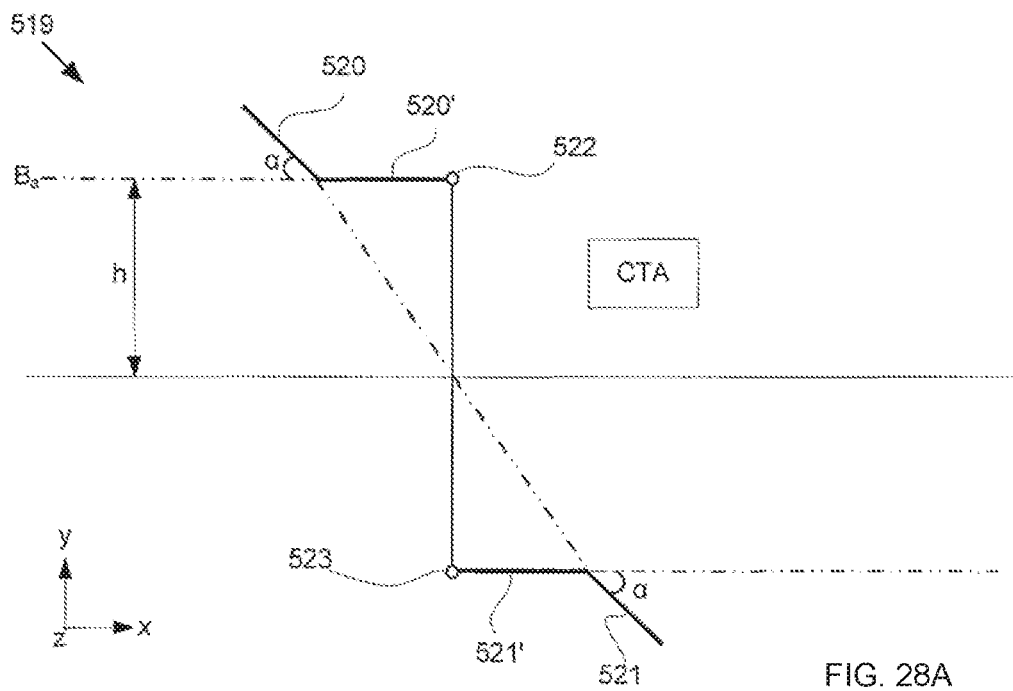
FIG. 28A and FIG. 28B are schematic illustrations of an attenuation apparatus of the lithographic system of FIG. 1.
Figure 28B:
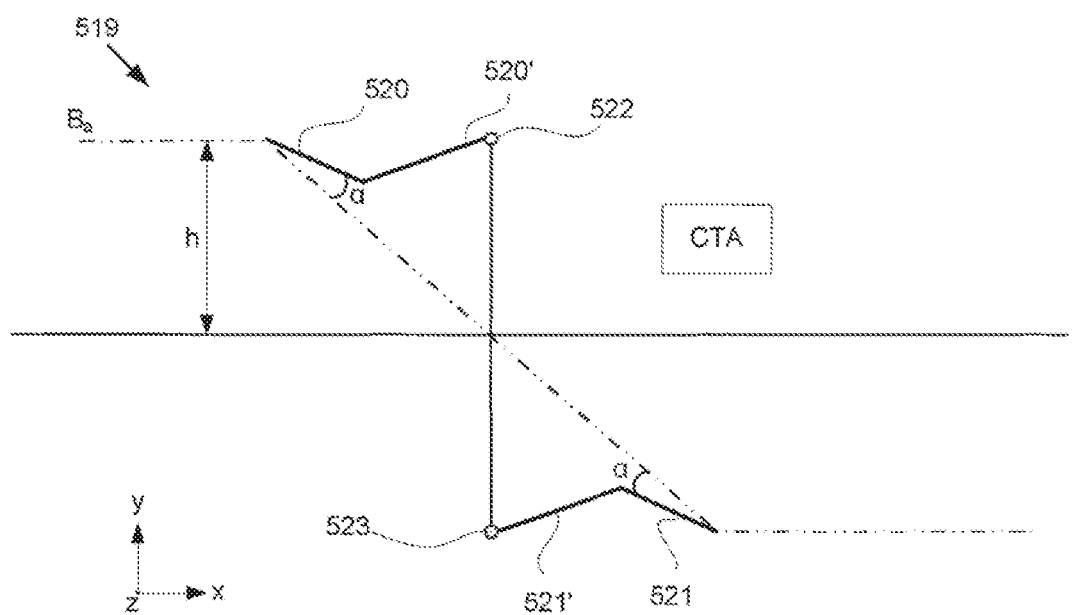

Referring to FIGS. 28A and 28B there is illustrated an example of an attenuation apparatus 519 that may correspond with the attenuator 15*a* shown in FIGS. 1 and 2. The branch laser beam $B_a$ is depicted by a dashed-dot line. The attenuator 15*a* comprises a first mirror 520 and a second mirror 521. The second mirror 521 is separated, in a depicted y-direction, from the first mirror 520 by a distance 2*h*. The second mirror 521 is arranged so that the branch radiation beam $B_a$ entering the attenuator 15*a* is incident on a reflective surface of the first mirror 520 and reflected by the reflective surface towards a reflective surface of the second mirror 521. The second mirror 521 is angled so as to direct the branch radiation beam $B_a$ towards the lithographic apparatus $LA_a$ (not shown in FIG. 28A).

The first mirror 520 is connected to a first pivot point 522 via an arm 520', while the second mirror is connected to a second pivot point 523 via an arm 521'. A first actuator (not shown) is provided to rotate about the first pivot point 522, and a second actuator (not shown) is provided to rotate the second mirror 521 around the second pivot point 523. The positions of the mirrors 520, 521 are controlled by a controller CTA. The first and second actuators may take any appropriate form as will be readily apparent to the skilled person. For example, the actuators may comprise motors disposed at the pivot points 522, 523 and connected to the arms 520', 521'.

Through rotation of the mirrors 520, 521 about the pivot points 522, 523, an angle of incidence α of the mirrors 520, 521 with respect to the branch radiation beam $B_a$ may be adjusted. It will be appreciated that as the mirrors 520, 521 are disposed at the same angle of incidence α, after reflection by the mirrors 520, 521, the branch radiation beam $B_a$ propagates in the same direction as before reflection by the mirrors 520, 521.

The mirrors 520, 521 are arranged to reflect the branch radiation beam $B_a$ with what is commonly referred to as grazing (or glancing) incidence reflection. In FIG. 28A, the mirrors 520, 521 are shown disposed at a maximum angle of incidence α, such that the branch radiation beam is incident on a bottom portion (with respect to the y-direction) of the mirror 520 and a top portion (with respect to the y-direction) of the mirror 521. In some embodiments, the maximum value of the angle α may be, for example, an angle of approximately 10 degrees.

In FIG. 28B, the mirrors 520, 521 are shown disposed at a minimum angle α of incidence such that the branch radiation beam $B_a$ is incident on a top portion of the mirror 520 and a bottom portion of the mirror 521. The minimum value of the angle α may be, for example, an angle α of approximately 1 degrees. In the depicted example, therefore, the mirrors 520, 521 are rotatable about the respective pivot points 522, 523 between angles of incidence of 1 degrees to 10 degrees. It will be appreciated that in other embodiments, the arrangement and/or size of mirrors 520, 521 may be different so as to allow a larger or smaller angular range. For example, the pivot points 522, 523 may be selected so as to increase or decrease the useful angular range of the mirrors 520, 521. Further, while the mirrors 520, 521 are each shown as being arranged to rotate around a fixed pivot point, this is merely exemplary. It will be appreciated that the angle of incidence of the mirrors 520, 521 may be adjusted using any other arrangement as will be readily apparent to the skilled person. In an embodiment, the mirrors 520, 521 may both be arranged to rotate about the same pivot point. By appropriate selection of the position of the pivot points 522, 523, a displacement of the outgoing branch radiation beam $B_a$ with respect to the incoming branch radiation beam $B_a$, (i.e. 2 h in the embodiment of FIGS. 28A and 28B), can be made substantially constant for angles α within a predetermined, relatively small range (as shown in FIGS. 28*a*, 28*b*). For larger angular ranges of the angle α, however, where the displacement of the outgoing branch radiation beam with respect to the incoming branch radiation beam is to be substantially constant, at least one of the mirrors 520, 521 or both, may be provided with translational means suitable to translate one or both of the mirrors 520, 521 in the y-direction.

The reflectance of each of the mirrors 520, 521 is a function of the angle of incidence α between the mirror 520, 521 and the branch radiation beam $B_a$. For example, for an incidence angle of 2 degrees, approximately 98% (in a theoretical case of a mirror having a ruthenium (Ru) coating having perfectly flat surface) of the incident radiation may be reflected at each of the mirrors 520, 521. That is, when angled at 2 degrees, radiation reflected by one of the mirrors 520, 521 is reduced by 2% compared to the intensity of the radiation that is incident on that mirror. As such, where both of the mirrors 520, 521 are disposed at an angle α of 2 degrees, the intensity of the branch radiation beam $B_a$ is reduced by approximately 4% through reflection by the mirrors 520, 521.

For an incidence angle of 10 degrees (the maximum angle used in the example above), approximately 90% of the incident radiation may be reflected at each of the mirrors 520, 521. That is, when the angle of incidence is 10 degrees, the intensity of the reflected radiation is approximately 10% less than the incident radiation. As such, where both of the mirrors 520, 521 are disposed at an angle of incidence α of 10 degrees, the intensity of the branch radiation $B_a$ is reduced by approximately 20% through reflection by the mirrors 520, 521.

From the above description, it will be appreciated that by adjustment of the angle α between 1 and 10 degrees, the intensity of the branch radiation beam $B_a$ received at the lithographic apparatus $LA_a$ may be varied between 2% and 20%.

In some embodiments the angle of incidence of the mirrors 520, 521 may be adjusted at a frequency of up to 1 KHz, thereby providing an adjustment mechanism for the attenuation of the branch laser beam $B_a$. The first and second actuators (e.g. motors) may be connected to a controller CTA. The controller CTA may be arranged to receive instructions indicating a desired intensity of the branch radiation beam $B_a$ to be received at the lithographic apparatus $LA_a$. In response to receipt of such instructions, the controller may be arranged to control the actuator to adjust the angle of incidence α of the mirrors 520, 521 to achieve a desired attenuation of the branch radiation beam $B_a$ and thereby a desired intensity at the lithographic apparatus $LA_a$. The controller may receive as input from a sensor $SL_a$ (see FIG. 2) a measurement indicative of the intensity of the branch radiation beam $B_a$ in the lithographic apparatus $LA_a$.

The controller CTA may be part of a feedback-based control loop arranged to detect an intensity of the branch radiation beam $B_a$ at the lithographic apparatus $LA_a$ and to adjust the attenuation of the branch radiation beam $B_a$ in order to maintain the intensity at the lithographic apparatus $LA_a$ at a predetermined value or within a predetermined range. Referring to FIG. 1, this feedback-based control loop $F2_a$ may be separate from a feedback-based control loop F1 provided after the free electron laser and before the beam splitter 19. The feedback-based control loop $F2_a$ which controls the attenuator 15a may be referred to as a second feedback-based control loop. The feedback-based control loop F1 provided after the free electron laser and before the beam splitter 19 may be referred to as a first feedback-based control loop. The first and second feedback-based control loops F1, $F2_a$ may be operated independently of each other. They may be controlled by different controllers CT, CTA or may be controlled by the same controller. The second feedback-based control loop $F2_a$ may be slower than the first feedback-based control loop F1.

In other embodiments, the angles of incidence of each of the mirrors 520, 521 may be adjustable independently of one another. While this would result in a change in the direction of propagation of the branch radiation beam $B_a$, this may beneficially increase the number possible attenuation values in, for example, embodiments in which the angle of incidence of a mirror 520, 521 is adjustable only in discrete steps.

It will be appreciated that while the embodiments described above are described with reference to the attenuator 15a, the attenuators 15b-15n may be similarly implemented.

Figure 29:
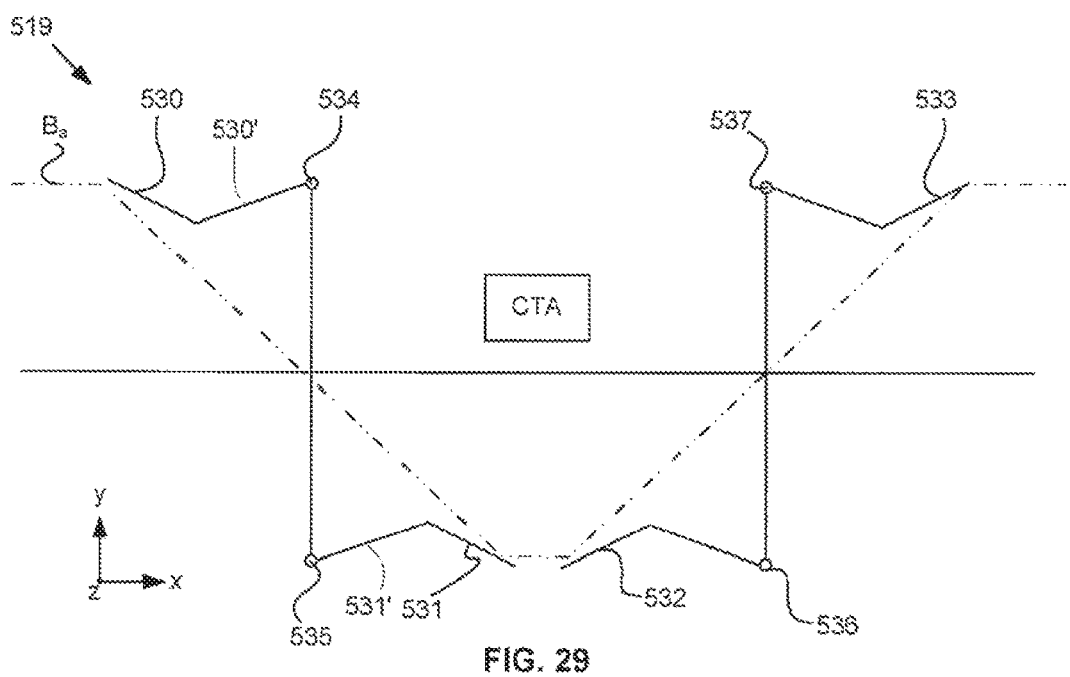
FIG. 29 is a schematic illustration of an alternative attenuation apparatus of the lithographic system of FIG. 1.

Referring to FIG. 29, there is illustrated an alternative embodiment of an attenuation apparatus 519 that may comprise the attenuator 15a. In the embodiment of FIG. 29, the attenuation apparatus 519 comprises four mirrors 530, 531, 532, 533. The mirrors 530, 531 are arranged similarly to the mirrors 520, 521 as described above with reference to FIGS. 28A and 28B. In particular, the first mirror 530 is provided with a first actuator arranged to rotate the mirror 530 about a first pivot point 534 to which the mirror 530 connects via an arm 530'. The second mirror 531 is provided with a second actuator arranged to rotate the mirror 531 about a second pivot point 535 to which the mirror 531 connects via an arm 531'.

The mirrors 532, 533 are arranged similarly to the mirrors 530, 531, but may be considered to be a "mirroring" of the arrangement of the first mirror 530 and the second mirror 531 along a an axis perpendicular to the direction propagation of the branch radiation beam $B_a$. In particular, the third mirror 532 is disposed at the same position in the y-direction as the second mirror 531 and is arranged to receive radiation reflected from the second mirror 531. The third mirror is provided with a third actuator arranged to rotate the mirror 532 about a third pivot point 536. The third mirror 532 is arranged to reflect received radiation towards the fourth mirror 533 which is separated from the second mirror 532 in the y-direction by a distance of 2 h (i.e. the fourth mirror 553 is at the same position in the y-direction as the first mirror 530). The fourth mirror 553 is provided with a fourth actuator arranged to rotate the mirror 553 about a fourth pivot point 537. The fourth mirror 553 is arranged to direct radiation to the lithographic apparatus $LA_a$ (not shown in FIG. 29).

Where the angle of incidence α of each of the first to fourth mirrors 530-553 is the same, the branch radiation beam $B_a$ exits the attenuator 15a in the same direction and at the same position in the y-direction as it enters the attenuator 15a. Additionally, by using four mirrors, each being operable to adjust the angle of incidence through a range of 1 degrees and 10 degrees, a possible attenuation range of the attenuator 15a is increased from a range of 2% to 20% (in the arrangement of FIGS. 28A and 28B) to a range of 4% to 40% (i.e. a possible transmission range of 96% to 60% of the radiation entering the attenuator 15a). It will be appreciated that where a greater minimum attenuation is acceptable, the greater range of attenuation achievable in the embodiment of FIG. 29 may be advantageous.

Further, the embodiment of FIG. 29 may be utilised to provide the same or a similar attenuation range to that which may be provided by the embodiment of FIGS. 28A and 28B with a smaller effect on the polarization of the branch radiation beam $B_a$. That is, due to the smaller angle of incidence α required to achieve a particular attenuation, the combined effect of the four mirrors 530 to 553 on the P and S polarization components of the branch radiation beam $B_a$ is smaller than the combined effect of the two mirrors 520, 521 for a given attenuation. This is particularly the case for attenuations of or approaching 20% (i.e. as the angle of incidence α of each mirror 520, 521 approaches 10 degrees).

In some embodiments it may be desired to retain, as far as possible, a generally circular polarization exhibited by the branch radiation beam $B_a$ before it enters the attenuator 15a. In this case, an attenuation range of approximately 2% to 20% may be achieved with an angular adjustment range of between approximately 1 degrees and 5 degrees. This embodiment may therefore be particularly beneficial for having a reduced effect on the polarization of the branch radiation beam $B_a$.

Further, in the arrangement of FIG. 29, translational means for providing translational correction of one or more of the mirrors 530 to 553 are not required. The outgoing beam has the same angle and position as the incoming beam for all values of alpha (when angles alpha are equal for all four mirrors). Put another way, any change in the distance 2h caused by the mirrors 530, 531 is "reversed" by the mirrors 532, 553, such that translation of the mirrors in the y-direction is not required to ensure that the branch radiation beam $B_a$ leaves the attenuator 15a at the same position as it enters.

FIG. 29 may be considered to show two sets of two mirrors; a first set containing the mirrors 530, 531 and a second set containing the mirrors 532, 533. It will be appreciated that in other embodiments additional mirrors, or additional sets of mirrors may be provided to further increase the possible attenuation range, or to reduce alterations to the polarization of the branch radiation beam $B_a$.

One or more of the attenuators 15a to 15n may comprise an alternative attenuation apparatus (e.g. in addition to or instead of the attenuation apparatus described above). The alternative attenuation apparatus may provide a fixed attenuation or may provide an adjustable attenuation. Where an adjustable attenuation is provided the adjustment may have a slower speed than the speed of the above described attenuation apparatus. The alternative attenuation apparatus may have a higher range of possible attenuation values.

Figure 30A:
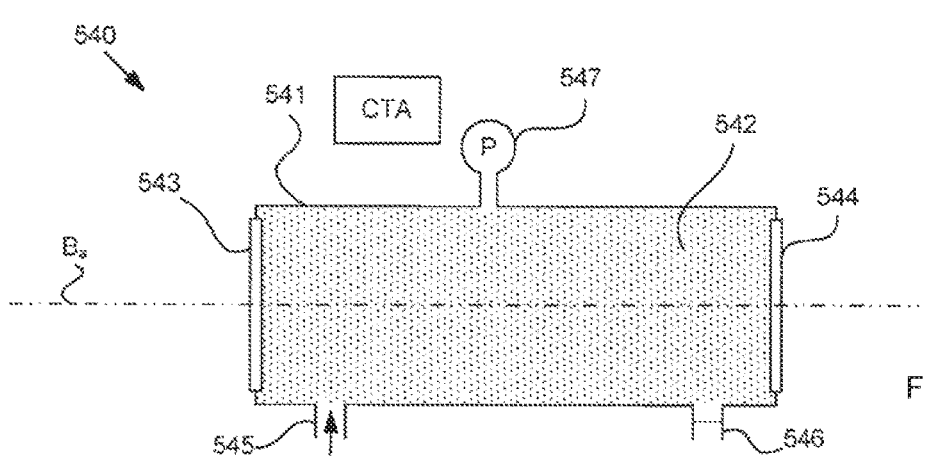
FIG. 30A and FIG. 30B are schematic illustrations of a further attenuation apparatus of the lithographic system of FIG. 1.

FIG. 30A schematically depicts an example of an alternative attenuation apparatus 540 that may be provided in combination with, or in the alternative to, the above described attenuation apparatus. Where these attenuation apparatus are provided in combination, the branch radiation beam $B_a$ may pass through either attenuation apparatus before passing through the other. The attenuation apparatus 540 is controlled by a controller CTA.

The attenuation apparatus 540 is gas-based and comprises a housing 541 defining a chamber 542. The housing 541 may define a chamber 542 of any shape. For example, the housing 541 may be generally tubular. The chamber 542 is closed at a first end by a first window 543 and at a second, opposing end, by a second window 544. An inlet 545 is provided to allow a controlled amount of a gas, into the chamber 542. A valve 546 may also be provided to allow a controlled flow of gas from the chamber 542. A pressure monitor 547 is provided to monitor a pressure within the chamber 542. The pressure monitor 547 may be any form of pressure monitor. By providing a gas flow, rather than a fixed, enclosed gas medium, energy absorbed by the gas may be removed. The amount of energy thus removed may be substantial where the attenuation apparatus 540 provides a large attenuation factor (such as a factor of 10).

The inlet 545 allows the introduction into the chamber 542 of an EUV absorbing gas. It will be appreciated that the particular gas introduced into the chamber 542 may be selected in dependence upon a desired level of EUV absorption. As an example, however, gasses such as Hydrogen, Helium and/or Argon may be suitable. The windows 543, 544 are constructed so as to provide a high transmittance for EUV radiation and may be constructed to provide a high absorbance to other wavelengths of electromagnetic radiation. For example, the windows may comprise what are commonly referred to as spectral purity filters, which filter radiation outside of the EUV wavelength, but which allow the transmission of EUV radiation. Such spectral purity filters may be constructed in any appropriate way as will be apparent to those skilled in the art. For example, the windows 543, 544 may be constructed from molybdenum (Mo) and zirconium silicide (ZrSi). The Mo/ZrSi stack may be capped on one or both sides with molybdenum silicide (MoSi). In an alternative example the windows 543, 544 may be formed from polysilicon (pSi) One or both of the sides of the polysilicon film may be capped with a silicon nitride (SiN) layer. Other materials, for example graphene, may be suitable for use in the windows 543, 544. The thickness of the windows 543, 544 may be selected in dependence upon a maximum pressure desired within the chamber 542, which itself may be selected in dependence upon a desired attenuation.

The branch radiation beam $B_a$ enters the alternative attenuation apparatus 540 through the first window 543 and is attenuated by way of interaction with the fluid within the chamber 542, before exiting the attenuation apparatus 540 through the second window 544. An attenuation of the branch radiation beam $B_a$ caused by passage through the chamber 542 may be varied by varying the type, amount or pressure of gas within the chamber 542.

The pressure sensor, gas inlet and gas valve may be in communication with a controller CTA. The controller CTA may be operable to control the gas inlet 545 and the gas valve 546 to achieve a desired pressure within the chamber 542. The desired pressure within the chamber 542 may be selected so as to achieve a desired attenuation of the branch radiation beam $B_a$ to be caused by the alternative attenuation apparatus. Alternatively or additionally, a desired pressure within the chamber 542 may be selected to maintain a pressure within the chamber 542 within a predetermined safe range.

Figure 30B:
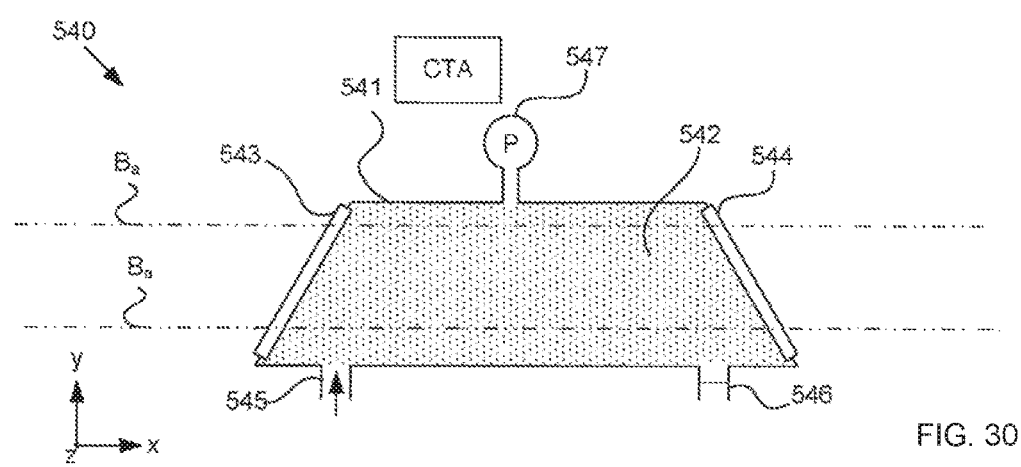

An alternative embodiment of the alternative attenuation apparatus is illustrated in FIG. 30B in which like components have been provided with like reference numerals. In the example embodiment of FIG. 30A, both of the windows 543, 544 are perpendicular to the direction of propagation of the branch radiation beam $B_a$ along their length. As such, the path of the branch radiation beam $B_a$, through the chamber 542, is the same length irrespective of the position at which the branch radiation beam $B_a$ enters the chamber 542. In the alternative example shown in FIG. 30B, the windows 543, 544 are angled towards each other with respect to the direction of propagation of the branch radiation beam $B_a$. In this way, where the branch radiation beam $B_a$ enters the chamber 542 at one position, it will travel a shorter distance through the chamber 542 than when the branch radiation beam $B_a$ enters the chamber 542 at a different, lower (in the y-direction in FIG. 30B) position. As such, attenuation of the branch radiation beam can be varied by varying the position at which branch radiation beam $B_a$ enters the chamber 542. Moreover, this arrangement can also be used to generate an intensity gradient over the cross section of the light beam. Such an intensity gradient may be used to correct for intensity variations over the illumination field.

Figure 31:
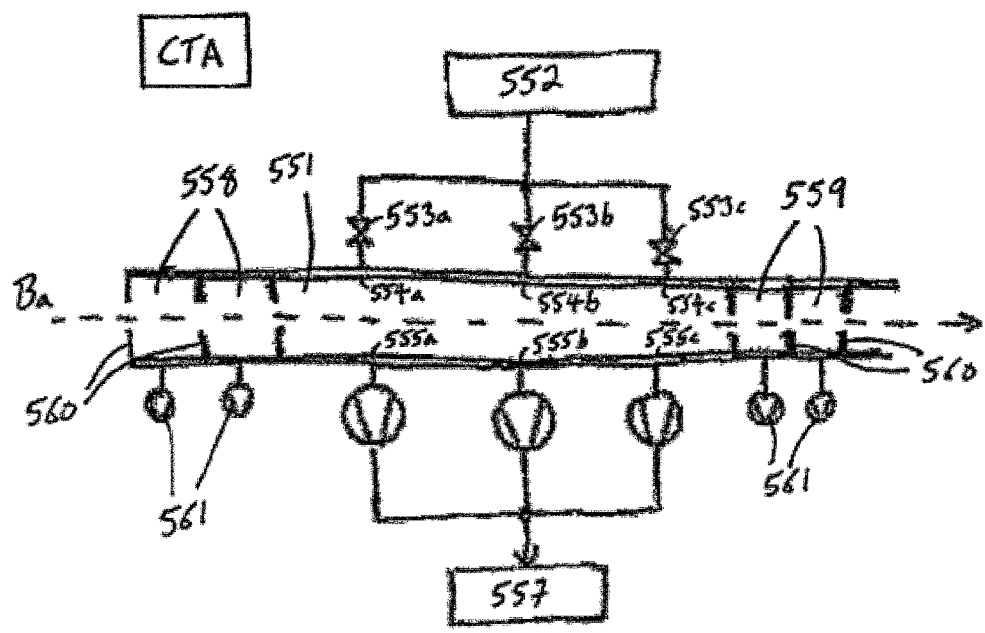
FIGS. 31 and 32 are schematic illustrations of further attenuation apparatus of the lithographic system of FIG. 1.
Figure 32:
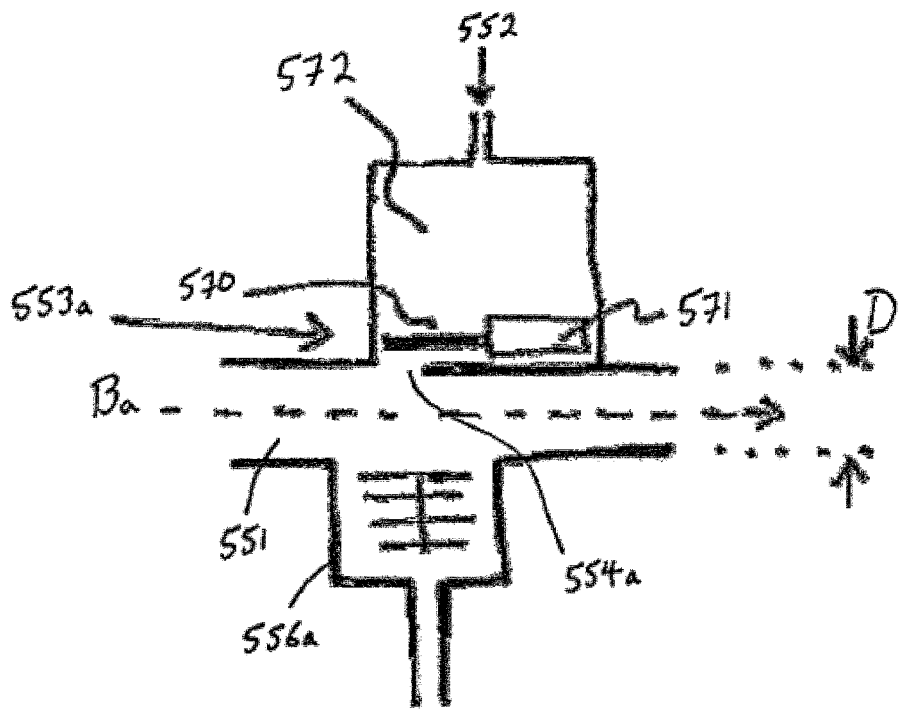

A further alternative gas-based attenuation apparatus 550 is shown schematically in FIGS. 31 and 32. Referring first to FIG. 31, the apparatus 550 comprises a tube 551 through which the branch radiation beam $B_a$ passes. Gas which acts to attenuate the branch radiation beam $B_a$ is supplied from a gas supply 552 via three valves 553a-c to gas inlets 554a-c which are spaced apart along the tube 551. Three outlets 555a-c are provided in the tube 551, the gas outlets being generally opposite associated gas inlets 554a-c. A vacuum pump 556a-c is connected to each outlet 555a-c and configured to pump gas to an exhaust 557.

The attenuation apparatus 550 further comprises differential pumping sections, two of which 558 are provided upstream of the gas inlets 554a-c and two of which 559 are provided downstream of the gas inlets. Each differential pumping section 558, 559 comprises a volume in the tube 551 which is partially enclosed by walls 560. The walls 560 are each provided with an opening through which the branch radiation beam $B_a$ travels. A pump 561 is connected to each volume and is used to pump gas from that volume. The differential pumping sections 558, 559 are operable to isolate pressure fluctuations in the attenuation apparatus 550 from other apparatus (e.g. to isolate them from a lithographic apparatus).

In use, the degree of attenuation provided by the attenuation apparatus 550 is controlled by changing the gas flow rate of gas passing through the valves 553a-c. The valve 553a-c may be controlled by a controller CTA. The pressure of gas in the tube 551 may be increased to increase attenuation of the branch radiation beam $B_a$ and may be decreased to reduce attenuation of the branch radiation beam. The attenuation may be reduced to 0% by removing all of the gas from the tube 551 using the vacuum pumps 556a-c. The attenuation provided by the gas will depend upon the length of tube 551 over which the gas is provided and in addition will depend upon the gas that is used. For example, absorption of EUV radiation is 0.1% per Pa per meter when hydrogen gas is used. If attenuation between 0% and 20% of the branch radiation beam $B_a$ is needed and the gas is provided over a tube length of 10 m, then the pressure of hydrogen gas in the tube should be varied between 0 Pa and 20 Pa. If a gas with a higher absorption coefficient is used, for example argon (absorption 0.034 $Pa^{-1}m^{-1}$), nitrogen (0.059 $Pa^{-1}m^{-1}$), or xenon (0.062 $Pa^{-1}m^{-1}$) then the length of the tube 551 may be reduced accordingly. For example, when using nitrogen attenuation between 0% and 20% may be achieved using a tube 5 m long with a pressure range of 0-0.7 Pa.

The response time of the attenuation apparatus 550 will depend on the speed of valves 553a-c, on the pumps speeds of the vacuum pumps 556a-c, and on the volume of the tube 551 to which gas is provided.

FIG. 32 shows schematically an embodiment of the valve 553a and the pump 556a. The valve 553a comprises a baffle 570 which is actuated by an actuator 571. The baffle 570 forms a leaky seal between a buffer volume 572 and the tube 551. The buffer volume 572 is kept at a higher pressure than the pressure within the tube 551 using the gas supply 552. The actuator 571 moves the baffle 570 to open and close an outlet 554a from the buffer volume 572 into the tube 551. The baffle 570 may be lightweight (e.g. weighing 10 g or less, for example around 1 g). As a result the actuator 571 may be able to open and close the outlet 554a using the baffle 570 at a relatively high frequency (e.g. in excess of 2 kHz).

The vacuum pump 556a has a pump speed which may be expressed as a linear velocity v at which gas enters an inlet aperture of the pump. The response time is roughly related to the diameter D of the tube 551 (response time T is roughly D/v). For a typical turbo-molecular pump v is around 100 m/s. If the tube 551 has a diameter D of 5 cm, then this would provide a response time T of around 0.5 ms. This corresponds to a maximum frequency of around 2 kHz. More than one pump 556a may be provided around the tube 551 in the vicinity of the gas inlet 554a. Where this is done the response frequency will be increased.

Generally, the range in which attenuation of the branch radiation beam $B_a$ may be varied using the alternative attenuation apparatus of FIGS. 30A and 30B is larger than the range of attenuation adjustment achievable with the attenuation apparatus of FIGS. 28A, 28B and 29. However, the speed with which the attenuation may be adjusted is slower. For example, the chamber 542 may be emptied of gas in order to decrease the attenuation. However, this may take a significant length of time compared to the time required to adjust the mirrors 530 to 553, for example. The length of time may be longer than the time period during which a target location receives EUV radiation (e.g. longer than 1 ms).

Figure 33:
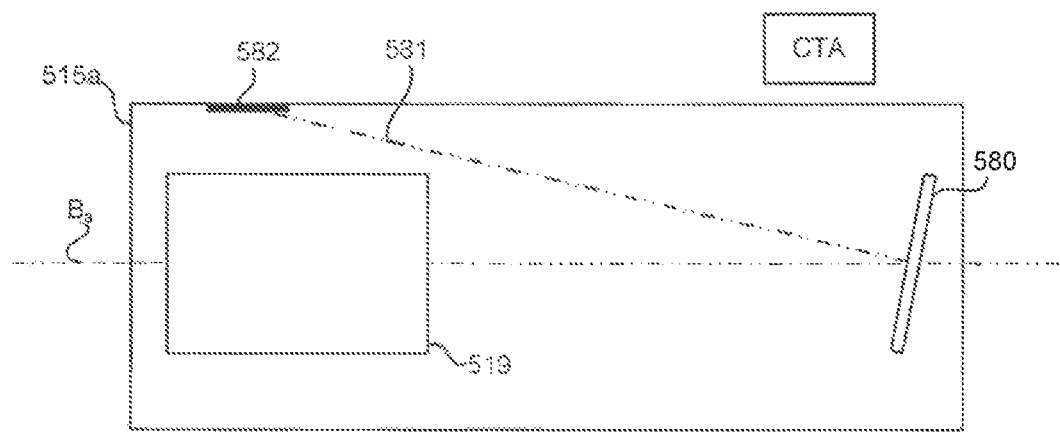
FIG. 33 is a schematic illustration of a further attenuation apparatus of the lithographic system of FIG. 1.

Referring to FIG. 33, there is shown a further alternative embodiment, in which an attenuation apparatus is provided by an EUV reflective membrane 580 disposed in the path of the branch radiation beam $B_a$ at a near-normal angle of incidence. The membrane 580 may be constructed similarly to the windows 543, 544 described above. The membrane 580 may be of any suitable dimensions depending on the construction and materials used.

The branch radiation beam $B_a$ leaves the first attenuation apparatus 519 and is incident upon the membrane 580. The membrane 580 is oriented so as to create an angle of incidence of the branch radiation beam $B_a$ which causes a portion 581 of the branch radiation beam $B_a$ to be reflected towards a radiation dump 582 disposed on a wall of the attenuator 515a. A portion 553 of the branch radiation beam $B_a$ is transmitted through the membrane 580. It will be appreciated that a portion of the branch radiation beam $B_a$ not reflected will be absorbed by the membrane 580. The angle of incidence of the branch radiation beam $B_a$ and the membrane 580 may be a near-normal incidence angle substantially avoiding reflection radiation towards a previous optical element (e.g. an attenuation apparatus 519 in FIG. 33).

The membrane 580 may be moved between a first position (not shown) in which it does not intersect with the branch radiation beam $B_a$ and a second position (shown) in which it does intersect with the radiation beam. The position of the membrane may be controlled by a controller CTA using an actuator (not shown). The controller CTA thus selects between the first position and the second position depending upon whether or not it is desired to provide attenuation using the membrane 580.

In FIG. 33, the membrane 580 is disposed after the attenuation apparatus 519 (with respect to the direction of propagation of the branch radiation beam $B_a$) within the attenuator 15a. However in other embodiments, the order of attenuation apparatus within the attenuator 15a may be otherwise. It will further be appreciated that a plurality of membranes such as the membrane 580 may be provided in sequence to further increase an attenuation of the branch radiation beam $B_a$. Intersection of the plurality of membranes with the branch radiation beam may be controlled by the controller CTA.

In an embodiment, a mesh may be used instead of the membrane 580. In an embodiment, two or more meshes may be used. A mesh may be capable of withstanding a higher thermal load than a membrane.

In an embodiment an attenuator may comprise an adjustable aperture at the opening 8 of the enclosing structure of the illumination system IL (see FIG. 2). The size of the adjustable aperture may be reduced in order to attenuate the branch radiation beam $B_a$. This embodiment does not affect the far-field distribution of the radiation. It has only a minor impact on the radiation in the pupil plane (poles of radiation will become smaller but will not change position).

An attenuator 15a-n may comprise one or more of the above described embodiments. For example, the reflective membrane of FIG. 33 may be combined with the attenuation apparatus of FIG. 28A, 28B or 29 and/or the attenuation apparatus of FIG. 30A or 30B. Other combinations of embodiments are also possible.

While it is described above in connection with FIG. 1 that a respective attenuator 15a-15n is provided for each branch radiation beam, it will be appreciated that in other embodiments, an attenuator may be provided for only one or some of the branch radiation beams. Further, a single attenuator may be provided for a plurality of branch radiation beams. For example, although the attenuators 15a-15n are shown disposed outside of the splitter 19, in other embodiments, an attenuator as described herein may be disposed within the splitter 19 so as to attenuate a plurality of branch radiation beams. For example, to attenuate all of the branch radiation beams $B_b$-$B_n$ together, an attenuator may be provided immediately after the branching of the first branch radiation beam $B_a$. Any combination or configuration of attenuators may be provided.

An attenuator as generally described above may be positioned elsewhere within the lithographic system before the substrate. For example, with reference to FIG. 2, an attenuator may be positioned within the illumination system IL.

Whilst embodiments of the invention have been described in the context of a single free electron laser FEL, it should be appreciated that any number of free electron lasers FEL may be used. For example, two free electron lasers may be arranged to provide EUV radiation to a plurality of lithographic apparatus. This is to allow for some redundancy. This may allow one free electron laser to be used when the other free electron laser is being repaired or undergoing maintenance.

Although the described embodiments of a lithographic system LS may refer to eight lithographic apparatuses, a lithographic system LS may comprise any number of lithographic apparatus. The number of lithographic apparatus which form a lithographic system LS may, for example, depend on the amount of radiation which is output from a free electron laser and on the amount of radiation which is lost in a beam splitting apparatus 19. The number of lithographic apparatus which form a lithographic system LS may additionally or alternatively depend on the layout of a lithographic system LS and/or the layout of a plurality of lithographic systems LS.

Embodiments of a lithographic system LS may also include one or more mask inspection apparatus MIA and/or one or more Aerial Inspection Measurement Systems (AIMS). In some embodiments, the lithographic system LS may comprise two mask inspection apparatuses to allow for some redundancy. This may allow one mask inspection apparatus to be used when the other mask inspection apparatus is being repaired or undergoing maintenance. Thus, one mask inspection apparatus is always available for use. A mask inspection apparatus may use a lower power radiation beam than a lithographic apparatus. Further, it will be appreciated that radiation generated using a free electron laser FEL of the type described herein may be used for applications other than lithography or lithography related applications.

The term "relativistic electrons" should be interpreted to mean electrons which have relativistic energies. An electron may be considered to have a relativistic energy when its kinetic energy is comparable to or greater than its rest mass energy (511 keV in natural units). In practice a particle accelerator which forms part of a free electron laser may accelerate electrons to energies which are much greater than its rest mass energy. For example a particle accelerator may accelerate electrons to energies of >10 MeV, >100 MeV, >1 GeV or more.

Embodiments of the invention have been described in the context of a free electron laser FEL which outputs an EUV radiation beam. However a free electron laser FEL may be configured to output radiation having any wavelength. Some embodiments of the invention may therefore comprise a free electron which outputs a radiation beam which is not an EUV radiation beam.

The term "EUV radiation" may be considered to encompass electromagnetic radiation having a wavelength within the range of 4-20 nm, for example within the range of 13-14 nm. EUV radiation may have a wavelength of less than 10 nm, for example within the range of 4-10 nm such as 6.7 nm or 6.8 nm.

The lithographic apparatuses $LA_a$ to $LA_n$ may be used in the manufacture of ICs. Alternatively, the lithographic apparatuses $LA_a$ to $LA_n$ described herein may have other applications. Possible other applications include the manufacture of integrated optical systems, guidance and detection patterns for magnetic domain memories, flat-panel displays, liquid-crystal displays (LCDs), thin-film magnetic heads, etc.

Different embodiments may be combined with each other. Features of embodiments may be combined with features of other embodiments.

While specific embodiments of the invention have been described above, it will be appreciated that the invention may be practiced otherwise than as described. The descriptions above are intended to be illustrative, not limiting. Thus it will be apparent to one skilled in the art that modifications may be made to the invention as described without departing from the scope of the claims set out below.

The invention claimed is:

1. An injector for a free electron laser, the injector comprising:
   a photocathode;
   a radiation output configured to emit a pulsed radiation beam and direct the pulsed radiation beam to be incident on the photocathode so as to cause the photocathode to emit a beam of electron bunches which is output from the injector, each electron bunch corresponding to a pulse of the radiation beam; and
   a control apparatus configured to receive the pulsed radiation beam and substantially prevent at least one pulse of the radiation beam from being incident on the photocathode so as to interrupt the electron beam and to cause the at least one pulse of the radiation beam to have substantially no associated electron bunch in the electron beam which is output from the injector.

2. The injector of claim 1, wherein the control apparatus is configured to interrupt the electron beam in a periodic manner.

3. The injector of claim 1, wherein the control apparatus is configured to interrupt the electron beam so as to cause a single pulse of the radiation beam to have substantially no associated electron bunch in the electron beam which is output from the injector.

4. The injector of claim 1, wherein the control apparatus comprises:
   a Pockels cell disposed in the path of the radiation beam before the radiation beam is incident on the photocathode and wherein the Pockels cell is switchable between a first mode of operation in which the Pockels cell is configured to transmit the radiation beam without changing its polarization state and a second mode of operation in which the Pockels cell is configured to transmit the radiation beam and rotate the polarization state of the radiation beam; and
   a polarizer disposed between the Pockels cell and the photocathode and in the path of the radiation beam, wherein the polarizer is configured to only transmit radiation having a given polarization state.

5. The injector of claim 4, wherein the Pockels cell comprises an electro-optic crystal, a pair of electrodes and a voltage source and wherein the voltage source is configured to generate a potential difference between the electrodes so as to switch the Pockels cell from the first mode of operation to the second mode of operation.

6. The injector of claim 5, wherein the Pockels cell comprises a plurality of pairs of electrodes and a plurality of voltage sources and wherein each of the plurality of voltage sources is configured to generate a potential difference between one of the plurality of pairs of electrodes so as to switch the Pockels cell from the first mode of operation to the second mode of operation.

7. The injector of claim 4, wherein the Pockels cell is configured to rotate the polarization state of the radiation beam by about 90° when in the second mode of operation.

8. The injector of claim 7, further comprising a second Pockels cell configured to rotate the polarization state of the radiation beam by about 90° when in the second mode of operation.

9. The injector of claim 8, wherein the polarizer is configured to only transmit radiation having a polarization state which is orthogonal to the polarization state of the radiation beam before the radiation beam is incident on the Pockels cell.

10. The injector of claim 4, wherein the control apparatus comprises a plurality of Pockels cells disposed in the path of the radiation beam before the radiation beam is incident on the photocathode and wherein each of the plurality of Pockels cell is switchable between a first mode of operation in which the Pockels cell is configured to transmit the radiation beam without changing its polarization state and a second mode of operation in which the Pockels cell is configured to transmit the radiation beam and rotate the polarization state of the radiation beam by less than 90° and wherein the plurality of Pockels cells are configured to apply a combined rotation of the polarization state of the radiation beam of about 90° when each of the plurality of Pockels cells are in the second mode of operation.

11. The injector of claim 4, wherein the polarizer is configured to only transmit radiation having the polarization state of the radiation beam before the radiation beam is incident on the Pockels cell.

12. A free electron laser comprising:
an injector comprising:
a photocathode,
a radiation output configured to emit a pulsed radiation beam and direct the pulsed radiation beam to be incident on the photocathode so as to cause the photocathode to emit a beam of electron bunches which is output from the injector, each electron bunch corresponding to a pulse of the radiation beam, and
a control apparatus configured to interrupt the electron beam so as to cause at least one pulse of the radiation beam to have substantially no associated electron bunch in the electron beam which is output from the injector;
a particle accelerator configured to accelerate the electron beam output from the injector; and
an undulator configured to guide the accelerated electron beam along a periodic path so as to stimulate emission of a free electron laser radiation beam, wherein the free electron laser radiation beam comprises a series of pulses, each pulse corresponding to an electron bunch of the electron beam.

13. The free electron laser of claim 12, wherein the control apparatus of the injector is configured to interrupt the electron beam which is output from the injector, so as to interrupt the pulses of the free electron laser radiation beam.

14. The free electron laser of claim 13, further comprising a controller configured to control the control apparatus of the injector so as to control a number of pulses of the free electron laser radiation beam which occur in a given time period.

15. The free electron laser of claim 12, wherein the undulator is configured to stimulate emission of an EUV free electron laser radiation beam.

16. The free electron laser of claim 15, further comprising a sensor configured to monitor the intensity of the radiation beam and output a signal to a controller to enable feedback control.

17. A lithographic system comprising:
a radiation source comprising the free electron laser of claim 12; and
a lithographic apparatus.

18. The lithographic system of claim 17, wherein the lithographic apparatus is arranged to receive a radiation beam comprising at least a portion of the free electron laser radiation beam which is output from the free electron laser of the radiation source, the lithographic apparatus comprising:
an illumination system configured to condition the radiation beam received from the radiation source;
a support structure constructed to support a patterning device, the patterning device being capable of imparting the radiation beam with a pattern in its cross-section to form a patterned radiation beam;
a substrate table constructed to hold a substrate; and
a projection system configured to project the patterned radiation beam onto a target location of the substrate.

19. The lithographic system of claim 18, wherein the control apparatus of the injector is configured to interrupt the electron beam which is output from the injector, so as to interrupt the pulses of the free electron laser radiation beam, and so as to interrupt pulses of the radiation beam which are received by the lithographic apparatus, and so as to interrupt pulses of the patterned radiation beam which are projected onto a target location of the substrate.

20. The lithographic system of claim 19, further comprising a controller configured to control the control apparatus of the injector so as to control a number of pulses of the patterned radiation beam which are received by the target location of the substrate in an exposure time period, so as to control a dose of radiation which is received by the target location of the substrate in the exposure time period.

21. The free electron laser of claim 12, wherein the control apparatus is configured to deflect at least one electron bunch out of the electron beam, so as to interrupt the electron beam which is output from the injector.

22. The free electron laser of claim 21, wherein the control apparatus comprises:
a pair of conducting plates, each plate disposed on either side of a trajectory of the electron beam; and
a voltage source configured to generate a potential difference between the conducting plates, so as to generate an electric field between the conducting plates, the electric field being sufficient to deflect an electron bunch out of the electron beam.

23. The free electron laser of claim 22, further comprising a beam dump arranged to receive an electron bunch which is deflected out of the electron beam.

24. A method of controlling the power of a radiation beam emitted by a free electron laser, the method comprising:

directing a pulsed radiation beam onto a photocathode of an injector so as to cause the photocathode to emit a beam of electron bunches which is output from the injector, each electron bunch corresponding to a pulse of the radiation beam;

interrupting the electron beam so as to cause at least one pulse of the radiation beam to have substantially no associated electron bunch in the electron beam which is output from the injector;

accelerating the electron beam using a particle accelerator; and using an undulator to guide the accelerated electron beam along a periodic path so as to stimulate emission of a free electron laser radiation beam, the power of the free electron laser beam being reduced by the interruption of the electron beam.

25. The method of claim 24, wherein at least one pulse of the radiation beam is prevented from being incident on the photocathode so as to interrupt the emission of electron bunches from the photocathode.

26. The method of claim 24, wherein at least one electron bunch is deflected out of the electron beam so as to interrupt the electron beam which is output from the injector.

27. A non-transitory computer readable medium comprising instructions therein, the instructions, when executed by a computer system, are configured to cause the computer system to at least:

cause direction of a pulsed radiation beam onto a photocathode of an injector so as to cause the photocathode to emit a beam of electron bunches which is output from the injector, each electron bunch corresponding to a pulse of the radiation beam; and cause interruption of the electron beam so as to cause at least one pulse of the radiation beam to have substantially no associated electron bunch in the electron beam which is output from the injector, wherein a particle accelerator is configured to accelerate the electron beam and an undulator is configured to guide the accelerated electron beam along a periodic path so as to stimulate emission of a free electron laser radiation beam, the power of the free electron laser radiation beam reduced by the interruption of the electron beam.

* * * * *